(12) United States Patent
Ogita

(10) Patent No.: US 11,362,126 B2
(45) Date of Patent: Jun. 14, 2022

(54) LIGHT RECEPTION DEVICE AND DISTANCE MEASUREMENT MODULE

(71) Applicant: SONY SEMICONDUCTOR SOLUTIONS CORPORATION, Kanagawa (JP)

(72) Inventor: Tomoharu Ogita, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/638,928

(22) PCT Filed: Jul. 4, 2019

(86) PCT No.: PCT/JP2019/026592
§ 371 (c)(1),
(2) Date: Feb. 13, 2020

(87) PCT Pub. No.: WO2020/017344
PCT Pub. Date: Jan. 23, 2020

(65) Prior Publication Data
US 2021/0167114 A1 Jun. 3, 2021

(30) Foreign Application Priority Data
Jul. 18, 2018 (JP) .............................. JP2018-135349

(51) Int. Cl.
*H01L 27/146* (2006.01)
*G01S 17/08* (2006.01)

(52) U.S. Cl.
CPC ........ *H01L 27/14636* (2013.01); *G01S 17/08* (2013.01); *H01L 27/1463* (2013.01);
(Continued)

(58) Field of Classification Search
CPC ......... H01L 27/14636; H01L 27/14638; H01L 27/146; H01L 27/14601; H01L 27/14612;
(Continued)

(56) References Cited

U.S. PATENT DOCUMENTS

2006/0284275 A1* 12/2006 Deimel .............. G01D 5/34715
257/432
2007/0158770 A1 7/2007 Kawahito
(Continued)

FOREIGN PATENT DOCUMENTS

EP 3193190 7/2017
EP 3193369 7/2017
(Continued)

OTHER PUBLICATIONS

International Search Report and Written Opinion prepared by the Japanese Patent Office dated Sep. 10, 2019, for International Application No. PCT/JP2019/026592.
(Continued)

*Primary Examiner* — John R Lee
(74) *Attorney, Agent, or Firm* — Sheridan Ross P C.

(57) ABSTRACT

The present technology relates to a light reception device and a distance measurement module. The light reception device includes an on-chip lens, a wiring layer, and a semiconductor layer between the on-chip lens and the wiring layer. The semiconductor layer includes a first voltage application portion to which a first voltage is applied, a second voltage application portion to which a second voltage different from the first voltage is applied, a first charge detection portion, a second charge detection portion, and a through electrode extending through the semiconductor layer. The light reception device is configured such that a third voltage is applied through the through electrode to a film formed on a face of the semiconductor layer on the
(Continued)

on-chip lens side. The present technology can be applied to a light reception device that generates distance information, for example, by a ToF method or the like.

20 Claims, 62 Drawing Sheets

(52) U.S. Cl.
CPC .. H01L 27/14612 (2013.01); H01L 27/14623 (2013.01); H01L 27/14627 (2013.01); H01L 27/14629 (2013.01)

(58) Field of Classification Search
CPC ......... H01L 27/14623; H01L 27/14625; H01L 27/14627; H01L 27/14629; H01L 27/1463; H01L 27/14685; G01S 17/08; G01S 7/481; G01S 7/4816
See application file for complete search history.

(56) References Cited

U.S. PATENT DOCUMENTS

| | | | |
|---|---|---|---|
| 2012/0012965 A1 | 1/2012 | Maeda | |
| 2012/0086094 A1 | 4/2012 | Watanabe | |
| 2014/0015932 A1* | 1/2014 | Kim | H04N 13/257 348/46 |
| 2014/0217474 A1* | 8/2014 | Lee | H01L 27/14605 257/225 |
| 2015/0028405 A1 | 1/2015 | Minami et al. | |
| 2016/0073093 A1* | 3/2016 | Kautzsch | H01L 27/14638 348/46 |
| 2017/0194367 A1 | 7/2017 | Fotopoulou et al. | |
| 2018/0054581 A1* | 2/2018 | Sano | H04N 5/374 |
| 2019/0019821 A1* | 1/2019 | Fotopoulou | G06T 7/521 |
| 2019/0025414 A1 | 1/2019 | Van Der Tempel et al. | |
| 2019/0252445 A1* | 8/2019 | Kao | H01L 23/481 |
| 2021/0167114 A1* | 6/2021 | Ogita | G01S 17/08 |
| 2021/0270940 A1* | 9/2021 | Watanabe | G01S 7/4816 |

FOREIGN PATENT DOCUMENTS

| | | |
|---|---|---|
| JP | 2005-235893 | 9/2005 |
| JP | 2011-086904 | 4/2011 |
| JP | 2012-023207 | 2/2012 |
| JP | 2012-084693 | 4/2012 |
| JP | 2012-169530 | 9/2012 |
| JP | 2015-026708 | 2/2015 |
| JP | 2017-522727 | 8/2017 |
| WO | WO 2017/121820 | 7/2017 |
| WO | WO 2018/135320 | 7/2018 |

OTHER PUBLICATIONS

Partial European Search Report for European Patent Application No. 19837449.8, dated Jun. 25, 2020, 14 pages.

* cited by examiner

FIG. 5
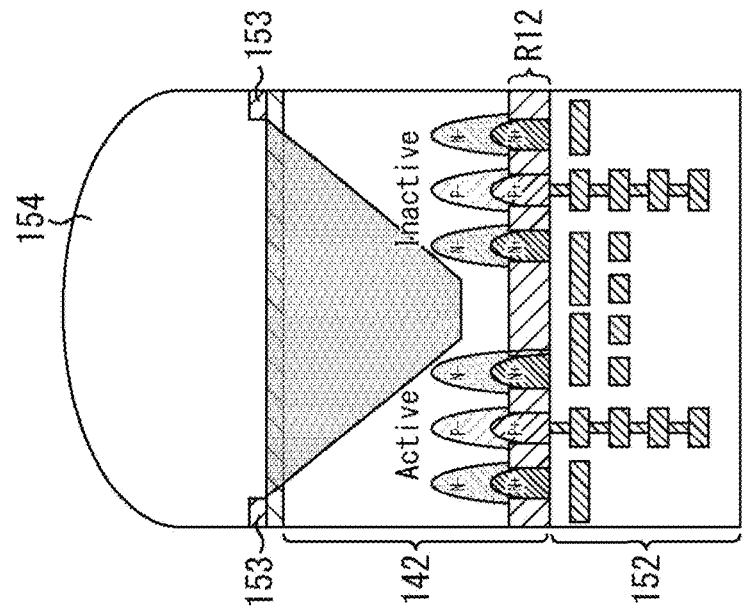
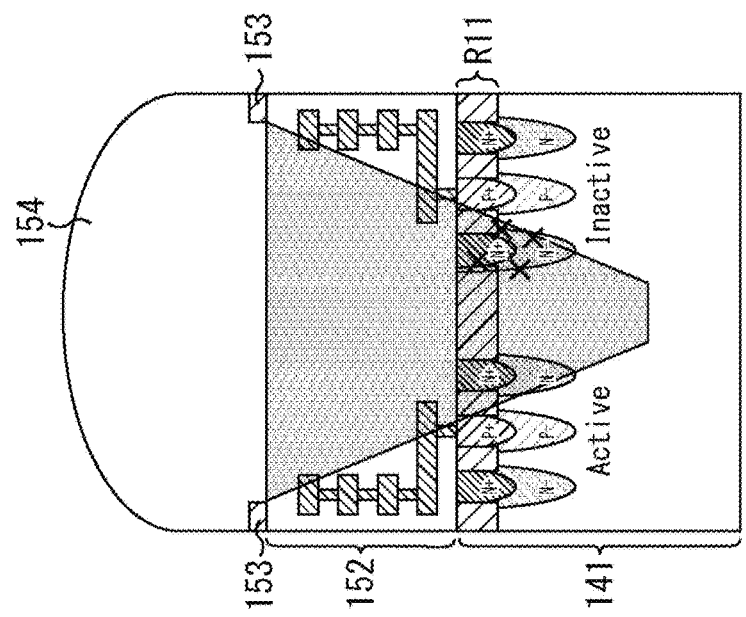

FIG. 8
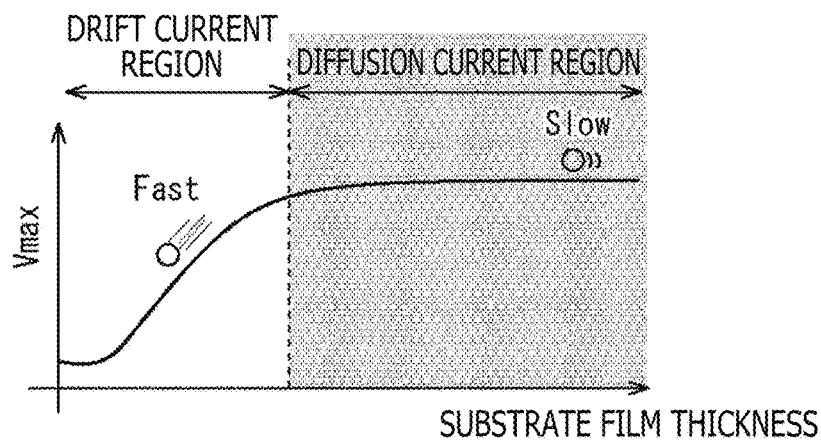
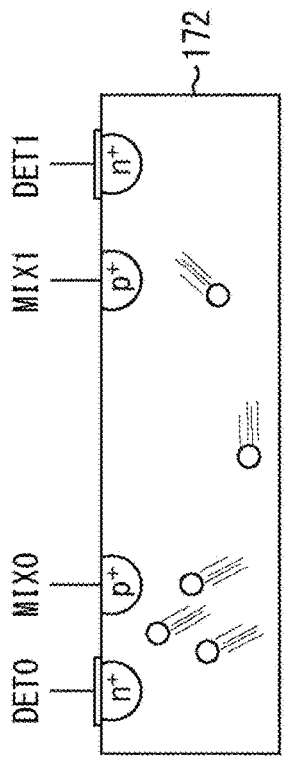

LIGHT RECEPTION DEVICE AND DISTANCE MEASUREMENT MODULE

CROSS REFERENCE TO RELATED APPLICATIONS

This application is a national stage application under 35 U.S.C. 371 and claims the benefit of PCT Application No. PCT/JP2019/026592 having an international filing date of 4 Jul. 2019, which designated the United States, which PCT application claimed the benefit of Japanese Patent Application No. 2018-135349 filed 18 Jul. 2018, the entire disclosures of each of which are incorporated herein by reference.

TECHNICAL FIELD

The present technology relates to a light reception device and a distance measurement module, and particularly to a light reception device and a distance measurement module whose characteristic can be improved.

BACKGROUND ART

In the past, a distance measurement system for which an indirect ToF (Time of Flight) method is utilized is known. In such a distance measurement system as just described, a sensor capable of distributing signal charge obtained by receiving light after active light illuminated using an LED (Light Emitting Diode) or a laser with a certain phase is reflected from an object to different regions at a high speed is essentially required.

Therefore, for example, a technology is proposed which can modulate a wide-range region in a substrate of a sensor at a high speed by applying a voltage directly to the substrate to generate current in the substrate (for example, refer to PTL 1). Such a sensor as just described is also called CAPD (Current Assisted Photonic Demodulator) sensor.

CITATION LIST

Patent Literature

[PTL 1]
Japanese Patent Laid-Open No. 2011-86904

SUMMARY

Technical Problems

However, it is difficult for the technology described above to achieve a CAPD sensor having a sufficient characteristic.

For example, the CAPD sensor described above is a sensor of a front-illuminated type in which wires and so forth are arranged on a face on a side of a substrate at which light from an outside is received.

In order to secure a photoelectric conversion region, it is desirable for the light reception face side of a PD (Photodiode), more specifically, of a photoelectric conversion portion, to have thereon anything that blocks an optical path of incident light such as a wire. However, in the CAPD sensor of the front-illuminated type, depending upon a structure, it is inevitable to arrange wires for extraction of charge, various control lines and signal lines on the light reception face side of the PD, and the photoelectric conversion region is restricted. In short, a sufficient photoelectric conversion region may not be securable and a characteristic such as a pixel sensitivity sometimes degrades.

Furthermore, in the case where it is considered to use a CAPD sensor at a place at which outside light exists, outside light components make noise components to an indirect ToF method by which distance measurement is performed using active light. Therefore, in order to secure a sufficient SN ratio (Signal to Noise ratio) to obtain distance information, it is necessary to secure a sufficient saturation signal amount (Qs). However, in the CAPD sensor of the front-illuminated type, since there is a restriction in the wiring layout, in order to secure a capacity, a contrivance of using a method other than a wire capacity is required such as provision of an additional transistor.

Furthermore, in the CAPD sensor of the front-illuminated type, a signal extraction portion called Tap is arranged in the substrate on the side on which light is incident. On the other hand, in the case where photoelectric conversion in an Si substrate is taken into consideration, although there is a difference in the attenuation rate depending upon the wavelength of light, the ratio at which photoelectric conversion occurs on the light inputting face side is high. Therefore, in a surface type CAPD sensor, a CAPD sensor of the front-illuminated type has the possibility that the probability may become high that photoelectric conversion is performed in an Inactive Tap region that is a Tap region to which signal charge is not to be distributed from among Tap regions in which the signal extraction portion is provided. In the inactive ToF sensor, since distance measurement information is obtained using a signal distributed to charge accumulation regions in response to the phase of active light, components after photoelectric conversion is performed directly in the Inactive Tap region become noise, resulting in the possibility that distance measurement accuracy may degrade. More specifically, there is the possibility that a characteristic of the CAPD sensor may degrade.

The present technology has been made in view of such a situation as described above and makes it possible to improve a characteristic.

Solution to Problems

A light reception device according to a first aspect of the present technology includes:
an on-chip lens;
a wiring layer; and
a semiconductor layer arranged between the on-chip lens and the wiring layer, in which
the semiconductor layer includes
a first voltage application portion to which a first voltage is applied,
a second voltage application portion to which a second voltage different from the first voltage is applied,
a first charge detection portion arranged around the first voltage application portion,
a second charge detection portion arranged around the second voltage application portion, and
a through electrode extending through the semiconductor layer, and
a third voltage is applied through the through electrode to a predetermined film formed on a face of the semiconductor layer on the on-chip lens side.

In the first aspect of the present technology, the on-chip lens, wiring layer, and semiconductor layer arranged between the on-chip lens and the wiring layer are provided. The semiconductor layer includes the first voltage application portion to which a first voltage is applied, second voltage application portion to which a second voltage different from the first voltage is applied, the first charge detection portion arranged around the first voltage application portion, the second charge detection portion arranged around the second voltage application portion, and through electrode extending through the semiconductor layer. Further, the light reception device is configured such that the third voltage is applied through the through electrode to the predetermined film formed on the face of the semiconductor layer on the on-chip lens side.

A distance measurement module according to a second aspect of the present technology includes:
a light reception device including
an on-chip lens,
a wiring layer, and
a semiconductor layer arranged between the on-chip lens and the wiring layer, in which
the semiconductor layer includes
a first voltage application portion to which a first voltage is applied,
a second voltage application portion to which a second voltage different from the first voltage is applied,
a first charge detection portion arranged around the first voltage application portion,
a second charge detection portion arranged around the second voltage application portion, and
a through electrode extending through the semiconductor layer, and
a third voltage is applied through the through electrode to a predetermined film formed on a face of the semiconductor layer on the on-chip lens side,
a light source configured to illuminate illumination light whose brightness fluctuates periodically, and
a light emission controlling section configured to control an illumination timing of the illumination light.

In the second aspect of the present technology, the light reception device including the on-chip lens, wiring layer, and semiconductor layer arranged between the on-chip lens and the wiring layer and in which the semiconductor layer includes the first voltage application portion to which the first voltage is applied, the second voltage application portion to which the second voltage different from the first voltage is applied, the first charge detection portion arranged around the first voltage application portion, the second charge detection portion arranged around the second voltage application portion, and through electrode extending through the semiconductor layer and the third voltage is applied through the through electrode to the predetermined film formed on the face of the semiconductor layer on the on-chip lens side, light source configured to illuminate illumination light whose brightness fluctuates periodically, and light emission controlling section configured to control an illumination timing of the illumination light are provided.

Advantage Effect of Invention

With the first and second aspects of the present technology, a characteristic can be improved.

Note that the advantageous effect described here is not necessarily restricted and may be any of advantageous effects described in the present disclosure.

BRIEF DESCRIPTION OF DRAWINGS

FIG. 5 is a view illustrating improvement of a charge separation efficiency.
FIG. 8 is a view illustrating a moving speed of a signal carrier in a back-illuminated type.

DESCRIPTION OF EMBODIMENTS

In the following, embodiments to which the present technology is applied are described.

First Embodiment

<Example of Configuration of Light Reception Device>

The present technology makes it possible to improve a characteristic such as a pixel sensitivity by configuring a CAPD sensor as that of the back-illuminated type.

The present technology can be applied to a light reception device that configures a distance measurement system that performs distance measurement, for example, by an indirect ToF method, an imaging apparatus having such a light reception device as just described and so forth.

For example, the distance measurement system is incorporated in a vehicle, and can be applied to an on-vehicle system for measuring the distance to an object existing outside a vehicle, a gesture recognition system in which the distance to an object such as a hand of a user is measured and a gesture of the user is recognized on the basis of a result of the measurement or the like. In this case, a result of the gesture recognition can be used, for example, for operation of a car navigation system or the like.

Figure 1:
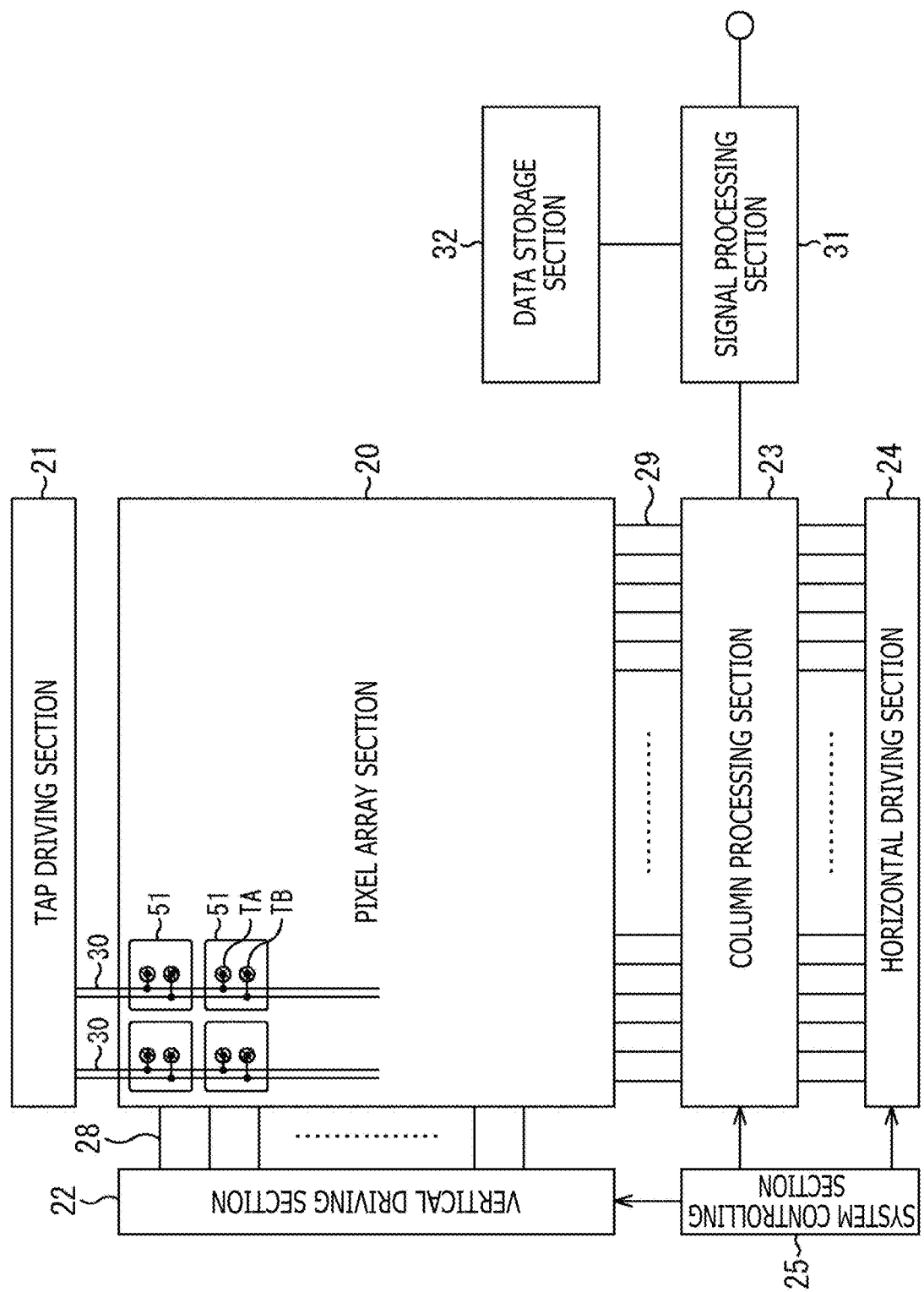
FIG. 1 is a block diagram depicting an example of a configuration of a light reception device.

FIG. 1 is a block diagram depicting an example of a configuration of an embodiment of the light reception device to which the present technology is applied.

The light reception device 1 depicted in FIG. 1 is a CAPD sensor of the back-illuminated type and is provided, for example, on an imaging apparatus having a distance measurement function.

The light reception device 1 is configured such that it includes a pixel array section 20 formed on a semiconductor substrate not depicted and a peripheral circuit section integrated on the semiconductor substrate on which the pixel array section 20 is provided. For example, the peripheral circuit section is configured from a tap driving section 21, a vertical driving section 22, a column processing section 23, a horizontal driving section 24 and a system controlling section 25.

Also, a signal processing section 31 and a data storage section 32 are provided in the light reception device 1. Note that the signal processing section 31 and the data storage section 32 may be provided on a substrate on which the light reception device 1 is provided or may be arranged on a substrate different from the substrate in the imaging apparatus on which the light reception device 1 is provided.

The pixel array section 20 is configured such that pixels 51 that generate charge according to the amount of received light and individually output a signal corresponding to the charge are two-dimensionally arranged in a matrix in a row direction and a column direction. More specifically, the pixel array section 20 includes a plurality of pixels 51 that perform photoelectric conversion for incident light and individually output a signal corresponding to the charge obtained by a result of the photoelectric conversion. Here, the row direction signifies an array direction of the pixels 51 in the horizontal direction and the column direction signifies an array direction of the pixels 51 in the vertical direction. In FIG. 1, the row direction is a transverse direction and the column direction is a vertical direction.

The pixel 51 receives light incident from the outside, especially, infrared light, and performs photoelectric conversion for the received light and outputs a pixel signal corresponding to charge obtained as a result of the photoelectric conversion. The pixel 51 has a first tap TA to which a predetermined voltage MIX0 (first voltage) is applied to detect the charge obtained by the photoelectric conversion and a second tap TB to which a predetermined voltage MIX1 (second voltage) is applied to detect charge obtained by the photoelectric conversion.

The tap driving section 21 supplies the predetermined voltage MIX0 to the first tap TA of the pixels 51 of the pixel array section 20 through a predetermined voltage supply line 30 and supplies the predetermined voltage MIX1 to the second tap TB through the predetermined voltage supply line 30. Therefore, two voltage supply lines 30 including a voltage supply line 30 for transmitting the voltage MIX0 and another voltage supply line 30 for transmitting the voltage MIX1 are wired for one pixel column of the pixel array section 20.

In the pixel array section 20, a pixel driving line 28 is wired, on the pixel array in a matrix, along a row direction for each pixel row and two vertical signal lines 29 are wired along a column direction for each pixel column. For example, the pixel driving line 28 transmits a driving signal for performing driving when a signal is to be read out from a pixel. Note that, although, in FIG. 1, the pixel driving line 28 is depicted as one wire, the number of pixel driving lines 28 is not limited to one. An end of the pixel driving line 28 is connected to an output end corresponding to each row of the vertical driving section 22.

The vertical driving section 22 is configured from a shift register, an address decoder or the like and drives the pixels of the pixel array section 20 at the same time or in a unit of a row or the like. More specifically, the vertical driving section 22 configures a driving section that controls operation of the pixels of the pixel array section 20 together with the system controlling section 25 for controlling the vertical driving section 22.

A signal outputted from each pixel 51 of the pixel row in response to driving control by the vertical driving section 22 is inputted to the column processing section 23 through the vertical signal line 29. The column processing section 23 performs predetermined signal processing for the pixel signal outputted from each pixel 51 through the vertical signal line 29 and temporarily retains the pixel signal after the signal processing.

More specifically, the column processing section 23 performs a noise removing process, an AD (Analog to Digital) conversion process and so forth as the signal processing.

The horizontal driving section 24 is configured from a shift register, an address decoder or the like and selects a unit circuit corresponding to the pixel column of the column processing section 23 in order. By the selection scanning by the horizontal driving section 24, the pixel signal after the signal processing for each unit circuit by the column processing section 23 is outputted in order.

The system controlling section 25 is configured from a timing generator that generates various timing signals and performs driving control of the tap driving section 21, the vertical driving section 22, the column processing section 23 and the horizontal driving section 24 on the basis of the various timing signals generated by the timing generator.

The signal processing section 31 at least includes an arithmetic operation processing function and performs various signal processes such as an arithmetic operation process on the basis of the pixel signal outputted from the column processing section 23. When the signal processing in the signal processing section 31 is to be performed, the data storage section 32 temporarily stores data necessary for the processing.

<Example of Configuration of Pixel>

Now, an example of a configuration of a pixel provided in the pixel array section 20 is described. Each pixel provided in the pixel array section 20 is configured, for example, in such a manner as depicted in FIG. 2.

Figure 2:
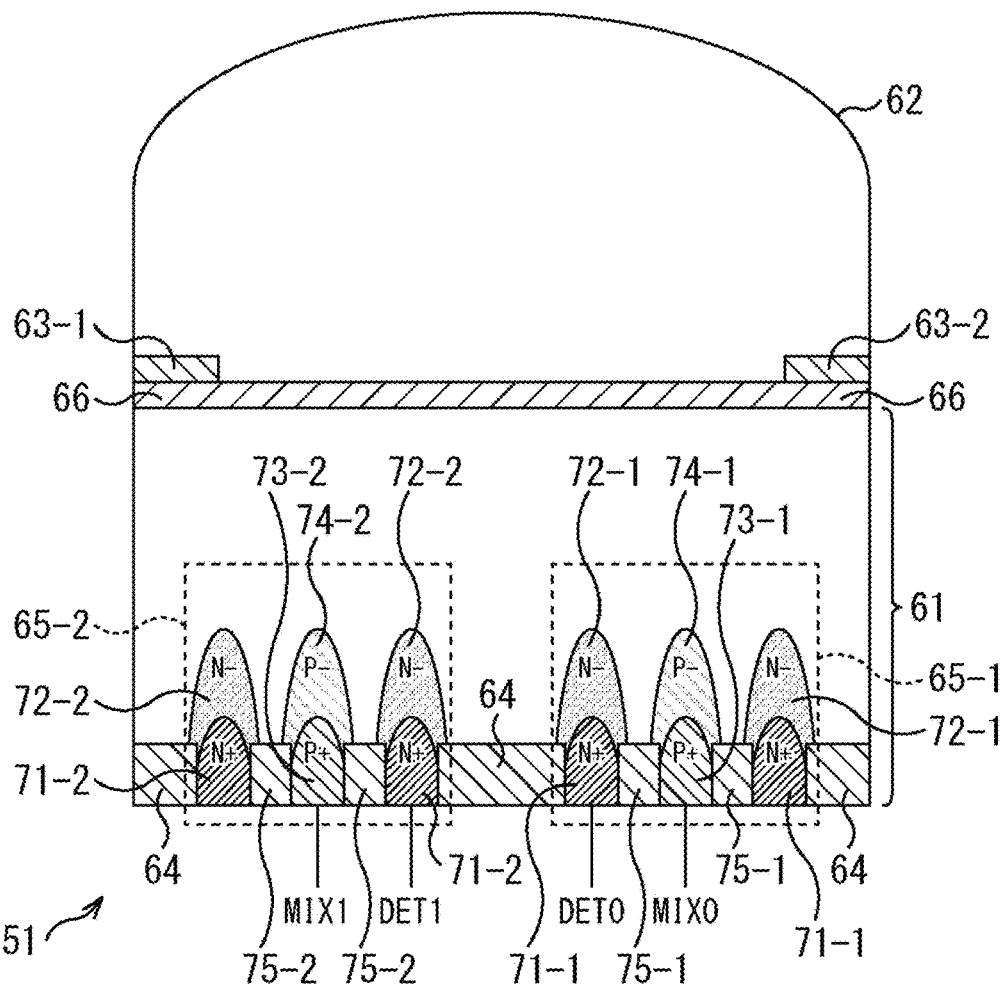
FIG. 2 is a view depicting an example of a configuration of a pixel.

FIG. 2 depicts a cross section of one pixel 51 provided in the pixel array section 20, and this pixel 51 receives and photoelectrically converts light incident from the outside, especially, infrared light and outputs a signal according to charge obtained as a result of the photoelectric conversion.

The pixel 51 includes a substrate 61 including a P-type semiconductor layer such as, for example, a silicon substrate, and an on-chip lens 62 formed on the substrate 61.

For example, the substrate 61 is formed such that the thickness thereof in the vertical direction in FIG. 2, more specifically, the thickness in a direction perpendicular to a plane of the substrate 61, is equal to or smaller than 20 μm. Note that naturally the thickness of the substrate 61 may be equal to or greater than 20 μm and it is sufficient if the thickness is determined in response to a target feature or the like of the light reception device 1.

Furthermore, the substrate 61 is a P-Epi substrate of a high resistance or the like having a substrate concentration equal to or lower than, for example, 1E+13 order, and the resistance (resistivity) of the substrate 61 is, for example, equal to or higher than 500 [Ωcm].

Here, the relationship between the substrate concentration and the resistance of the substrate 61 is such that, for example, when the substrate concentration is 6.48 E+12 [cm$^3$], the resistance is 2000 [Ωcm], when the substrate concentration is 1.30 E+13 [cm$^3$], the resistance is 1000 [Ωcm], when the substrate concentration is 2.59 E+13 [cm$^3$], the resistance is 500 [Ωcm], and when the substrate concentration is 1.30 E+14 [cm$^3$], the resistance is 100 [Ωcm].

In FIG. 2, the upper side face of the substrate 61 is the rear face of the substrate 61 and is a light incident face through which light from the outside is incident on the substrate 61. On the other hand, the lower side face of the substrate 61 is the front face of the substrate 61 and has a multilayer wiring layer not depicted formed thereon. On the light incident face of the substrate 61, a fixed charge film 66 configured from a single layer film or a stacked layer film having positive fixed charge is formed, and the on-chip lens 62 for condensing and introducing light incident from the outside into the substrate 61 is formed on the upper face of the fixed charge film 66. The fixed charge film 66 places the light incident face side of the substrate 61 into a hole accumulation state to suppress generation of dark current.

Furthermore, in the pixel 51, an inter-pixel shading film 63-1 and another inter-pixel shading film 63-2 for preventing crosstalk between adjacent pixels are formed at end portions of the pixel 51 on the fixed charge film 66. In the following description, in the case where there is no necessity to specifically distinguish the inter-pixel shading film 63-1 and the inter-pixel shading film 63-2 from each other, they are sometimes referred to simply as inter-pixel shading films 63.

Although, in this example, light from the outside enters the substrate 61 through the on-chip lens 62, the inter-pixel shading films 63 are formed in order to suppress light incident from the outside from entering a region of a different pixel neighboring with the pixel 51 on the substrate 61. More specifically, light incident on the on-chip lens 62 from the outside and directed toward the different pixel adjacent the pixel 51 is blocked by the inter-pixel shading film 63-1 or the inter-pixel shading film 63-2 from entering the adjacent different pixel.

Since the light reception device 1 is a CAPD sensor of the back-illuminated type, the light incident face of the substrate 61 is the so-called rear face, and a wiring layer configured from wirings and so forth is not formed on the rear face. Furthermore, at a portion of the face on the opposite side to the light incident face of the substrate 61, a wiring layer in which wirings for driving transistors and so forth formed in the substrate 61, wirings for reading out a signal from the pixel 51 and so forth are formed is formed by stacking.

At a portion of the face side on the opposite side to the light incident face in the substrate 61, more specifically, at a portion on the inner side of the lower side face, an oxide film 64, a signal extraction portion 65-1 and another signal extraction portion 65-2 are formed. The signal extraction portion 65-1 corresponds to the first tap TA described hereinabove with reference to FIG. 1, and the signal extraction portion 65-2 corresponds to the second tap TB described hereinabove with reference to FIG. 1.

In this example, the oxide film 64 is formed at a central portion of the pixel 51 in the proximity of the face on the opposite side to the light incident face of the substrate 61, and the signal extraction portion 65-1 and the signal extraction portion 65-2 are formed at the opposite ends of the oxide film 64.

Here, the signal extraction portion 65-1 has an N+ semiconductor region 71-1 that is an N type semiconductor region and another N− semiconductor region 72-1 having a concentration of donor impurities lower than that of the N+ semiconductor region 71-1, and a P+ semiconductor region 73-1 that is a P type semiconductor region and another P− semiconductor region 74-1 having a concentration of acceptor impurities lower than that of the P+ semiconductor region 73-1. Here, as the donor impurities, for example, elements of the group 5 in the periodic table of elements such as phosphorus (P) or arsenic (As) with respect to Si are applicable, and as the acceptor impurities, for example, elements of the group 3 in the periodic table of elements such as boron (B) with respect to Si are applicable. Elements that become donor impurities are called donor elements, and elements that become acceptor impurities are called acceptor elements.

Referring to FIG. 2, the N+ semiconductor region 71-1 is formed at a position neighboring with the right side to the oxide film 64 at a surface inner side portion of the face on the opposite side to the light incident face of the substrate 61. Furthermore, the N− semiconductor region 72-1 is formed on the upper side in FIG. 2 of the N+ semiconductor region 71-1 such that it covers (surrounds) the N+ semiconductor region 71-1.

Furthermore, the P+ semiconductor region 73-1 is formed on the right side of the N+ semiconductor region 71-1. Furthermore, the P− semiconductor region 74-1 is formed on the upper side in FIG. 2 of the P+ semiconductor region 73-1 such that it covers (surrounds) the P+ semiconductor region 73-1.

Furthermore, the N+ semiconductor region 71-1 is formed on the right side of the P+ semiconductor region 73-1. Furthermore, the N− semiconductor region 72-1 is formed on the upper side in FIG. 2 of the N+ semiconductor region 71-1 such that it covers (surrounds) the N+ semiconductor region 71-1.

Similarly, the signal extraction portion 65-2 has an N+ semiconductor region 71-2 that is an N time semiconductor region and an N− semiconductor region 72-2 having a concentration of donor impurities lower than that of the N+ semiconductor region 71-2, and a P+ semiconductor region 73-2 that is a P type semiconductor region and a P− semiconductor region 74-2 having a concentration of acceptor impurities lower than that of the P+ semiconductor region 73-2.

In FIG. 2, the N+ semiconductor region 71-2 is formed at a position neighboring on the left side with the oxide film 64 at a surface inner side portion of the face on the opposite side to the light incident face of the substrate 61. Furthermore, the N− semiconductor region 72-2 is formed on the upper side in FIG. 2 of the N+ semiconductor region 71-2 such that it covers (surrounds) the N+ semiconductor region 71-2.

Furthermore, the P+ semiconductor region 73-2 is formed on the left side of the N+ semiconductor region 71-2. Furthermore, the P− semiconductor region 74-2 is formed on the upper side in FIG. 2 of the P+ semiconductor region 73-2 such that it covers (surrounds) the P+ semiconductor region 73-2.

Furthermore, the N+ semiconductor region 71-2 is formed on the left side of the P+ semiconductor region 73-2. Furthermore, the N− semiconductor region 72-2 is formed on the upper side in FIG. 2 of the N+ semiconductor region 71-2 such that it covers (surrounds) the N+ semiconductor region 71-2.

At end portions of the pixel 51 in a surface inner side portion of the face on the opposite side to the light incident face of the substrate 61, oxide films 64 similar to that at the central portion of the pixel 51 are formed.

In the following description, in the case where there is no necessity to specifically distinguish the signal extraction portion 65-1 and the signal extraction portion 65-2 from each other, each of them is sometimes referred to simply as signal extraction portion 65.

Furthermore, in the following description, in the case where there is no necessity to specifically distinguish the N+ semiconductor region 71-1 and the N+ semiconductor region 71-2 from each other, each of them is referred to merely as N+ semiconductor region 71, and in the case where there is no necessity to specifically distinguish the N− semiconductor region 72-1 and the N− semiconductor region 72-2 from each other, each of them is referred to merely as N− semiconductor region 72.

Furthermore, in the following description, in the case where there is no necessity to specifically distinguish the P+ semiconductor region 73-1 and the P+ semiconductor region 73-2 from each other, each of them is referred to merely as P+ semiconductor region 73, and in the case where there is no necessity to specifically distinguish the P− semiconductor region 74-1 and the P− semiconductor region 74-2 from each other, each of them is referred to merely as P− semiconductor region 74.

Furthermore, in the substrate 61, between the N+ semiconductor region 71-1 and the P+ semiconductor region 73-1, a separation portion 75-1 for separating the regions from each other includes an oxide film or the like. Similarly, also between the N+ semiconductor region 71-2 and the P+ semiconductor region 73-2, a separation portion 75-2 for separating the regions from each other includes an oxide film or the like. In the following description, in the case where there is no necessity to specifically distinguish the separation portion 75-1 and the separation portion 75-2 from each other, each of them is referred to merely as separation portion 75.

The N+ semiconductor region 71 provided in the substrate 61 functions as a charge detection section for detecting the light amount of incident light from the outside to the pixel 51, more specifically, the amount of signal carriers generated by photoelectric conversion by the substrate 61. Note that a region including not only the N+ semiconductor region 71 but also the N− semiconductor region 72 can be grasped as the charge detection section. Furthermore, the P+ semiconductor region 73 functions as a charge application portion for injecting majority carrier current into the substrate 61, more specifically, for directly applying a voltage to the substrate 61, to generate an electric field in the substrate 61. Note that a region including not only the P+ semiconductor region 73 but also the P− semiconductor region 74 in which the acceptor impurity concentration is low can be grasped as a voltage application portion.

In the pixel 51, an FD (Floating Diffusion) portion (hereinafter referred to especially also as FD portion A) that is a floating diffusion region not depicted is connected directly to the N+ semiconductor region 71-1, and the FD portion A is connected to a vertical signal line 29 through an amplification transistor not depicted or the like.

Similarly, to the N+ semiconductor region 71-2, a different FD portion (hereinafter referred to specifically also as FD portion B) that is a floating diffusion region is connected directly, and furthermore, the FD portion B is connected to a vertical signal line 29 through an amplification transistor not depicted or the like. Here the FD portion A and the FD portion B are connected to the vertical signal lines 29 different from each other.

For example, in the case where it is tried to measure the distance to a target by the indirect ToF method, infrared light is emitted from an imaging apparatus in which the light reception device 1 is provided toward the target. Then, if the infrared light is reflected by the target and returns as reflection light to the imaging apparatus, then the substrate 61 of the light reception device 1 receives and photoelectrically converts the reflection light (infrared light) incident thereto. The tap driving section 21 drives the first tap TA and the second tap TB of the pixel 51 and distributes a signal according to charge DET obtained by the photoelectric conversion to the FD portion A and the FD portion B.

For example, at a certain timing, the tap driving section 21 applies a voltage to each of the two P+ semiconductor regions 73 through a contact or the like. Specifically, for example, the tap driving section 21 applies a voltage of MIX0=1.5 V to the P+ semiconductor region 73-1 that is the first tap TA and applies another voltage of MIX0=0 V to the P+ semiconductor region 73-2 that is the second tap TB.

Consequently, an electric field is generated between the two P+ semiconductor regions 73 in the substrate 61, and current flows from the P+ semiconductor region 73-1 to the P+ semiconductor region 73-2. In this case, positive holes (holes) in the substrate 61 move in a direction toward the P+ semiconductor region 73-2 while electrons move in a direction toward the P+ semiconductor region 73-1.

Therefore, if, in such a state as just described, infrared light (reflection light) from the outside is introduced into the substrate 61 through the on-chip lens 62 and is photoelectrically converted in the substrate 61 into an electron and a hole in pair, then the obtained electrode is introduced in a direction toward the P+ semiconductor region 73-1 by the electric field between the P+ semiconductor regions 73 and moves into the N+ semiconductor region 71-1.

In this case, electrons generated by the photoelectric conversion are used as a signal carrier for detecting a signal according to an amount of infrared light incident to the pixel 51, more specifically, according to the reception light amount of the infrared light.

As a consequence, into the N+ semiconductor region 71-1, charge according to electrons moved into the N+ semiconductor region 71-1 is accumulated, and this charge is detected by the column processing section 23 through the FD portion A, amplification transistor, vertical signal line 29 and so forth.

More specifically, accumulation charge DET0 in the N+ semiconductor region 71-1 is transferred to the FD portion A directly connected to the N+ semiconductor region 71-1, and a signal according to the accumulation charge DET0 transferred to the FD portion A is read out by the column processing section 23 through the amplification transistor and the vertical signal line 29. Then, the read out signal is subjected to such a process as an AD conversion process by the column processing section 23, and a pixel signal obtained as a result of the process is supplied to the signal processing section 31.

This pixel signal is a signal indicative of the charge amount according to the electrons detected by the N+ semiconductor region 71-1, more specifically, indicative of the amount of charge DET0 accumulated in the FD portion A. In other words, it can be considered that the pixel signal is a signal indicative of a light amount of infrared light received by the pixel 51.

Note that, at this time, a pixel signal according to electrons detected by the N+ semiconductor region 71-2 similarly as in the case of the N+ semiconductor region 71-1 may also be used suitably for distance measurement.

Furthermore, at the next timing, voltages are applied to the two P+ semiconductor regions 73 through contacts and so forth by the tap driving section 21 such that an electric field of a direction opposite to that of the electric field having been generated in the substrate 61 till then. Specifically, for example, a voltage of MIX0=0 V is applied to the P+ semiconductor region 73-1 that is the first tap TA and another voltage of MIX1=1.5 V is applied to the P+ semiconductor region 73-2 that is the second tap TB.

As a consequence, an electric field is generated between the two P+ semiconductor regions 73 in the substrate 61 and current flows from the P+ semiconductor region 73-2 to the P+ semiconductor region 73-1.

If, in such a state as just described, infrared light (reflection light) from the outside is introduced into the substrate 61 through the on-chip lens 62 and the infrared light is converted into pairs of an electron and a hole by photoelectric conversion in the substrate 61, then the obtained electrons are introduced in a direction toward the P+ semiconductor region 73-2 by the electric field between the P+ semiconductor regions 73 and moves into the N+ semiconductor region 71-2.

As a consequence, in the N+ semiconductor region 71-2, charge according to electrons having been moved into the N+ semiconductor region 71-2 is accumulated, and this charge is detected by the column processing section 23 through the FD portion B, amplification transistor, vertical signal line 29 and so forth.

More specifically, accumulation charge DET1 in the N+ semiconductor region 71-2 is transferred to the FD portion B directly connected to the N+ semiconductor region 71-2, and a signal according to the charge DET1 transferred to the FD portion B is read out by the column processing section 23 through the amplification transistor and the vertical signal line 29. Then, processes such as an AD conversion process and so forth are performed for the read out signal by the column processing section 23, and a signal obtained as a result of the processes is supplied to the signal processing section 31.

Note that also a pixel signal according to electrons detected by the N+ semiconductor region 71-1 in a similarly manner as in the case of the N+ semiconductor region 71-2 may be suitably used for distance measurement.

If pixel signals generated by photoelectric conversion during periods different from each other are obtained by the same pixel 51 in this manner, the signal processing section 31 calculates distance information indicative of the distance to the target on the basis of the pixel signals and outputs the distance information to the succeeding stage.

The method of distributing signal carriers to the N+ semiconductor regions 71 different from each other and calculating distance information associated with the basis of signals according to the signal carriers in this manner is called indirect ToF method.

If a portion of the signal extraction portion 65 of the pixel 51 is viewed in a direction from above to below in FIG. 2, more specifically, in a direction perpendicular to the plane of the substrate 61, then this is structured such that each P+ semiconductor region 73 is surrounded by an N+ semiconductor region 71 as depicted, for example, in FIG. 3. Note that portions corresponding to those in the case of FIG. 2 are denoted by like reference signs and description of them is suitably omitted.

Figure 3:
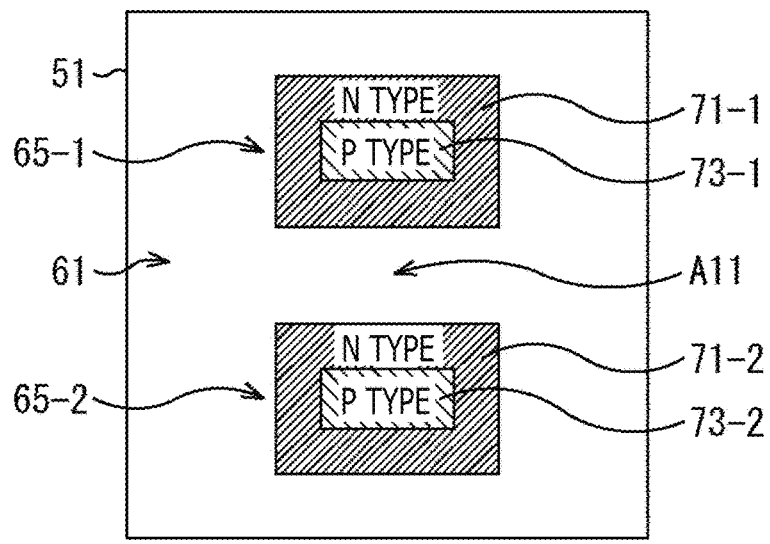
FIG. 3 is a view depicting an example of a configuration of a portion of a signal extraction portion of the pixel.

In the example depicted in FIG. 3, an oxide film 64 not depicted is formed at a central portion of the pixel 51, and a signal extraction portion 65 is formed at a rather end side portion from the center of the pixel 51. Especially here, in the pixel 51, two signal extraction portions 65 are formed.

In addition, at each signal extraction portion 65, a P+ semiconductor region 73 is formed in a rectangular shape at a central position of the signal extraction portion 65, and centered at the P+ semiconductor region 73, the P+ semiconductor region 73 is surrounded by an N+ semiconductor region 71 of a rectangular shape, more particularly, of a rectangular frame shape. More specifically, the N+ semiconductor region 71 is formed in such a manner as to surround the P+ semiconductor region 73.

Furthermore, in the pixel 51, an on-chip lens 62 is formed such that infrared light incident from the outside is condensed to a central portion of the pixel 51, more specifically, to a portion indicated by an arrow mark A11.

In other words, infrared light incident to the on-chip lens 62 from the outside is condensed to a position indicated by the arrow mark A11, more specifically, to a position on the upper side in FIG. 2 of the oxide film 64 in FIG. 2, by the on-chip lens 62.

Therefore, infrared light is condensed to a position between the signal extraction portion 65-1 and the signal extraction portion 65-2. As a consequence, such a situation that infrared light enters a pixel neighboring with the pixel 51 to cause crosstalk can be suppressed, and also it can be suppressed that infrared light directly enters the signal extraction portion 65.

For example, if infrared light directly enters the signal extraction portion 65, then the charge separation efficiency, more specifically, Cmod (Contrast between active and inactive tap) or Modulation contrast, degrades.

Here, that one of the signal extraction portions 65 from which reading out of a signal according to the charge DET obtained by photoelectric conversion is to be performed, more specifically, the signal extraction portion 65 from which the charge DET obtained by photoelectric conversion is to be detected, is referred to also as active tap (active tap).

On the contrary, the signal extraction portion 65 from which reading out of a signal according to the charge DET obtained by photoelectric conversion is not to be performed basically, more specifically, the signal extraction portion 65 that is not an active tap, is referred to also as inactive tap (inactive tap).

In the example described above, that one of the signal extraction portions 65 in which the voltage of 1.5 V is applied to the P+ semiconductor region 73 is the active tap, and the signal extraction portion 65 in which the voltage of 0 V is applied to the P+ semiconductor region 73 is the inactive tap.

The Cmod is an index that is calculated by an expression (1) given below and represents what % of charge from within the charge generated by photoelectric conversion of incident infrared light can be detected by the N+ semiconductor region 71 of the signal extraction portion 65 that is the active tap, more specifically, whether or not a signal according to charge can be extracted, and indicates a charge separation efficiency. In the expression (1), I0 is a signal detected by one of the two charge detection portions (P+ semiconductor regions 73) and I1 is a signal detected by the other charge detection portion.

$$\text{Cmod} = \{|I0-I1|/(I0+I1)\} \times 100 \tag{1}$$

Therefore, for example, if infrared light incident from the outside enters the region of the inactive tap and photoelectric conversion is performed in the inactive tap, then the possibility that electrons of a signal carrier generated by the photoelectric conversion may move into the N+ semiconductor region 71 in the inactive tap is high. Consequently, charge of some electrons obtained by the photoelectric conversion are not detected by the N+ semiconductor region 71 in the active tap, and the Cmod, more specifically, the charge separation efficiency, drops.

Therefore, by configuring the pixel 51 such that infrared light is condensed to the proximity of a central portion of the pixel 51, which is at a position spaced by substantially equal distances from the two signal extraction portions 65, the possibility that infrared light incident from the outside may be photoelectrically converted in the region of the inactive tap can be reduced and the charge separation efficiency can be improved thereby. Furthermore, in the pixel 51, Modulation contrast also can be improved. More specifically, it is possible to allow electrons obtained by photoelectric conversion to be introduced readily into the N+ semiconductor region 71 in the active tap.

With such a light reception device 1 as described above, the following advantageous effects can be achieved.

More specifically, since the light reception device 1 is of the back-illuminated type, quantum efficiency (QE)×aperture ratio (FF (Fill Factor)) can be maximized and the distance measurement characteristic by the light reception device 1 can be improved.

Figure 4:
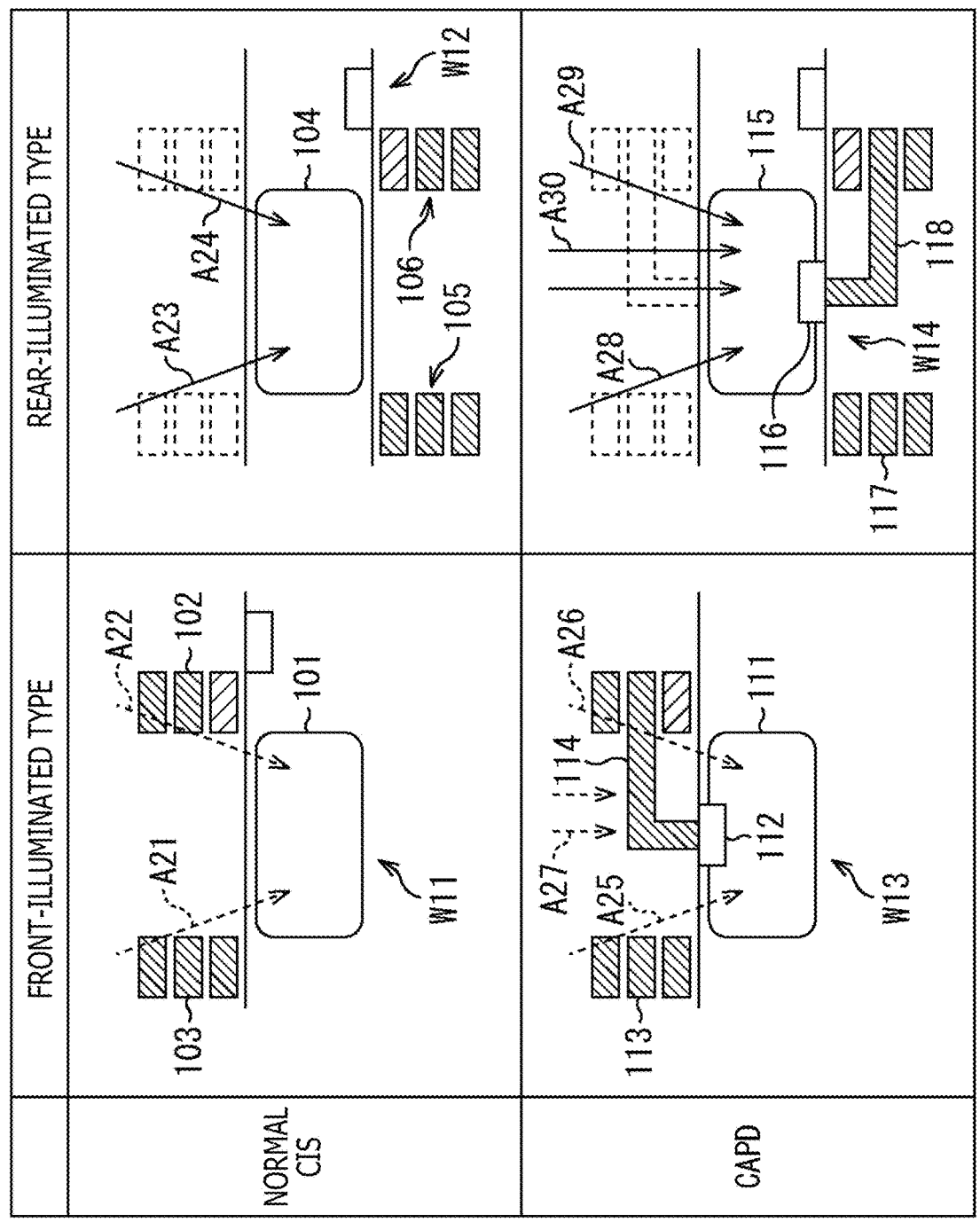
FIG. 4 is a view illustrating sensitivity improvement.

For example, as indicated by an arrow mark W11 of FIG. 4, an ordinary image sensor of the front-illuminated type is structured such that a wiring 102 and another wiring 103 are formed on the light indicant face side, to which light from the outside is incident, of a PD 101 that is a photoelectric conversion portion.

Therefore, it occurs such a situation that part of light incident obliquely to the PD 101 with some angle as indicated by an arrow mark A21 or another arrow mark A22 from the outside is blocked by the wiring 102 or the wiring 103 and does not enter the PD 101.

In contrast, an image sensor of the back-illuminated type is structured such that a wiring 105 and another wiring 106 are formed on a face of a PD 104, which is a photoelectric conversion portion, on the opposite side to the light incident face to which light from the outside is incident, for example, as indicated by an arrow mark W12.

Therefore, in comparison with an alternative case in which the image sensor is of the front-illuminated type, a sufficient aperture ratio can be assured. More specifically, for example, light incident obliquely with respect to the PD 104 with a certain angle as indicated by an arrow mark A23 or another arrow mark A24 from the outside is incident to the PD 104 without being blocked by any wiring. As a consequence, it is possible to receive a greater amount of light thereby to improve the sensitivity of the pixel.

Such improvement effect as described above of the pixel sensitivity obtained by forming an image sensor as that of the back-illuminated type can be achieved also with the light reception device 1 that is a CAPD sensor of the back-illuminated type.

Furthermore, for example, in a CAPD sensor of the front-illuminated type, a signal extraction portion 112 called tap, more particularly, a P+ semiconductor region or an N+ semiconductor region of a tap, is formed on the light incident face side on which light from the outside is incident in the inside of a PD 111 that is a photoelectric conversion portion as indicated by an arrow mark W13. More particularly, a CAPD sensor of the front-illuminated type is structured such that a wiring 113 and a contact or a wiring 114 of a metal connected to the signal extraction portion 112 are formed on the light incident face side.

Therefore, for example, not only such a situation that part of light incident obliquely on the PD 111 with a certain angle as indicated by an arrow mark A25 or another arrow mark A26 from the outside is blocked by the wiring 113 or the like and is not incident on the PD 111 but also such a situation that also light incident perpendicularly on the PD 111 as indicated by an arrow mark A27 is blocked by the wiring 114 and is not incident on the PD 111.

In contrast, a CAPD sensor of the back-illuminated type is structured such that a signal extraction portion 116 is formed at a portion of the face of a PD 115, which is a photoelectric conversion portion, on the opposite side to the light incident face on which light from the outside is incident as indicated, for example, by an arrow mark W14. Furthermore, on the face on the opposite side to the light incident face of the PD 115, a wiring 117 and a contact and a wiring 118 of metal connected to the signal extraction portion 116 are formed.

Here, the PD 115 corresponds to the substrate 61 depicted in FIG. 2, and the signal extraction portion 116 corresponds to the signal extraction portion 65 depicted in FIG. 2.

In a CAPD sensor of the back-illuminated type of such a structure as described above, a sufficient aperture ratio can be assured in comparison with that in an alternative case of the front-illuminated type. Therefore, the quantum efficiency (QE)×aperture ratio (FF) can be maximized and the distance measurement characteristic can be improved.

More specifically, for example, light incident obliquely toward the PD 115 with a certain angle as indicated by an arrow mark A28 or another arrow mark A29 from the outside enters the PD 115 without being blocked. Similarly, for example, also light incident perpendicularly toward the PD 115 as indicated by an arrow mark A30 enters the PD 115 without being blocked by a wiring or the like.

In this manner, in a CAPD sensor of the back-illuminated type, not only light incident with a certain angle but also light incident perpendicularly to the PD 115, which is otherwise reflected by a wiring or the like connected to a signal extraction portion in a CAPD sensor of the front-illuminated type, can be received. As a consequence, a greater amount of light can be received to improve the sensitivity of the pixel. More specifically, the quantum efficiency (QE)×aperture ratio (FF) can be maximized, and as a result, the distance measurement characteristic can be improved.

Especially, in the case where a tap is arranged not at a pixel outer edge but in the proximity of the middle of a pixel, although, in a CAPD sensor of the front-illuminated type, a sufficient aperture ratio cannot be assured and the sensitivity of the pixel is degraded, in the light reception device 1 that is a CAPD sensor of the back-illuminated type, a sufficient aperture ratio can be assured irrespective of the arrangement position of the tap, and the sensitivity of the pixel can be improved.

Furthermore, in the light reception device 1 of the back-illuminated type, since the signal extraction portion 65 is formed in the proximity of the face on the opposite side to the light incident face of the substrate 61 on which infrared light from the outside is incident, occurrence of photoelectric conversion of infrared light in a region of an inactive tap can be reduced. As a consequence, the Cmod, more specifically, the charge separation efficiency, can be improved.

FIG. 5 depicts cross sectional views of the CAPD sensor of the front-illuminated type and the back-illuminated type.

In the CAPD sensor of the front-illuminated type on the left side in FIG. 5, the upper side of a substrate 141 in FIG. 5 is the light incident face, and a wiring layer 152 including a plurality of layers of wirings, an inter-pixel shading portion 153 and an on-chip lens 154 are stacked on the light incident face side of the substrate 141.

In the CAPD sensor of the back-illuminated type on the right side in FIG. 5, a wiring layer 152 including a plurality of layers of wirings is formed on the lower side of a substrate 142 that is the opposite side to the light incident face in FIG. 5, and an inter-pixel shading portion 153 and an on-chip lens 154 are stacked on the upper side of the substrate 142 that is the light incident face side.

Note that a gray trapezoidal shape in FIG. 5 indicates a region in which the light intensity is high because infrared light is condensed by the on-chip lens 154.

For example, a CAPD sensor of the front-illuminated type includes a region R11 in which an inactive tap and an active tap exist on the light incident face side of the substrate 141. Therefore, there are many components incident directly on the inactive tap, and if photoelectric conversion occurs in the region of the inactive tap, then signal carriers obtained by the photoelectric conversion are not detected in the N+semiconductor region of the active tap.

In a CAPD sensor of the front-illuminated type, since the intensity of infrared light is high in the region R11 in the proximity of the light incident face of the substrate 141, the probability that photoelectric conversion of infrared light is performed in the region R11 is high. More specifically, since the light amount of infrared light incident on the proximity of the inactive tap is great, signal carriers that cannot be detected by the active tap increase, resulting in degradation of the charge separation efficiency.

In contrast, in a CAPD sensor of the back-illuminated type, a region R12 in which the inactive tap and the active tap exist is positioned in the proximity of the face on the opposite side to the light incident face side. Here, the substrate 142 corresponds to the substrate 61 depicted in FIG. 2.

In this example, since the region R12 exists at a portion of the face on the opposite side to the light incident face side of the substrate 142 and the region R12 is positioned far from the light incident face, the intensity of incident infrared light is comparatively low in the proximity of the region R12.

Signal carriers generated by photoelectric conversion in a region in which the intensity of infrared light is high such as a region in the proximity of the center or of the light incident face of the substrate 142 are introduced to the active tap by the electric field generated in the substrate 142 and detected by the N+ semiconductor region of the active tap.

On the other hand, in the proximity of the region R12 including the inactive tap, since the intensity of incident infrared light is comparatively low, the possibility that photoelectric conversion of infrared light may be performed in the region R12 is low. In short, since the light amount of infrared light incident on the proximity of the inactive tap is small, the number of signal carriers (electrons) that are generated by photoelectric conversion in the proximity of the inactive tap and move to the N+ semiconductor region of the inactive tap decreases, and the charge separation efficiency can be improved thereby. As a result, the distance measurement characteristic can be improved.

Furthermore, in the light reception device 1 of the back-illuminated type, since thinning of the substrate 61 can be implemented, the extraction efficiency of electrons (charge) that are a signal carrier can be improved.

Figure 6:
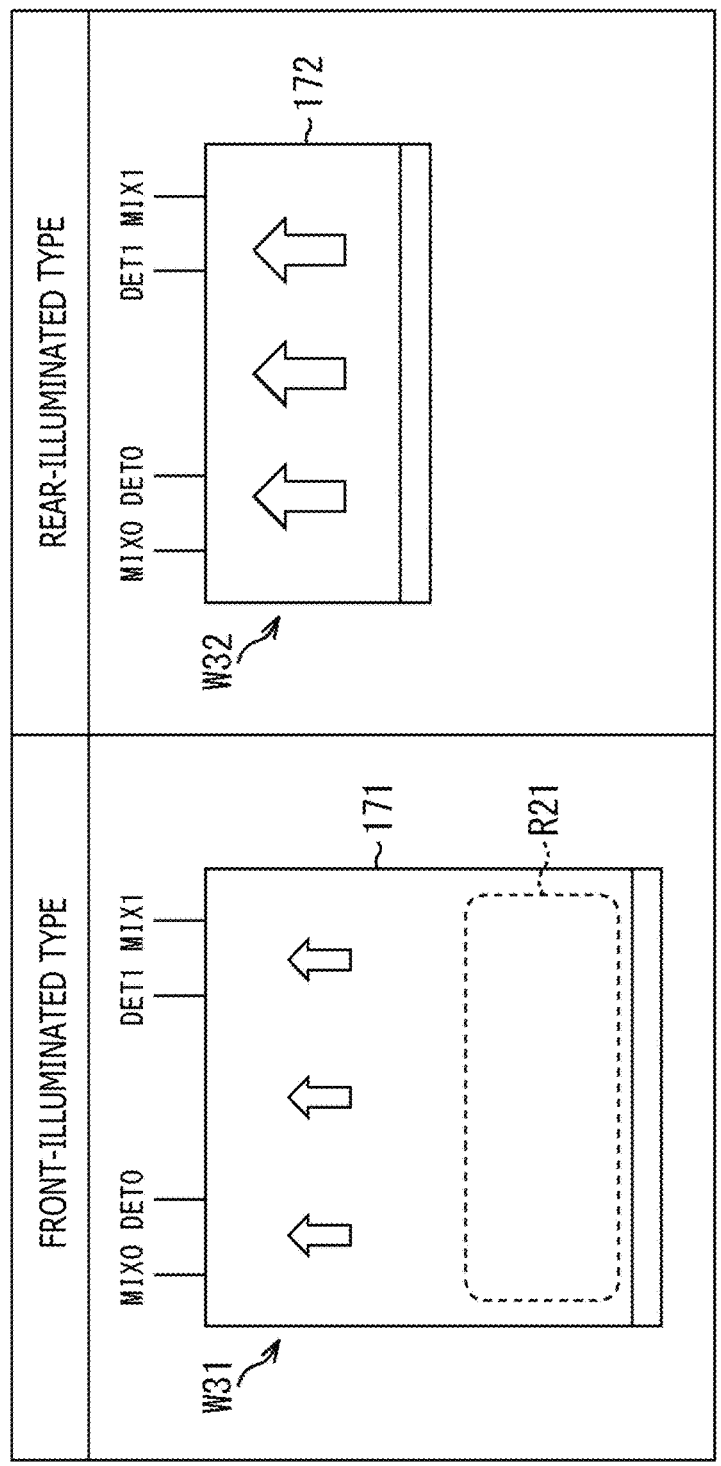
FIG. 6 is a view illustrating improvement of the extraction efficiency of electrons.

For example, since, in a CAPD sensor of the front-illuminated type, the aperture ratio cannot be assured sufficiently, it is necessary to provide a certain degree of thickness to a substrate 171 in order to assure a higher quantum efficiency as indicated by an arrow mark W31 of FIG. 6 and suppress reduction of the quantum efficiency×aperture ratio.

This makes the inclination of the potential moderate in a region in the proximity of the face on the opposite side to the light incident face in the substrate 171, for example, at a portion of region R21 and substantially makes the electric field in a direction perpendicular to the substrate 171 weaker. In this case, since the moving speed of the signal carrier becomes lower, the period of time required to detect a signal carrier in the N+ semiconductor region of the active tap after photoelectric conversion is performed increases. Note that an arrow mark in the substrate 171 in FIG. 6 represents an electric field in a direction perpendicular to the substrate 171 in the substrate 171.

Furthermore, if the substrate 171 is thick, then the distance of movement of a signal carrier from a position far from the active tap in the substrate 171 to the N+ semiconductor region in the active tap becomes long. Therefore, at a position far from the active tap, the period of time required until a signal carrier is detected in the N+ semiconductor region of the active tap after photoelectric conversion is performed further increases.

Figure 7:
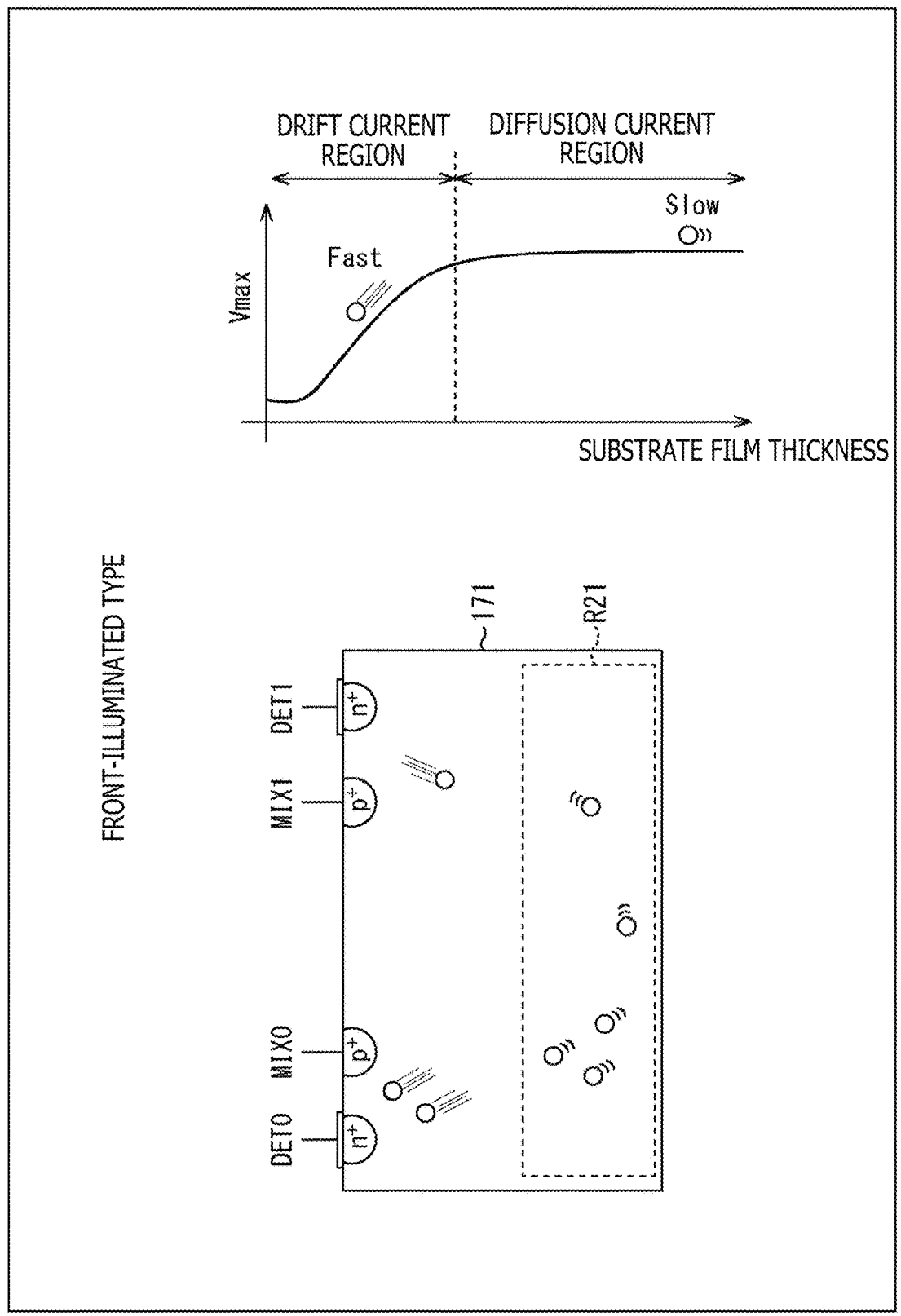
FIG. 7 is a view illustrating a moving speed of a signal carrier in a front-illuminated type.

FIG. 7 depicts a relationship between the position in the thicknesswise direction of the substrate 171 and the speed of movement of a signal carrier. A region R21 corresponds to a diffusion current region.

In this manner, if the substrate 171 has an increased thickness, for example, when the driving frequency is high, in short, when changeover between active and inactive of a tap (signal extraction portion) is performed at a high speed, it becomes impossible to fully pull electrons generated at a position remote from the active tap such as the region R21 into the N+ semiconductor region. More specifically, if the period of time during which the tap is active is short, then a situation that electrons (charge) generated in the region R21 and so forth cannot be detected by the N+ semiconductor region of the active tap occurs, resulting in degradation of the extraction efficiency of electrons.

In contrast, in a CAPD sensor of the back-illuminated type, since a sufficient aperture ratio can be assured, even if a substrate 172 is made thinner, for example, as indicated by an arrow mark W32 in FIG. 6, a sufficient quantum efficiency×aperture ratio can be assured. Here, the substrate 172 corresponds to the substrate 61 of FIG. 2, and an arrow mark in the substrate 172 represents an electric field having a direction perpendicular to the substrate 172.

FIG. 8 depicts a relationship between the position in the thicknesswise direction of the substrate 172 and the speed of movement of a signal carrier.

If the thickness of the substrate 172 in a direction perpendicular to the substrate 172 is made thinner in this manner, then the electric field substantially in a direction perpendicular to the substrate 172 becomes stronger, and only electrons (charge) only in a drift current region in which the speed of movement of the signal carrier is high are used while electrons in the diffusion current region in which the speed of movement of the signal carrier is low are not used. By using only electrons (charge) only in the drift current region, the time required to detect a signal carrier in the N+ semiconductor region of the active tap after photoelectric conversion is performed becomes short. Furthermore, if the thickness of the substrate 172 decreases, then also the distance of movement of the signal carrier to the N+ semiconductor region in the active tap decreases.

From those circumstances, in a CAPD sensor of the back-illuminated type, even when the driving frequency is high, signal carriers (electrons) generated in the regions in the substrate 172 can be pulled fully into the N+ semiconductor region of the active tap, and the extraction efficiency of electrons can be improved.

Furthermore, by reduction in thickness of the substrate 172, a sufficient electron extraction efficiency can be assured even with a high driving frequency, and a high speed driving resistance can be improved.

Especially, in a CAPD sensor of the back-illuminated type, since a voltage can be applied to the substrate 172, more specifically, directly to the substrate 61, the response speed in changeover between active and inactive of the tap is high, and the CAPD sensor can be driven with a high driving frequency. Furthermore, since a voltage can be applied directly to the substrate 61, a region in which modulation can be performed in the substrate 61 becomes wider.

Furthermore, with the light reception device 1 (CAPD sensor) of the back-illuminated type, since a sufficient aperture ratio can be obtained, the pixel can be refined as much, and the miniaturization resistance of the pixel can be improved.

Furthermore, by forming the light reception device 1 as that of the back-illuminated type, the liberalization in BEOL (Back End Of Line) capacity design becomes possible, and As a consequence, the degree of freedom in design of the saturation signal level (Qs) can be improved.

Modification 1 of First Embodiment

<Example of Configuration of Pixel>

Note that the foregoing description is given taking a case in which, in a portion of the signal extraction portion 65 in the substrate 61, the N+ semiconductor region 71 and the P+ semiconductor region 73 are rectangular regions as depicted in FIG. 3 as an example. However, the shapes of the N+ semiconductor region 71 and the P+ semiconductor region 73 when they are viewed in a direction perpendicular to the substrate 61 may be any shape.

Figure 9:
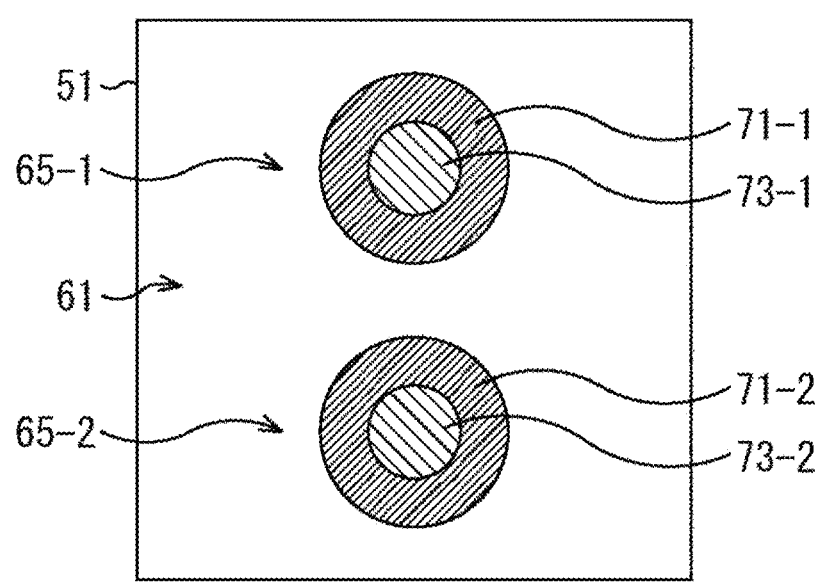
FIG. 9 is a view depicting an example of a different configuration of a portion of the signal extraction portion of the pixel.

More specifically, the N+ semiconductor region 71 and the P+ semiconductor region 73 may be formed in a circular shape, for example, as depicted in FIG. 9. Note that, in FIG. 9, portions corresponding to those in the case of FIG. 3 are denoted by like reference signs, and description of them is omitted suitably.

FIG. 9 depicts the N+ semiconductor region 71 and the P+ semiconductor region 73 when a portion of the signal extraction portions 65 of the pixel 51 is viewed in a direction perpendicular to the substrate 61.

In this example, an oxide film 64 not depicted is formed at a central portion of the pixel 51, and a signal extraction portion 65 is formed at a portion from the center to a rather end side portion of the pixel 51. Especially, in the pixel 51 here, two signal extraction portions 65 are formed.

At each signal extraction portion 65, a circular P+ semiconductor region 73 is formed at a central position, and the P+ semiconductor region 73 is surrounded by an N+ semiconductor region 71 of a circular shape, more particularly, of a ring shape, centered at the P+ semiconductor region 73.

Figure 10:
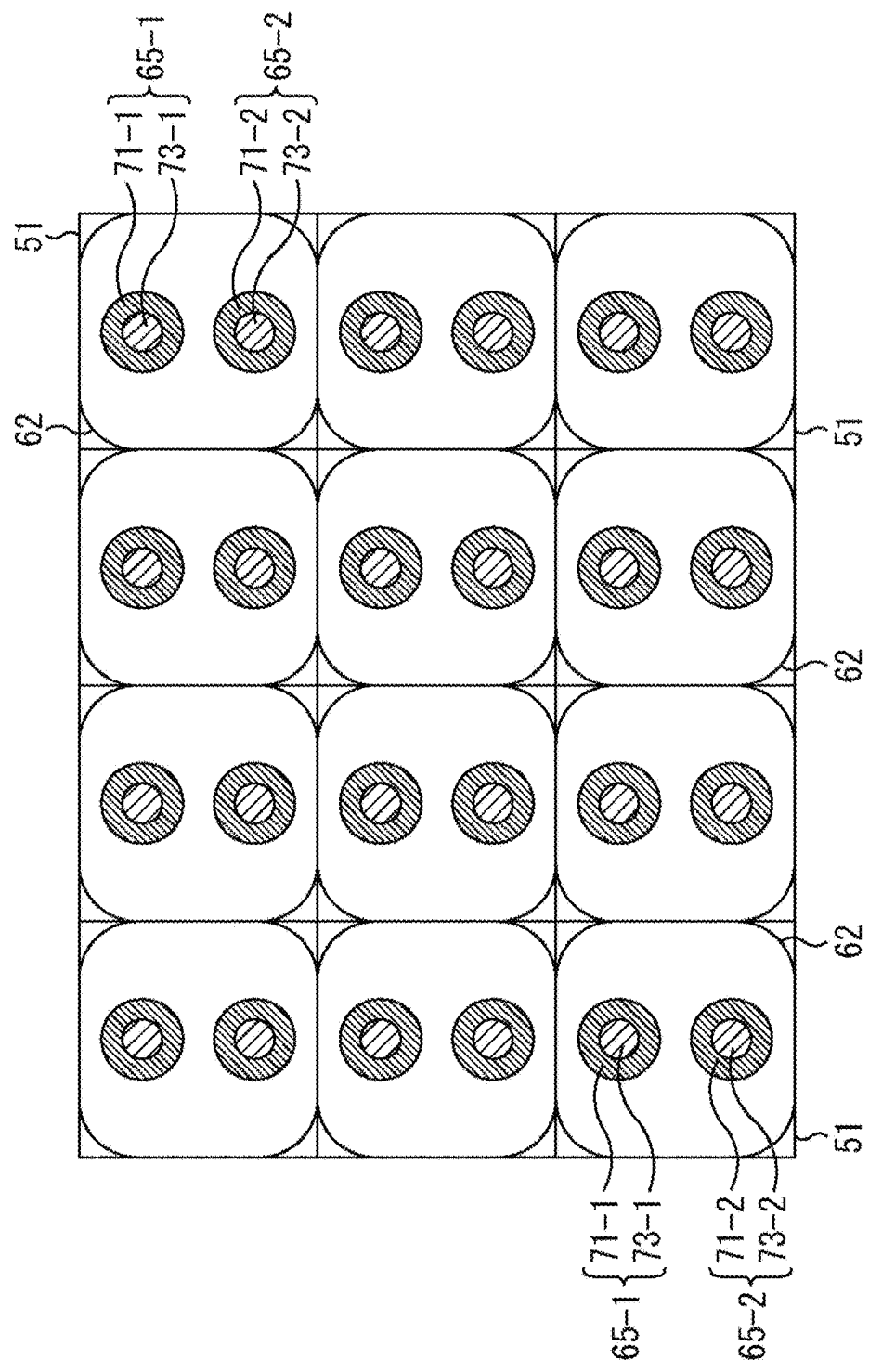
FIG. 10 is a view illustrating a relationship between a pixel and an on-chip lens.

FIG. 10 is a plan view where an on-chip lens 62 is overlaid at part of a pixel array section 20 in which pixels 51 having the signal extraction portions 65 depicted in FIG. 9 are arranged two-dimensionally in a matrix.

The on-chip lens 62 is formed in a unit of a pixel as depicted in FIG. 10. More specifically, a unit region in which one on-chip lens 62 is formed corresponds to one pixel.

Note that, although a separation portion 75 including an oxide film or the like is interposed between the N+ semiconductor region 71 and the P+ semiconductor region 73, the separation portion 75 may be provided or may not be provided.

Modification 2 of First Embodiment

<Example of Configuration of Pixel>

Figure 11:
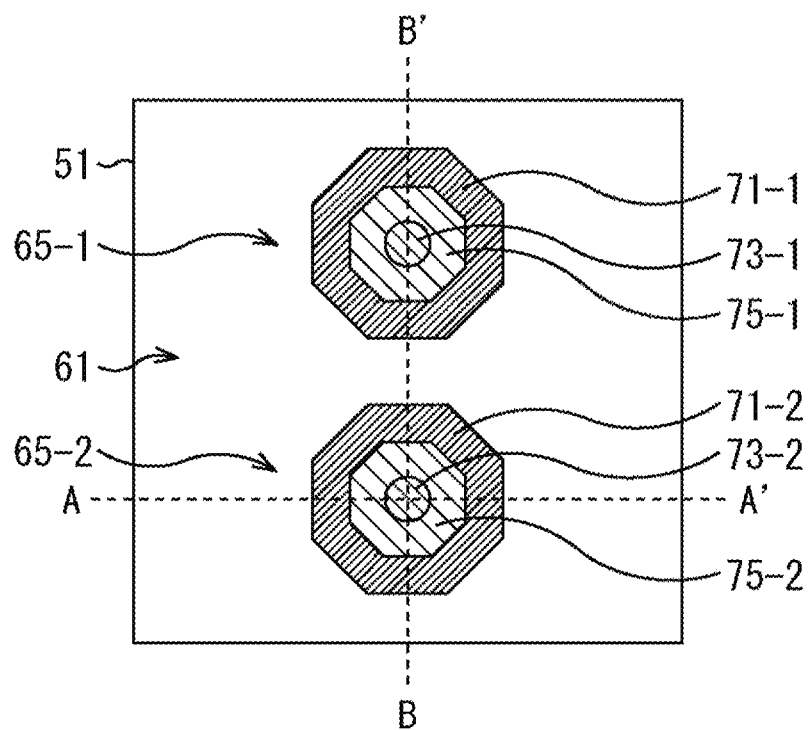
FIG. 11 is a view depicting a different example of a configuration of a portion of the signal extraction portion of the pixel.

FIG. 11 is a plan view depicting a modification of a planar shape of the signal extraction portion 65 of the pixel 51.

The signal extraction portion 65 may have a planar shape of such a rectangular shape as depicted in FIG. 3, such a circular shape depicted in FIG. 9 or, for example, such an octagonal shape as depicted in FIG. 11.

Furthermore, FIG. 11 depicts a plan view in the case where a separation portion 75 including an oxide film or the like is located between the N+ semiconductor region 71 and the P+ semiconductor region 73.

A line A-A' depicted in FIG. 11 indicates a sectional line of FIG. 37 hereinafter described, and another line B-B' indicates a sectional line of FIG. 36 hereinafter described.

Second Embodiment

<Example of Configuration of Pixel>

Furthermore, although the foregoing description is given taking the configuration that the P+ semiconductor region 73 is surrounded by the N+ semiconductor region 71 in the signal extraction portion 65 as an example, an N+ semiconductor region may be surrounded by a P+ semiconductor region.

Figure 12:
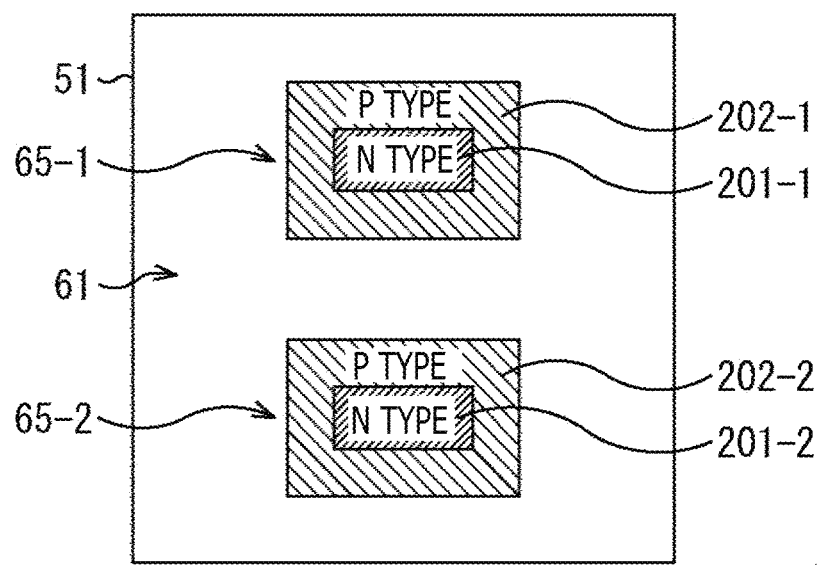
FIG. 12 is a view depicting a different example of a configuration of a portion of the signal extraction portion of the pixel.

In such a case as just described, the pixel 51 is configured, for example, in such a manner as depicted in FIG. 12. Note that, in FIG. 12, portions corresponding to those in the case of FIG. 3 are denoted by like reference signs to those in FIG. 3, and description of them is suitably omitted.

FIG. 12 depicts arrangement of an N+ semiconductor region and a P+ semiconductor region when a portion of the signal extraction portion 65 of the pixel 51 is viewed from a direction perpendicular to the substrate 61.

In this example, an oxide film 64 not depicted is formed at a middle portion of the pixel 51, and a signal extraction portion 65-1 is formed at a rather upper side portion in FIG. 12 from the middle of the pixel 51 while another signal extraction portion 65-2 is formed at a rather lower side portion in FIG. 12 from the middle of the pixel 51. Especially, in this example, the formation position of the signal extraction portion 65 in the pixel 51 is same as that in the case of FIG. 3.

In the signal extraction portion 65-1, an N+ semiconductor region 201-1 of a rectangular shape corresponding to the N+ semiconductor region 71-1 depicted in FIG. 3 is formed at the center of the signal extraction portion 65-1. Furthermore, the N+ semiconductor region 201-1 is surrounded by a P+ semiconductor region 202-1 of a rectangular shape, more particularly, of a rectangular frame shape, corresponding to the P+ semiconductor region 73-1 depicted in FIG. 3. More specifically, the P+ semiconductor region 202-1 is formed so as to surround the N+ semiconductor region 201-1.

Similarly, in the signal extraction portion 65-2, an N+ semiconductor region 201-2 of a rectangular shape corresponding to the N+ semiconductor region 71-2 depicted in FIG. 3 is formed at the center of the signal extraction portion 65-2. Furthermore, the N+semiconductor region 201-2 is surrounded by a P+ semiconductor region 202-2 of a rectangular shape, more particularly, of a rectangular frame shape, corresponding to the P+ semiconductor region 73-2 depicted in FIG. 3.

Note that, in the case where there is no necessity for specifically distinguishing the N+ semiconductor region 201-1 and the N+ semiconductor region 201-2 from each other, each of them is sometimes referred to merely as N+ semiconductor region 201. Furthermore, in the following description, in the case where there is no necessity to specifically distinguishing the P+semiconductor region 202-1 and the P+ semiconductor region 202-2 from each other, each of them is sometimes referred to merely as P+ semiconductor region 202.

Also, in the case where the signal extraction portion 65 is configured in such a manner as depicted in FIG. 12, similarly as in the case of the configuration depicted in FIG. 3, the N+ semiconductor region 201 functions as a charge detection section for detecting the amount of signal carriers, and the P+ semiconductor region 202 functions as a voltage application section for applying a voltage directly to the substrate 61 to generate an electric field.

Modification 1 of Second Embodiment

<Example of Configuration of Pixel>

Furthermore, similarly to the example depicted in FIG. 9, also in the case of such arrangement that the N+ semiconductor region 201 is surrounded by the P+ semiconductor region 202, the shapes of the N+ semiconductor region 201 and the P+ semiconductor region 202 may be any shape.

Figure 13:
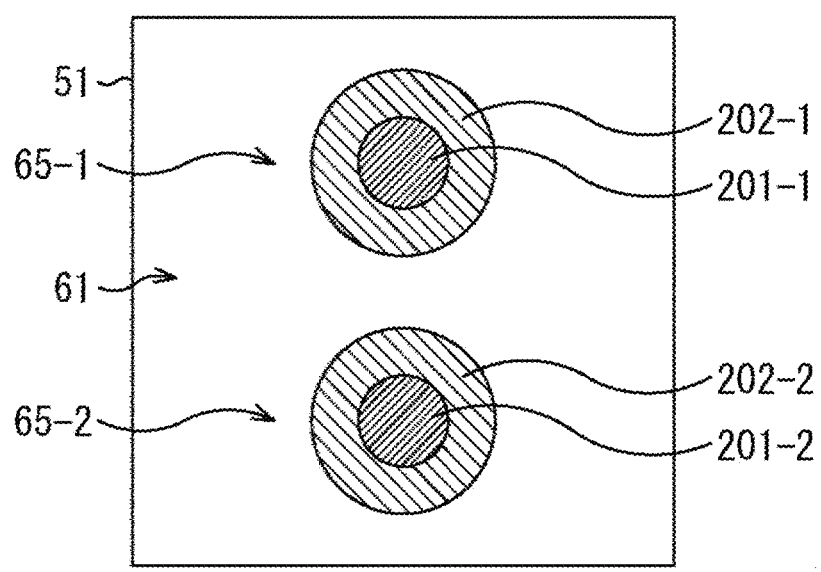
FIG. 13 is a view depicting a different example of a configuration of a portion of the signal extraction portion of the pixel.

More specifically, the N+ semiconductor region 201 and the P+ semiconductor region 202 may be formed in circular shapes, for example, as depicted in FIG. 13. Note that, in FIG. 13, portions corresponding to those in the case of FIG. 12 are denoted by like reference signs to those in FIG. 12, and description of them is suitably omitted.

FIG. 13 depicts an N+ semiconductor region 201 and a P+ semiconductor region 202 when a portion of the signal extraction portion 65 of the pixel 51 is viewed from a direction perpendicular to the substrate 61.

In this example, an oxide film 64 not depicted is formed at a middle portion of the pixel 51, and a signal extraction portion 65 is formed at a portion a rather end side of the pixel 51 from the middle. Especially, in the pixel 51 here, two signal extraction portions 65 are formed.

Furthermore, in each signal extraction portion 65, an N+ semiconductor region 201 of a circular shape is formed at a central position of the signal extraction portion 65, and the N+ semiconductor region 201 is surrounded by the P+ semiconductor region 202 of a circular shape, more particularly, of a ring shape, centered at the N+ semiconductor region 201.

Third Embodiment

<Example of Configuration of Pixel>

Furthermore, the N+ semiconductor region and the P+ semiconductor region formed in the signal extraction portion 65 may have a line shape (oblong shape).

Figure 14:
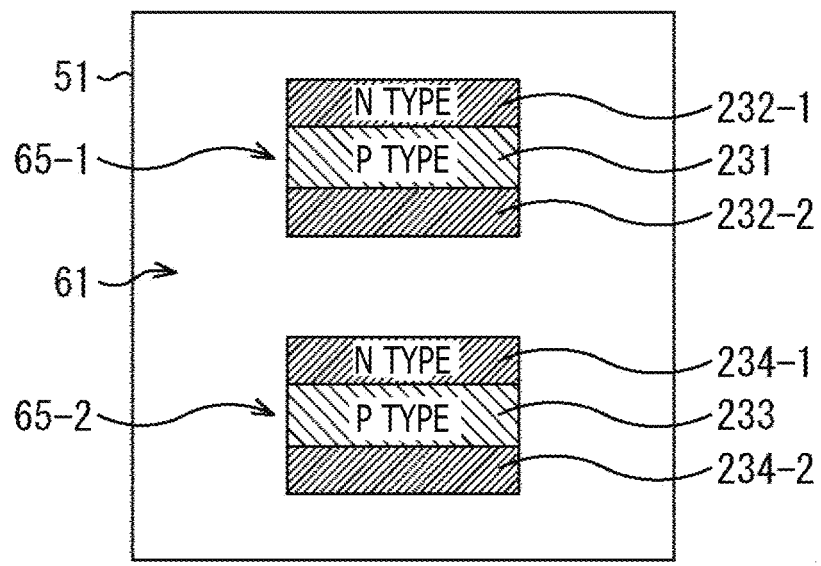
FIG. 14 is a view depicting a different example of a configuration of a portion of the signal extraction portion of the pixel.

In such a case as just described, for example, the pixel 51 is configured in such a manner as depicted in FIG. 14. Note that, in FIG. 14, portions corresponding to those in the case of FIG. 3 are denoted by like reference signs to those in FIG. 3, and description of them is suitably omitted.

FIG. 14 depicts arrangement of an N+ semiconductor region and a P+ semiconductor region when a portion of the signal extraction portion 65 of the pixel 51 is viewed from a direction perpendicular to the substrate 61.

In this example, an oxide film 64 not depicted is formed at a middle portion of the pixel 51, and a signal extraction portion 65-1 is formed at a rather upper side in FIG. 14 from the middle of the pixel 51 while another signal extraction portion 65-2 is formed at a rather lower side portion in FIG. 14 from the middle of the pixel 51. Especially in this example, the formation positions of the signal extraction portions 65 in the pixel 51 are same as those in the case of FIG. 3.

In the signal extraction portion 65-1, a P+ semiconductor region 231 of a line shape corresponding to the P+ semiconductor region 73-1 depicted in FIG. 3 is formed at the center of the signal extraction portion 65-1. In addition, an N+ semiconductor region 232-1 and another N+ semiconductor region 232-2 of line shapes corresponding to the N+ semiconductor region 71-1 depicted in FIG. 3 are formed around the P+ semiconductor region 231 so as to sandwich the P+ semiconductor region 231. More specifically, the P+ semiconductor region 231 is formed at a position sandwiched by the N+ semiconductor region 232-1 and the N+ semiconductor region 232-2.

Note that, in the case where there is no necessity to distinguish the N+ semiconductor region 232-1 and the N+ semiconductor region 232-2 from each other, each of them is sometimes referred to merely as N+ semiconductor region 232.

Although the example depicted in FIG. 3 is configured such that the P+ semiconductor region 73 is surrounded by the N+ semiconductor regions 71, the example depicted in FIG. 14 is structured such that the P+ semiconductor region 231 is sandwiched by the two N+ semiconductor regions 232 provided adjacent each other.

Similarly, in the signal extraction portion 65-2, a P+ semiconductor regions 233 of a line shape corresponding to the P+ semiconductor region 73-2 depicted in FIG. 3 are formed at the center of the signal extraction portion 65-2. In addition, an N+ semiconductor region 234-1 and another N+ semiconductor region 234-2 of line shapes corresponding to the N+ semiconductor region 71-2 depicted in FIG. 3 are formed around the P+ semiconductor regions 233 in such a manner as to sandwich the P+ semiconductor regions 233 therebetween.

Note that, in the case where there is no necessity to distinguish the N+ semiconductor region 234-1 and the N+ semiconductor region 234-2 from each other, each of them is sometimes referred to merely as N+ semiconductor region 234.

In the signal extraction portion 65 of FIG. 14, the P+ semiconductor region 231 and the P+ semiconductor regions 233 function as voltage application portions corresponding to the P+ semiconductor region 73 depicted in FIG. 3, and the N+ semiconductor region 232 and the N+ semiconductor region 234 function as charge detection portions corresponding to the N+ semiconductor region 71 depicted in FIG. 3. In this case, for example, both regions of the N+ semiconductor region 232-1 and the N+ semiconductor region 232-2 are connected to the FD portion A.

Each of the P+ semiconductor regions 231, N+ semiconductor regions 232, P+ semiconductor regions 233 and N+ semiconductor regions 234 having a line shape may have any length in the lateral direction in FIG. 14, and the regions mentioned may not have lengths equal to each other.

Fourth Embodiment

<Example of Configuration of Pixel>

Furthermore, although the example depicted in FIG. 14 is described taking the structure that the P+semiconductor region 231 and the P+ semiconductor regions 233 are sandwiched by the N+ semiconductor regions 232 or the N+ semiconductor regions 234 as an example, conversely the N+ semiconductor regions may be shaped so as to be sandwiched by the P+ semiconductor regions.

Figure 15:
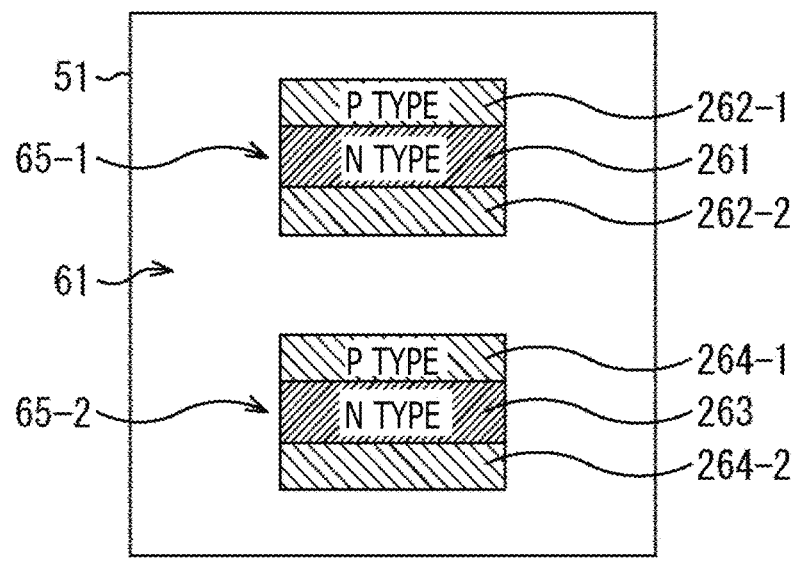
FIG. 15 is a view depicting a different example of a configuration of a portion of the signal extraction portion of the pixel.

In such a case as just described, for example, the pixel 51 is configured in such a manner as depicted in FIG. 15. Note that, in FIG. 15, portions corresponding to those in the case of FIG. 3 are denoted by like reference signs to those in FIG. 3, and description of them is suitably omitted.

FIG. 15 depicts arrangement of an N+ semiconductor region and a P+ semiconductor region when a portion of the signal extraction portion 65 at the pixel 51 is viewed from a direction perpendicular to the substrate 61.

In this example, an oxide film 64 not depicted is formed at a middle portion of the pixel 51, and a signal extraction portion 65 is formed at a rather end side from the middle of the pixel 51. Especially in this example, the formation positions of the two signal extraction portions 65 in the pixel 51 are same as those in the case of FIG. 3.

In the signal extraction portion 65-1, an N+ semiconductor region 261 of a line shape corresponding to the N+ semiconductor region 71-1 depicted in FIG. 3 is formed at the center of the signal extraction portion 65-1. Then, a P+ semiconductor region 262-1 and another P+semiconductor region 262-2 of line shapes corresponding to the P+ semiconductor region 73-1 depicted in FIG. 3 are formed around the N+ semiconductor region 261 so as to sandwich the N+ semiconductor region 261 therebetween. More specifically, the N+ semiconductor region 261 is formed at a position sandwiched between the P+ semiconductor region 262-1 and the P+ semiconductor region 262-2.

Note that, in the case where there is no necessity to distinguish the P+ semiconductor region 262-1 and the P+ semiconductor region 262-2 from each other, each of them is sometimes referred to merely as P+ semiconductor region 262.

Similarly, in the signal extraction portion 65-2, an N+ semiconductor region 263 of a line shape corresponding to the N+ semiconductor region 71-2 depicted in FIG. 3 is formed at the center of the signal extraction portion 65-2. Furthermore, a P+ semiconductor region 264-1 and another P+ semiconductor region 264-2 of line shapes corresponding to the P+ semiconductor region 73-2 depicted in FIG. 3 are formed around the N+ semiconductor region 263 so as to sandwich the N+ semiconductor region 263 therebetween.

Note that, in the case where there is no necessity to distinguish the P+ semiconductor region 264-1 and the P+ semiconductor region 264-2 from each other, each of them is hereinafter referred to sometimes merely as P+ semiconductor region 264.

In the signal extraction portion 65 of FIG. 15, the P+ semiconductor region 262 and the P+ semiconductor region 264 function as voltage application portions corresponding to the P+ semiconductor region 73 depicted in FIG. 3, and the N+ semiconductor region 261 and the N+ semiconductor region 263 function as charge detection portions corresponding to the N+ semiconductor region 71 depicted in FIG. 3. Note that the regions including the N+ semiconductor region 261, P+ semiconductor region 262, N+ semiconductor region 263 and P+ semiconductor region 264 having line shapes may have any length in the transverse direction in FIG. 15, and the lengths of the regions may not be equal to each other.

Fifth Embodiment

<Example of Configuration of Pixel>

Furthermore, although the foregoing description is given of examples in which two signal extraction portions 65 are provided in each of pixels configuring the pixel array section 20, the number of signal extraction sections provided in each pixel may otherwise be one or be three or more.

Figure 16:
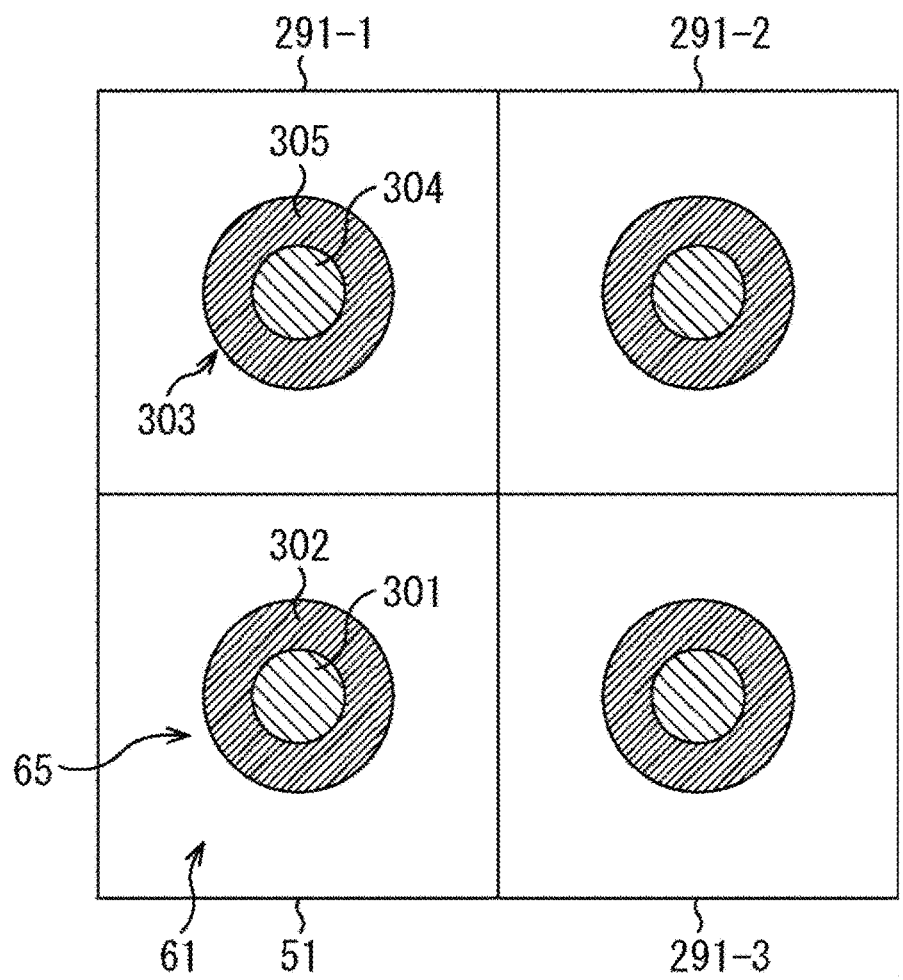
FIG. 16 is a view depicting a different example of a configuration of the pixel.

For example, in the case where one signal extraction portion is provided in the pixel 51, the pixel is configured in such a manner as depicted, for example, in FIG. 16. Note that, in FIG. 16, portions corresponding to those in the case of FIG. 3 are denoted by like reference signs to those in FIG. 3, and description of them is suitably omitted.

FIG. 16 depicts arrangement of an N+ semiconductor region and a P+ semiconductor region when a portion at a signal extraction portion in some pixels provided in the pixel array section 20 is viewed from a direction perpendicular to the substrate.

In this example, a pixel 51 provided in the pixel array section 20 and pixels 291-1 to 291-3 that are pixels 51 neighboring with the pixel 51 but have the different reference signs for identification from the pixel 51, and one signal extraction portion is formed at each pixel.

More specifically, in the pixel 51, one signal extraction portion 65 is formed at a middle portion of the pixel 51. In addition, at the signal extraction portion 65, a circular P+ semiconductor region 301 is formed at a central position, and the P+ semiconductor region 301 is surrounded by an N+ semiconductor region 302 of a circular shape, more particularly, of a ring shape, centered at the P+ semiconductor region 301.

Here, the P+ semiconductor region 301 corresponds to the P+ semiconductor region 73 depicted in FIGS. 3 and functions as a voltage application portion. Furthermore, the N+ semiconductor region 302 corresponds to the N+ semiconductor region 71 depicted in FIG. 3 and functions as a charge detection portion. Note that the P+ semiconductor region 301 and the N+ semiconductor region 302 may have any shape.

Also, the pixels 291-1 to 291-3 around the pixel 51 are structured similarly to the pixel 51.

More specifically, for example, one signal extraction portion 303 is formed at a middle portion of the pixel 291-1. Then, in the signal extraction portion 303, a circular P+ semiconductor region 304 is formed at a central position, and the P+ semiconductor region 304 is surrounded by an N+ semiconductor region 305 of a circular shape, more particularly, of a ring shape, centered at the P+ semiconductor region 304.

The P+ semiconductor region 304 and the N+ semiconductor region 305 correspond to the P+ semiconductor region 301 and the N+ semiconductor region 302, respectively.

Note that, in the case where there is no necessity to distinguish the pixel 291-1 to the pixel 291-3 from each other, each of them is sometimes referred to merely as pixel 291.

In the case where one signal extraction portion (tap) is formed on each pixel in this manner, if it is tried to measure the distance to a target by the indirect ToF method, several pixels neighboring with each other are used and distance information is calculated on the basis of pixel signals obtained from the pixels.

For example, if attention is paid to the pixel 51, then in a state in which the signal extraction portion 65 of the pixel 51 serves as an active tap, the pixels are driven such that the signal extraction portions 303 of several pixels 291 neighboring with the pixel 51 serve as inactive taps.

As an example, for example, the signal extraction portions of the pixels neighboring upwardly, downwardly, leftwardly or rightwardly with the pixel 51 in FIG. 16 such as the pixel 291-1 or the pixel 291-3 are driven so as to serve as inactive taps.

Thereafter, if the voltage to be applied is changed over such that the signal extraction portion 65 of the pixel 51 serves as an inactive tap, then the signal extraction portions 303 of the several pixels 291 neighboring with the pixel 51 including the pixel 291-1 now are caused to serve as active taps.

Then, distance information is calculated on the basis of pixel signals read out from the signal extraction portions 65 in a state in which the signal extraction portions 65 serve as active taps and pixel signals read out from the signal extraction portions 303 in a state in which the signal extraction portions 303 serve as active taps.

Also, in the case where the number of signal extraction portions (taps) to be provided in a pixel in this manner is 1, distance measurement can be performed by the indirect ToF method using pixels neighboring with each other.

Sixth Embodiment

<Example of Configuration of Pixel>

Meanwhile, three or more signal extraction portions (taps) may be provided in each pixel as described hereinabove.

Figure 17:
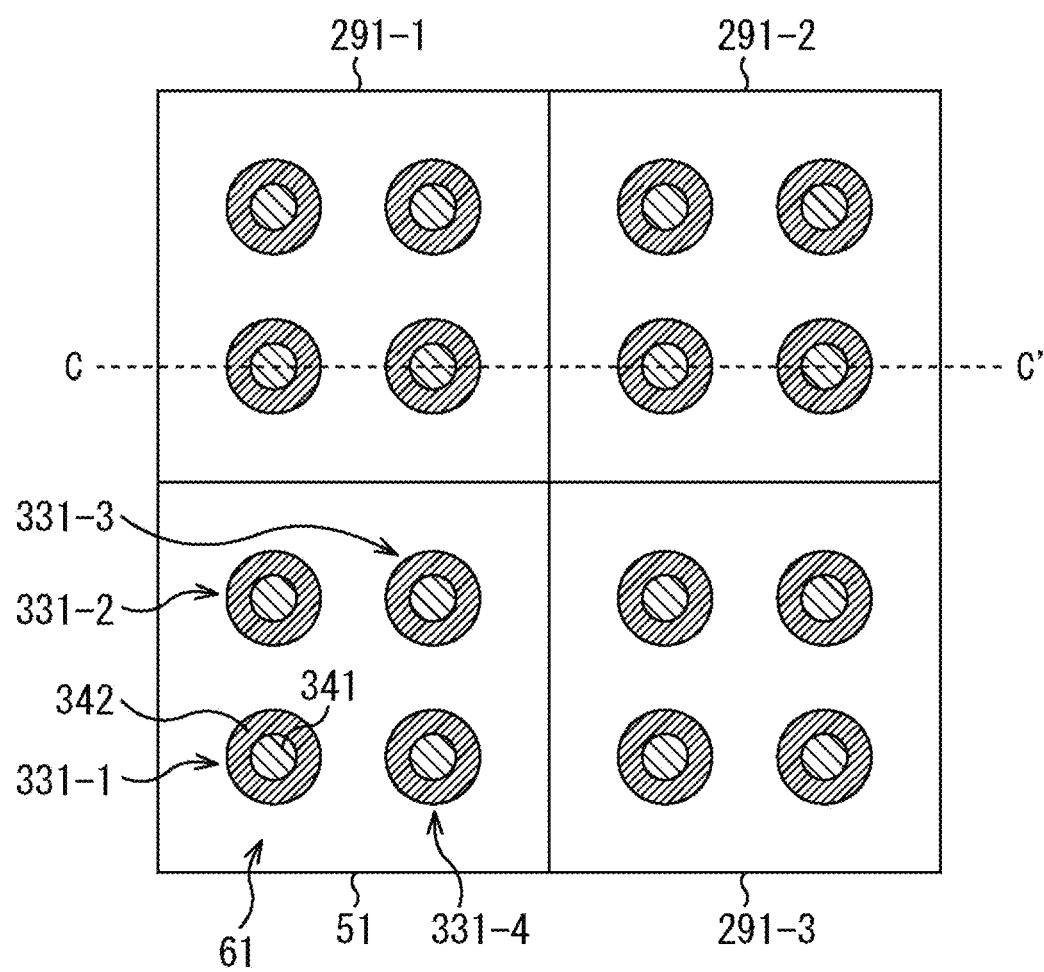
FIG. 17 is a view depicting a different example of a configuration of the pixel.

For example, in the case where four signal extraction portions (taps) are provided, each pixel of the pixel array section 20 is configured in such a manner as depicted in FIG. 17. Note that, in FIG. 17, portions corresponding to those in the case of FIG. 16 are denoted by like reference signs to those in FIG. 16, and description of them is suitably omitted.

FIG. 17 depicts arrangement of an N+ semiconductor region and a P+ semiconductor region when a portion at a signal extraction portion of some pixels provided in the pixel array section 20 is viewed in a direction perpendicular to the substrate.

A sectional view taken along line C-C' depicted in FIG. 17 is such as FIG. 36 hereinafter described.

In this example, a pixel 51 and pixels 291 provided in the pixel array section 20 are depicted, and four signal extraction portions are formed at each of the pixels.

More specifically, in the pixel 51, a signal extraction portion 331-1, another signal extraction portion 331-2, a further signal extraction portion 331-3 and a still further signal extraction portion 331-4 are formed at positions between the middle of the pixel 51 and end portions of the pixel 51, more specifically, at a left lower side position, a left upper side position, a right upper side position and a right lower side position in FIG. 17 in the middle of the pixel 51, respectively.

The signal extraction portion 331-1 to the signal extraction portion 331-4 correspond to the signal extraction portion 65 depicted in FIG. 16.

For example, at the signal extraction portion 331-1, a circular P+ semiconductor region 341 is formed at a central position and is surrounded by an N+ semiconductor region 342 of a circular shape, more particularly, of a ring shape, centered at the P+ semiconductor region 341.

Here, the P+ semiconductor region 341 corresponds to the P+ semiconductor region 301 depicted in FIG. 16 and functions as a voltage application portion. Furthermore, the N+ semiconductor region 342 corresponds to the N+ semiconductor region 302 depicted in FIG. 16 and functions as a charge detection portion. Note that the P+ semiconductor region 341 and the N+ semiconductor region 342 may have any shape.

Also, the signal extraction portion 331-2 to the signal extraction portion 331-4 are configured similarly to the signal extraction portion 331-1 and individually have a P+ semiconductor region that functions as a voltage application portion and an N+ semiconductor region that functions as a charge detection portion. Furthermore, the pixels 291 formed around the pixel 51 are structured similarly to the pixel 51.

Note that, in the case where there is no necessity to distinguish the signal extraction portion 331-1 to the signal extraction portion 331-4 from one another in the following description, each of them is sometimes referred to merely as signal extraction portion 331.

In the case where four signal extraction portions are provided in each pixel in this manner, upon distance measurement, for example, by the indirect ToF method, the four signal extraction portions in the pixel are used to calculate distance information.

If attention is paid to the pixel 51 as an example, then the pixel 51 is driven such that, in a state in which, for example, the signal extraction portion 331-1 and the signal extraction portion 331-3 serve as active taps, the signal extraction portion 331-2 and the signal extraction portion 331-4 serve as inactive taps.

Thereafter, the voltage to be applied to each signal extraction portion 331 is changed over. More specifically, the pixel 51 is driven such that the signal extraction portion 331-1 and the signal extraction portion 331-3 serve as inactive taps and the signal extraction portion 331-2 and the signal extraction portion 331-4 serve as active taps.

Then, distance information is calculated on the basis of pixel signals read out from the signal extraction portion 331-1 and the signal extraction portion 331-3 that are in a state in which the signal extraction portion 331-1 and the signal extraction portion 331-3 serve as active taps and pixel signals read out from the signal extraction portion 331-2 and the signal extraction portion 331-4 that are in a state in which the signal extraction portion 331-2 and the signal extraction portion 331-4 serve as active taps.

Seventh Embodiment

<Example of Configuration of Pixel>

Furthermore, a signal extraction portion (tap) may be shared by pixels neighboring with each other in the pixel array section 20.

Figure 18:
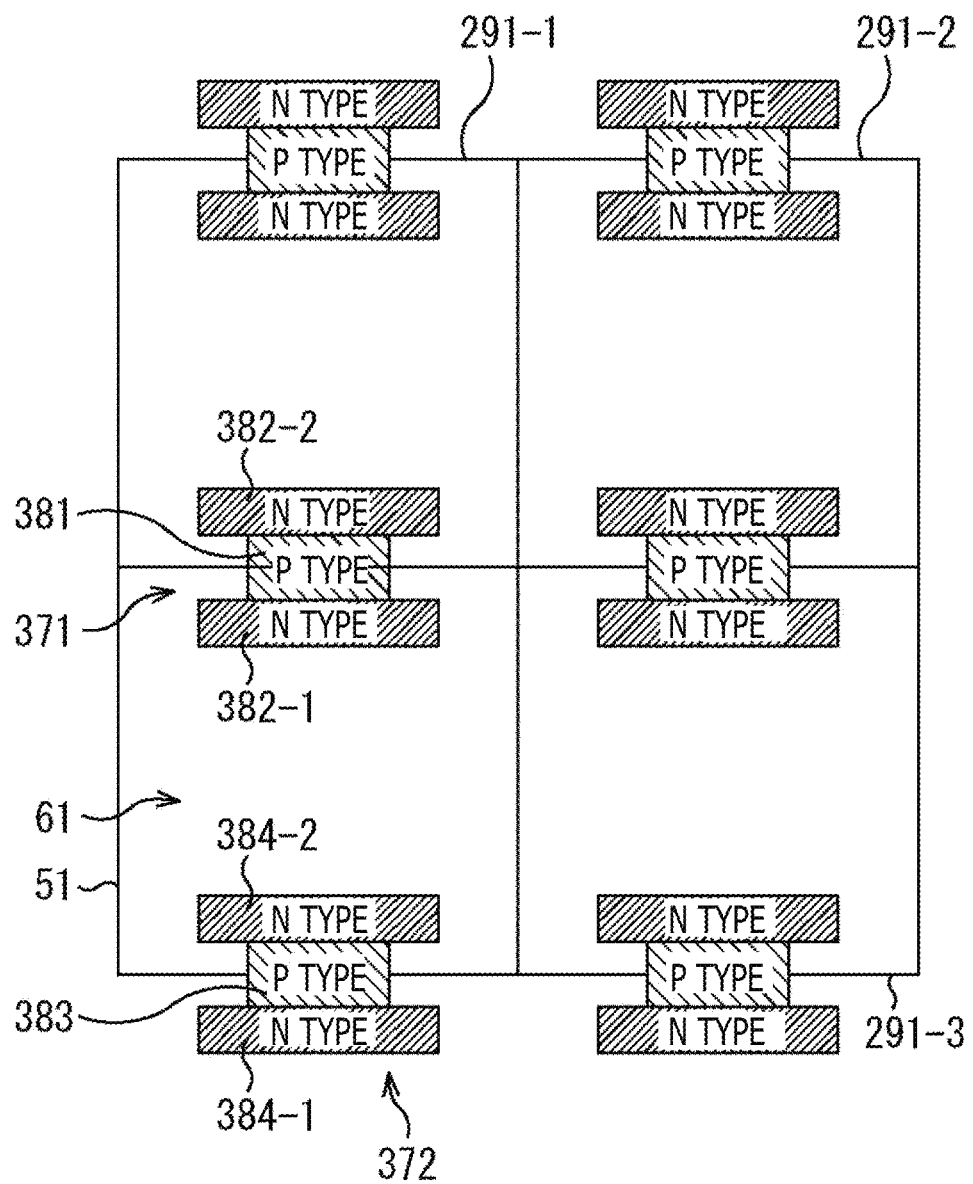
FIG. 18 is a view depicting a different example of a configuration of the pixel.

In such a case as just described, each pixel of the pixel array section 20 is configured, for example, in such a manner as depicted in FIG. 18. Note that, in FIG. 18, portions corresponding to those in the case of FIG. 16 are denoted by like reference signs to those in FIG. 16, and description of them is suitably omitted.

FIG. 18 indicates arrangement of an N+ semiconductor region and a P+ semiconductor region when a portion at a signal extraction portion of some pixels provided in the pixel array section 20 is a viewed from a direction perpendicular to the substrate.

In this example, a pixel 51 and pixels 291 provided in the pixel array section 20 are depicted, and two signal extraction portions are formed on each of the pixels.

For example, in the pixel 51, a signal extraction portion 371 is formed at an upper side end portion in FIG. 18 of the pixel 51, and another signal extraction portion 372 is formed at a lower side end portion in FIG. 18 of the pixel 51.

The signal extraction portion 371 is shared by the pixel 51 and the pixel 291-1. In short, the signal extraction portion 371 is used also as a tap of the pixel 51 and is used also as a tap of the pixel 291-1. Furthermore, the signal extraction portion 372 is shared by the pixel 51 and a pixel not depicted neighboring on the lower side in FIG. 18 with the pixel 51.

In the signal extraction portion 371, a P+ semiconductor region 381 of a line shape corresponding to the P+ semiconductor region 231 depicted in FIG. 14 is formed at the center position. Furthermore, at upper and lower positions in FIG. 18 of the P+ semiconductor region 381, an N+ semiconductor region 382-1 and another N+ semiconductor region 382-2 of line shapes corresponding to the N+ semiconductor region 232 depicted in FIG. 14 are formed so as to sandwich the P+ semiconductor region 381 therebetween.

Especially, in the present example, the P+ semiconductor region 381 is formed at a boundary portion between the pixel 51 and the pixel 291-1. Meanwhile, the N+ semiconductor region 382-1 is formed in the region of the pixel 51 and the N+ semiconductor region 382-2 is formed in the region of the pixel 291-1.

Here, the P+ semiconductor region 381 functions as a voltage application portion, and the N+ semiconductor region 382-1 and the N+ semiconductor region 382-2 function as charge detection portions. Note that, in the case where there is no necessity to distinguish the N+semiconductor region 382-1 and the N+ semiconductor region 382-2 from each other, each of them is sometimes referred to merely as N+ semiconductor region 382.

Furthermore, the P+ semiconductor regions 381 and the N+ semiconductor regions 382 may be formed in any shape. Furthermore, the N+ semiconductor region 382-1 and the N+ semiconductor region 382-2 may be connected to the same FD portion or may be connected to FD portions different from each other.

In the signal extraction portion 372, a P+ semiconductor region 383, an N+ semiconductor region 384-1 and another N+ semiconductor region 384-2 of line shapes are formed.

The P+ semiconductor region 383, N+ semiconductor region 384-1 and N+ semiconductor region 384-2 correspond to the P+ semiconductor region 381, N+ semiconductor region 382-1 and N+ semiconductor region 382-2, respectively, and have similar arrangement shape and function. Note that, in the case where there is no necessity to distinguish the N+ semiconductor region 384-1 and the N+ semiconductor region 384-2 from each other, each of them is sometimes referred to merely as N+ semiconductor region 384.

In this manner, also in the case where a signal extraction portion (tap) is shared by neighboring pixels, distance measurement by the indirect ToF method can be performed by operation similar to that in the example depicted in FIG. 3.

In the case where a signal extraction portion is shared between neighboring pixels as depicted in FIG. 18, the distance between P+ semiconductor regions paired with each other for generating an electric field, more specifically, electric current such as, for example, the distance between the P+ semiconductor region 381 and the P+ semiconductor region 383 becomes long. More specifically, where a signal extraction portion is shared between pixels, the distance between P+ semiconductor regions can be increased to the utmost.

Since this makes it difficult for current to flow between the P+ semiconductor regions, the power consumption of the pixels can be reduced and the configuration is advantageous also in miniaturization of pixels.

Note that, although an example in which one signal extraction portion is shared by two pixels neighboring with each other is described here, one signal extraction portion may otherwise be shared by three or more pixels neighboring with each other. Furthermore, in the case where a signal extraction portion is shared by two or more pixels neighboring with each other, only a charge detection portion for detecting a signal carrier from within the signal extraction portion may be shared or only a voltage application portion for generating an electric field may be shared.

Eighth Embodiment

<Example of Configuration of Pixel>

Furthermore, an on-chip lens or an inter-pixel shading portion provided in each pixel such as the pixel 51 of the pixel array section 20 may not specifically be provided.

Figure 19:
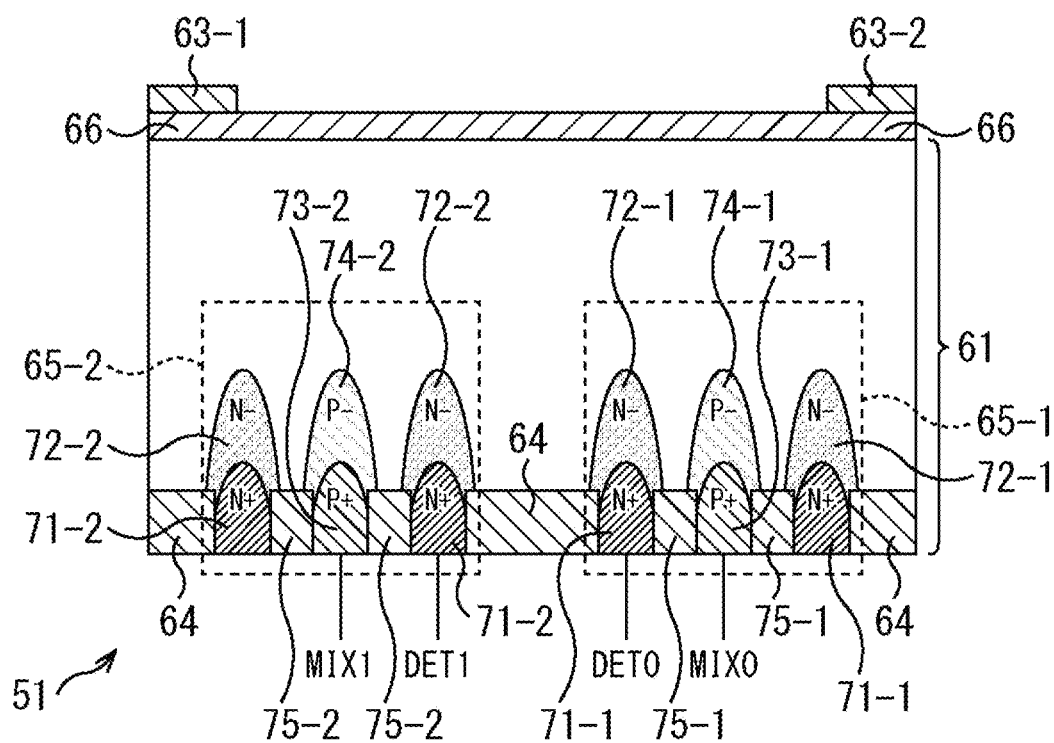
FIG. 19 is a view depicting a different example of a configuration of the pixel.

More specifically, for example, the pixel 51 can be configured in such a manner as depicted in FIG. 19. Note that, in FIG. 19, portions corresponding to those in the case of FIG. 2 are denoted by like reference signs to those in FIG. 2, and description of them is suitably omitted.

The configuration of the pixel 51 depicted in FIG. 19 is different from the pixel 51 depicted in FIG. 2 in that the on-chip lens 62 is not provided but is same as the configuration of the pixel 51 of FIG. 2 in regard to the other matters.

Since the pixel 51 depicted in FIG. 19 does not include an on-chip lens 62 provided on the light indent face side of the substrate 61, attenuation of infrared light incident from the outside to the substrate 61 can be reduced further. As a consequence, the light amount of infrared light that can be received by the substrate 61 increases, and the sensitivity of the pixel 51 can be improved.

Modification 1 of Eighth Embodiment

<Example of Configuration of Pixel>

Figure 20:
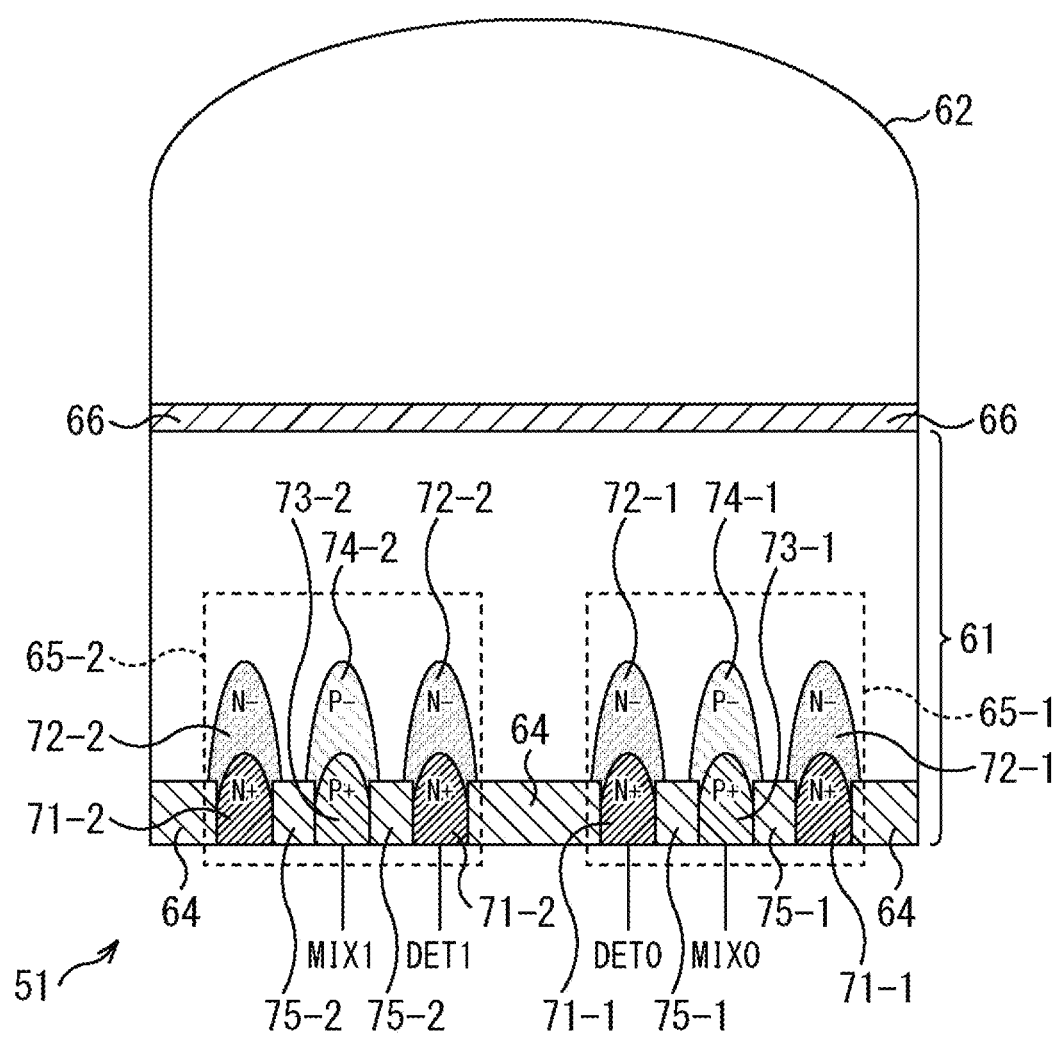
FIG. 20 is a view depicting a different example of a configuration of the pixel.

Furthermore, the pixel 51 may be configured, for example, in such a manner as depicted in FIG. 20. Note that, in FIG. 20, portions corresponding to those in the case of FIG. 2 are denoted by like reference signs to those in FIG. 2, and description of them is suitably omitted.

The configuration of the pixel 51 depicted in FIG. 20 is different from the pixel 51 depicted in FIG. 2 in that the inter-pixel shading film 63-1 and the inter-pixel shading film 63-2 are not provided but is same as the configuration of the pixel 51 of FIG. 2 in the other respects.

In the example depicted in FIG. 20, since the inter-pixel shading films 63 are not provided on the light incident face side of the substrate 61, the suppression effect of crosstalk degrades. However, since also infrared light blocked by the inter-pixel shading films 63 is permitted to enter the substrate 61, the sensitivity of the pixel 51 can be improved.

Note that it is also a matter of course that neither the on-chip lens 62 nor the inter-pixel shading films 63 may be provided on the pixel 51.

Modification 2 of Eighth Embodiment

<Example of Configuration of Pixel>

Figure 21:
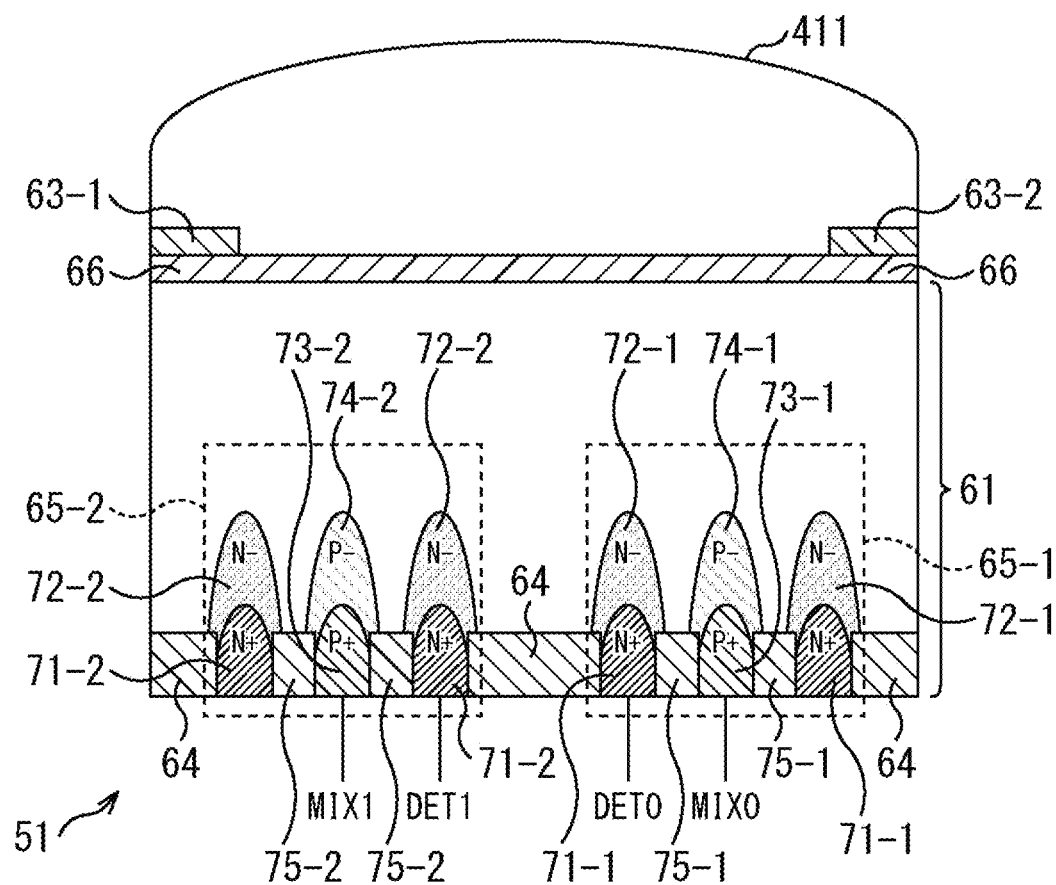
FIG. 21 is a view depicting a different example of a configuration of the pixel.

Furthermore, also the thickness in the optical axis direction of an on-chip lens may be optimized, for example, as depicted in FIG. 21. Note that, in FIG. 21, portions corresponding to those in the case of FIG. 2 are denoted by like reference signs to those in FIG. 2, and description of them is suitably omitted.

The configuration of the pixel 51 depicted in FIG. 21 is different from that of the pixel 51 depicted in FIG. 2 in that an on-chip lens 411 is provided in place of the on-chip lens 62 but is same as the configuration of the pixel 51 of FIG. 2 in the other respects.

In the pixel 51 depicted in FIG. 21, the on-chip lens 411 is formed on the light incident face side, more specifically, on the upper side in FIG. 21, of the substrate 61. This on-chip lens 411 is reduced in thickness in the optical axis direction, more specifically, in the vertical direction in FIG. 21, in comparison with the on-chip lens 62 depicted in FIG. 2.

Generally, that the on-chip lens to be provided on the front face of the substrate 61 is thicker is advantages for condensing of light incident to the on-chip lens. However, since reduction of the thickness of the on-chip lens 411 increases the transmittance as much and can improve the sensitivity of the pixel 51, it is better to appropriately determine the thickness of the on-chip lens 411 in response to the thickness of the substrate 61, the position to which infrared light is to be condensed and so forth.

Ninth Embodiment

<Example of Configuration of Pixel>

Furthermore, a separation region for improving the separation characteristic between neighboring pixels to suppress crosstalk may be provided between pixels formed on the pixel array section 20.

Figure 22:
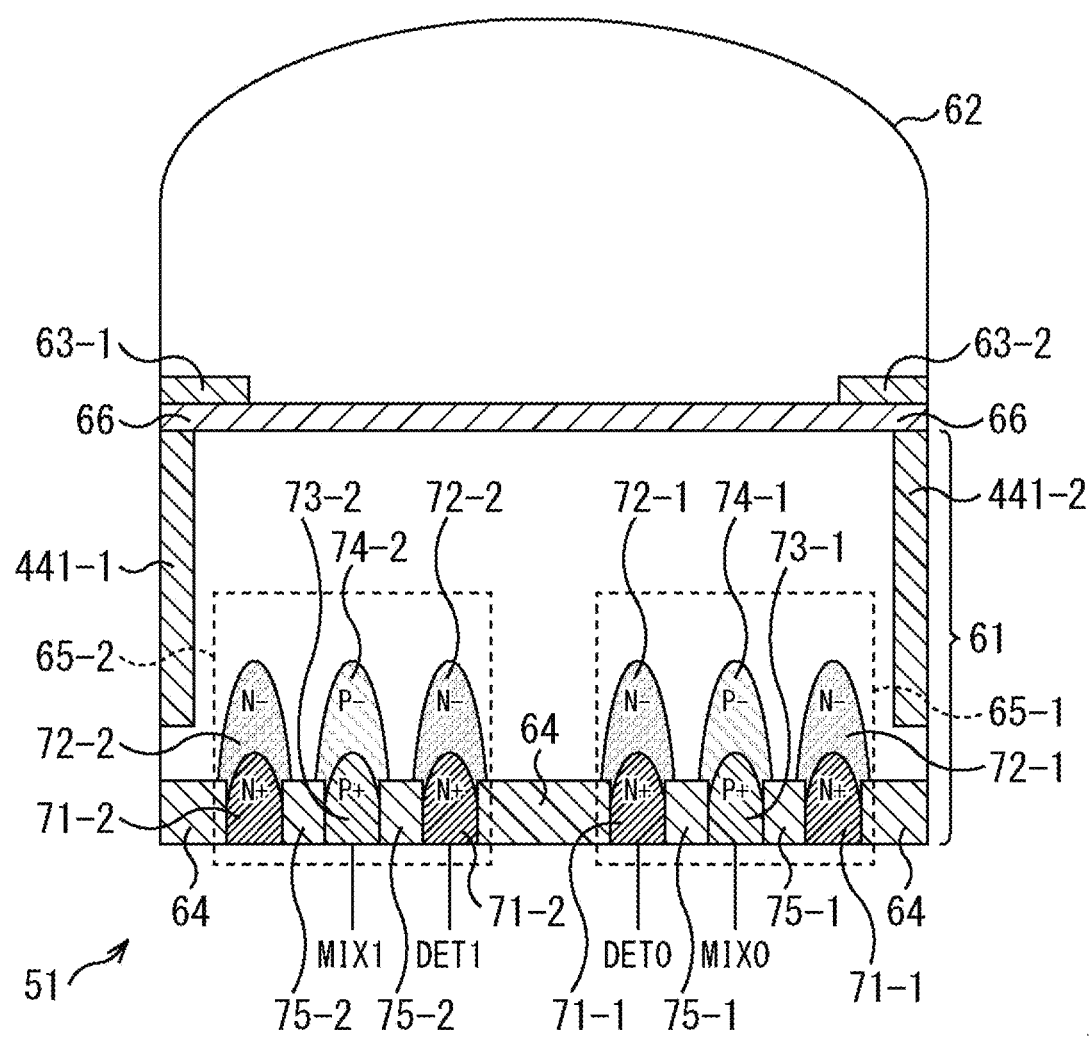
FIG. 22 is a view depicting a different example of a configuration of the pixel.

In such a case as just described, each pixel 51 is configured, for example, in such a manner as depicted in FIG. 22. Note that, in FIG. 22, portions corresponding to those in the case of FIG. 2 are denoted by like reference signs to those in FIG. 2, and description of them is suitably omitted.

The configuration of the pixel 51 depicted in FIG. 22 is different from the pixel 51 depicted in FIG. 2 in that a separation region 441-1 and another separation region 441-2 are provided in the substrate 61 but has a configuration same as that of the pixel 51 of FIG. 2 in the other respects.

In the pixel 51 depicted in FIG. 22, the separation region 441-1 and the separation region 441-2 for separating neighboring pixels from each other are formed each from a shading film or the like at a boundary portion between the pixel 51 in the substrate 61 and a different pixel neighboring with the pixel 51, more specifically, at left and right end portions in FIG. 22 of the pixel 51. Note that, in the case where there is no necessity to distinguish the separation region 441-1 and the separation region 441-2 from each other, each of them is sometimes referred to merely as separation region 441.

For example, at the time of formation of a separation region 441, a long groove (trench) is formed with a predetermined depth in the downward direction in FIG. 22 (direction perpendicular to the plane of the substrate 61) from the light incident face side of the substrate 61, more specifically, from the upper side face in FIG. 22 in the substrate 61, and a shading film is formed by embedding in the groove portion to form a separation region 441. This separation region 441 functions as a pixel separation region for shading infrared light that is incident to the substrate 61 from the light incident face and is directed toward a different pixel neighboring with the pixel 51.

By forming the separation region 441 of the embedded type in this manner, the separation characteristic of infrared light between pixels can be improved and occurrence of crosstalk can be suppressed.

Modification 1 of Ninth Embodiment

<Example of Configuration of Pixel>

Figure 23:
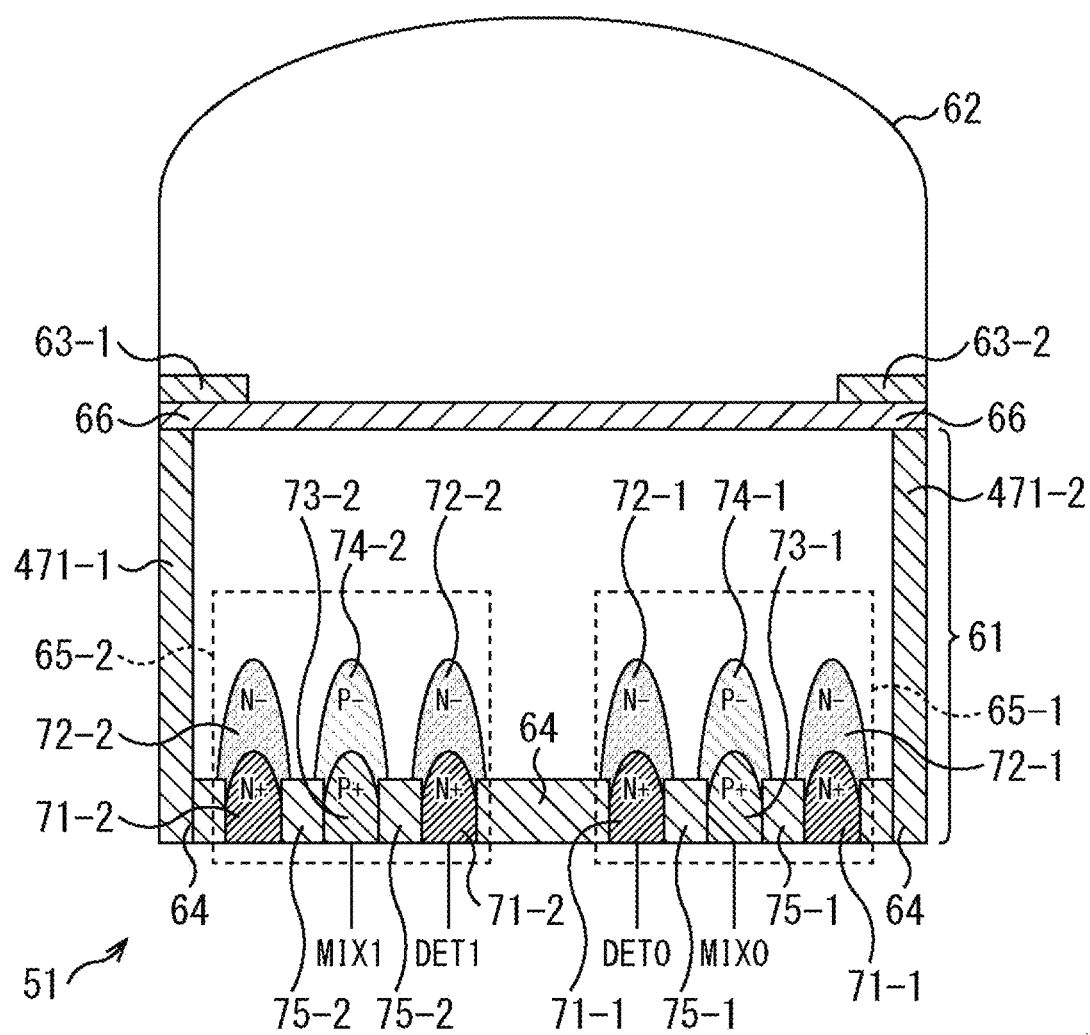
FIG. 23 is a view depicting a different example of a configuration of the pixel.

Furthermore, in the case where a separation region of the embedded type is formed on the pixel 51, a separation region 471-1 and another separation region 471-2 that extend through the substrate 61 as depicted, for example, in FIG. 23 may be provided. Note that, in FIG. 23, portions corresponding to those in the case of FIG. 2 are denoted by like reference signs to those in FIG. 2, and description of them is suitably omitted.

The configuration of the pixel 51 depicted in FIG. 23 is different from the pixel 51 depicted in FIG. 2 in that the separation region 471-1 and the separation region 471-2 are provided in the substrate 61, but is same in configuration as the pixel 51 of FIG. 2 in regard to the other respects. More specifically, the pixel 51 depicted in FIG. 23 is configured such that the separation region 471-1 and the separation region 471-2 are provided in place of the separation region 441 of the pixel 51 depicted in FIG. 22.

In the pixel 51 depicted in FIG. 23, the separation region 471-1 and the separation region 471-2 extending through the substrate 61 are formed each from a shading film or the like at a boundary portion between the pixel 51 in the substrate 61 and different pixels neighboring with the pixel 51, more specifically, at left and right end portions in FIG. 23 of the pixel 51. Note that, in the case where there is no necessity to distinguish the separation region 471-1 and the separation region 471-2 from each other, each of them is sometimes referred to merely as separation region 471.

For example, at the time of formation of a separation region 471, a groove (trench) long in the upward direction in FIG. 23 includes the face on the opposite side to the light incident face side of the substrate 61, more specifically, from the lower side face in FIG. 23. At this time, such grooves are formed so as to reach the light incident face of the substrate 61 such that they extend through the substrate 61. Then, a shading film is formed by embedding in each of the groove portions formed in this manner to form a separation region 471.

Also, with such separation regions 471 of the embedded type as just described, the separation characteristic of infrared light between pixels can be improved and occurrence of crosstalk can be suppressed.

Tenth Embodiment

<Example of Configuration of Pixel>

Furthermore, the thickness of the substrate on which the signal extraction portion 65 is formed can be determined in response to various characteristics and so forth of the pixels.

Figure 24:
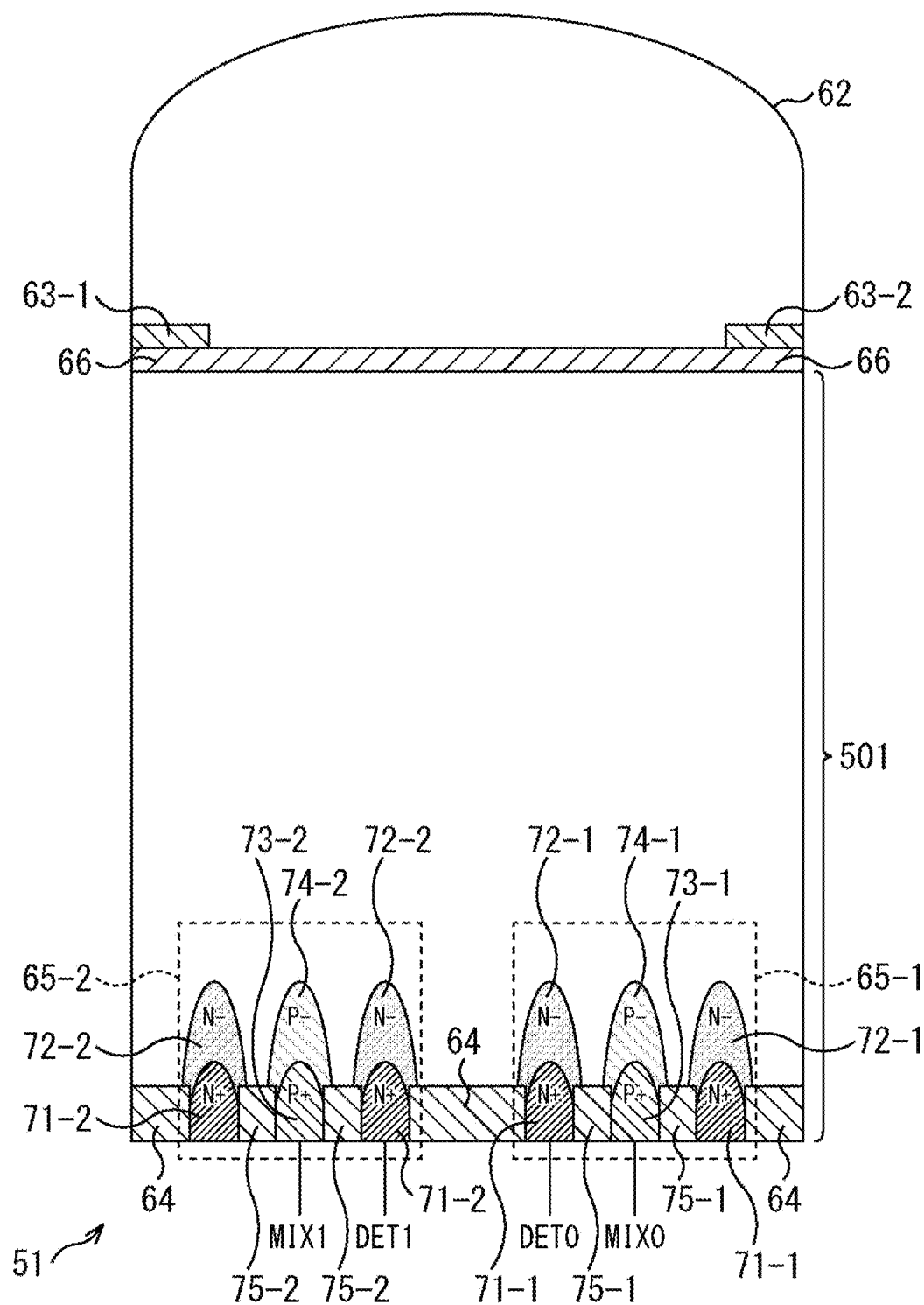
FIG. 24 is a view depicting a different example of a configuration of the pixel.

Therefore, a substrate 501 that configures the pixels 51, for example, as depicted in FIG. 24 can be made thicker than the substrate 61 depicted in FIG. 2. Note that, in FIG. 24, portions corresponding to those in the case of FIG. 2 are denoted by like reference signs to those in FIG. 2, and description of them is suitably omitted.

The configuration of the pixel 51 depicted in FIG. 24 is different from the pixel 51 depicted in FIG. 2 in that the substrate 501 is provided in place of the substrate 61 but is same in configuration as the pixel 51 of FIG. 2 in regard to the other respects.

More specifically, in the pixel 51 depicted in FIG. 24, an on-chip lens 62, a fixed charge film 66 and an inter-pixel shading films 63 are formed on the light incident face side of the substrate 501. Furthermore, in the proximity of the surface of the face on the opposite side to the light incident face side of the substrate 501, an oxide film 64, a signal extraction portion 65 and a separation portion 75 are formed.

The substrate 501 is configured, for example, from a P-type semiconductor substrate of a thickness of 20 μm or more, and the substrate 501 and the substrate 61 are different only in thickness of the substrate while the positions at which the oxide film 64, the signal extraction portion 65 and the separation portion 75 are formed are same between the substrate 501 and the substrate 61.

Note that it is better to optimize also the film thicknesses and so forth of various layers (films) formed suitably on the light incident face side and so forth of the substrate 501 or the substrate 61 in response to the characteristic and so forth of the pixels 51.

Eleventh Embodiment

<Example of Configuration of Pixel>

Figure 25:
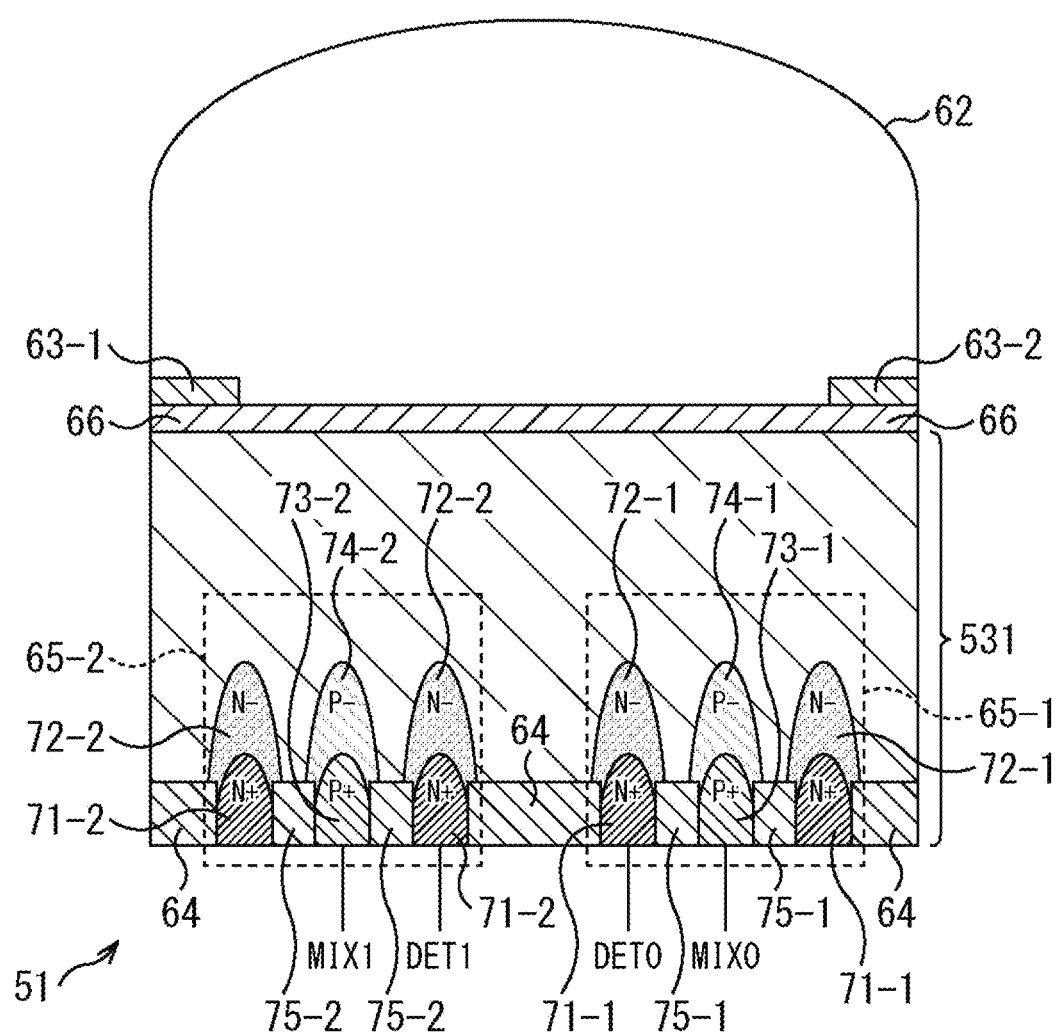
FIG. 25 is a view depicting a different example of a configuration of the pixel.

Furthermore, although the foregoing description is directed to an example in which the substrate configuring the pixels 51 is configured from a P-type semiconductor substrate, the substrate may otherwise be configured from an N-type semiconductor substrate as depicted, for example, in FIG. 25. Note that, in FIG. 25, portions corresponding to those in the case of FIG. 2 are denoted by like reference signs to those in FIG. 2, and description of them is suitably omitted.

The configuration of the pixel 51 depicted in FIG. 25 is different from the pixel 51 depicted in FIG. 2 in that a substrate 531 is provided in place of the substrate 61 but is same as the configuration of the pixel 51 of FIG. 2 in the other respects.

In the pixel 51 depicted in FIG. 25, an on-chip lens 62, a fixed charge film 66 and an inter-pixel shading films 63 are formed on the light incident face side of the substrate 531 that is configured from an N-type semiconductor layer such as, for example, a silicon substrate.

An oxide film 64, a signal extraction portion 65 and a separation portion 75 are formed in the proximity of the surface of the face on the opposite side to the light incident face side of the substrate 531. The positions at which the oxide film 64, the signal extraction portion 65 and the separation portion 75 are formed are same positions between the substrate 531 and the substrate 61, and also the configuration of the signal extraction portion 65 is same between the substrate 531 and the substrate 61.

In the substrate 531, for example, the thickness in the vertical direction in FIG. 25, more specifically, the thickness in a direction perpendicular to the plane of the substrate 531, is 20 μm or less.

Furthermore, the substrate 531 is an N− Epi substrate of a high resistance having a substrate concentration, for example, on the order of 1 E+13 or less, and the resistance (resistivity) of the substrate 531 is, for example, 500 [Ωm] or more. This can reduce the power consumption by the pixel 51.

Here, the relationship between the substrate concentration and the resistance of the substrate 531 is such that, for example, when the substrate concentration is 2.15 E+12 [$cm^3$], the resistance is 2000 [Ωm], when the substrate concentration is 4.30 E+12 [$cm^3$], the resistance is 1000 [Ωm], when the substrate concentration is 8.61 E+12 [$cm^3$], the resistance is 500 [Ωm], when the substrate concentration is 4.32 E+13 [$cm^3$], the resistance is 100 [Ωm], and so forth.

Even if the substrate 531 of the pixel 51 is formed as an N-type semiconductor substrate in this manner, similar advantageous effects can be obtained by operation similar to that of the example depicted in FIG. 2.

Twelfth Embodiment

<Example of Configuration of Pixel>

Furthermore, similarly as in the example described hereinabove with reference to FIG. 24, also the thickness of the N-type semiconductor substrate can be determined in response to various characteristics and so forth of the pixels.

Figure 26:
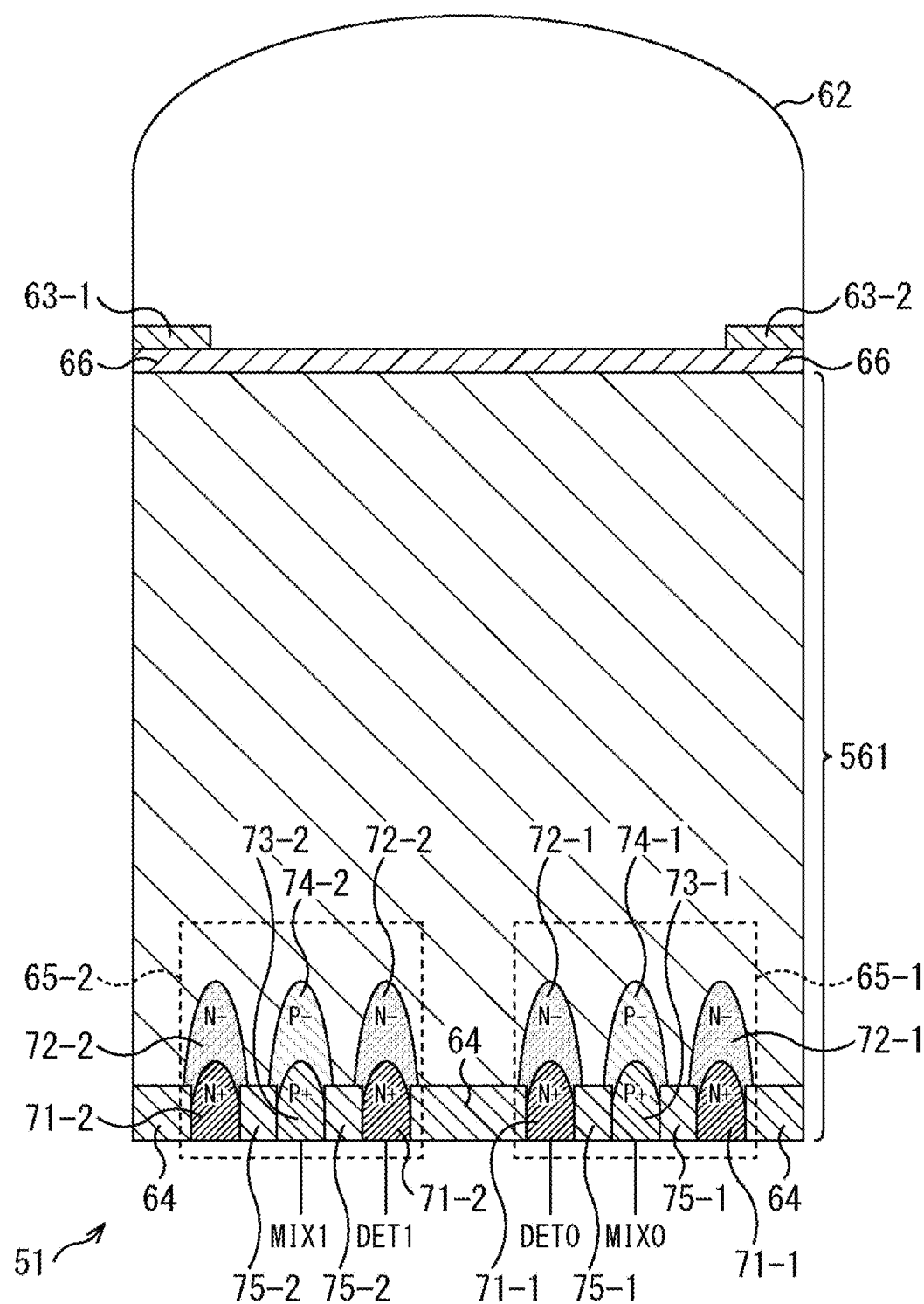
FIG. 26 is a view depicting a different example of a configuration of the pixel.

Therefore, for example, as depicted in FIG. 26, a substrate 561 configuring the pixel 51 can be made thicker than the substrate 531 depicted in FIG. 25. Note that, in FIG. 26, portions corresponding to those in the case of FIG. 25 are denoted by like reference signs to those in FIG. 25, and description of them is suitably omitted.

The configuration of the pixel 51 depicted in FIG. 26 is different from the pixel 51 depicted in FIG. 25 in that the substrate 561 is provided in place of the substrate 531 but is a same configuration as that of the pixel 51 of FIG. 25 in the other respects.

More specifically, in the pixel 51 depicted in FIG. 26, an on-chip lens 62, a fixed charge film 66 and an inter-pixel shading films 63 are formed on the light incident face side of the substrate 561. Furthermore, an oxide film 64, a signal extraction portion 65 and a separation portion 75 are formed in the proximity of the surface of the face on the opposite side to the light incident face side of the substrate 561.

The substrate 561 is configured from an N-type semiconductor substrate of a thickness, for example, equal to or greater than 20 μm, and the substrate 561 and the substrate 531 are different from each other only in substrate thickness while the positions at which the oxide film 64, signal extraction portion 65 and separation portion 75 are formed are same positions between the substrate 561 and the substrate 531.

Thirteenth Embodiment

<Example of Configuration of Pixel>

Furthermore, for example, a bias may be applied to the light incident face side of the substrate 61 to strengthen the electric field in a direction (hereinafter referred to as Z direction) perpendicular to the plane of the substrate 61 in the substrate 61.

Figure 27:
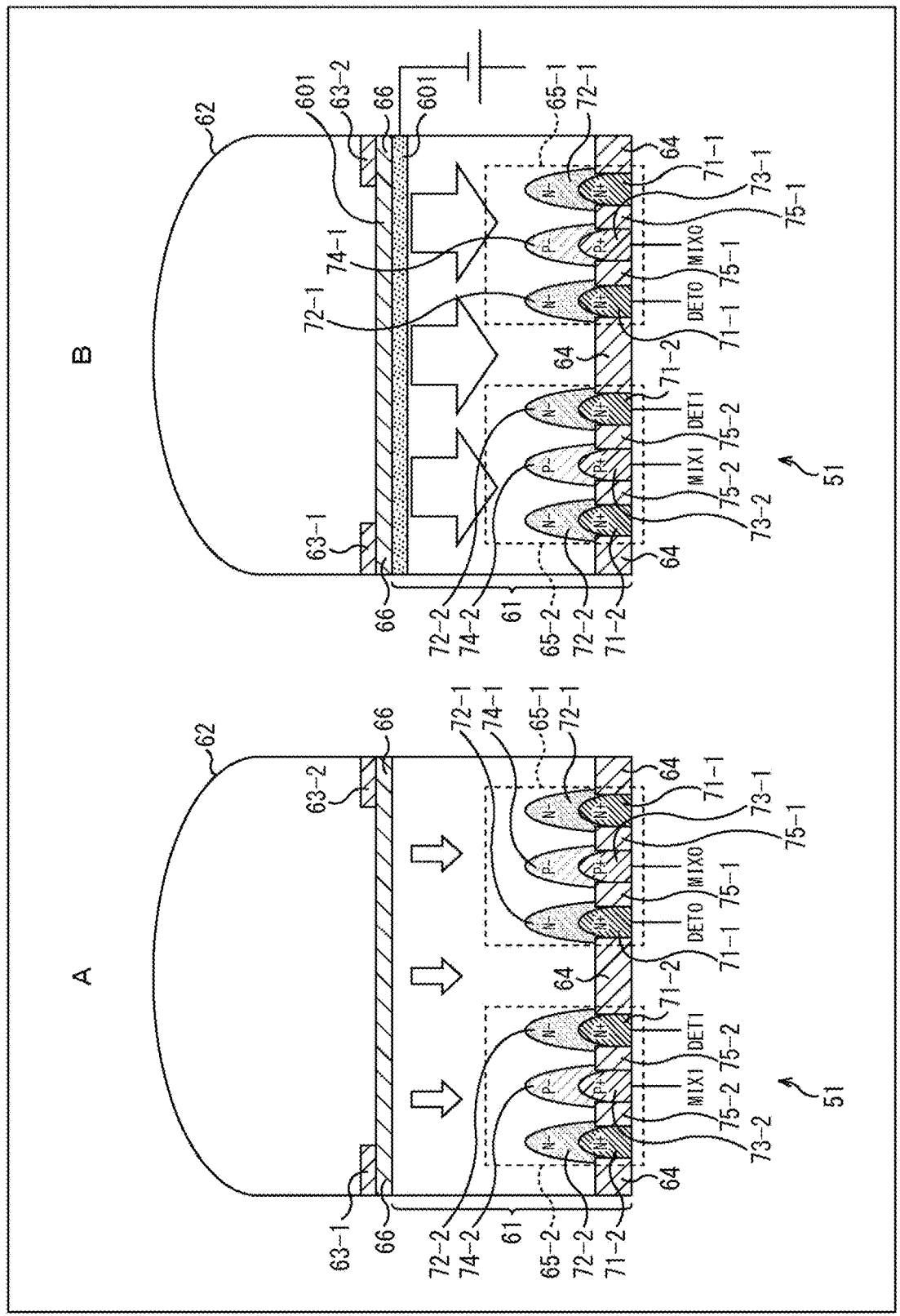
FIG. 27 is a view depicting a different example of a configuration of the pixel.

In such a case as just described, the pixel 51 is configured, for example, in such a manner as depicted in FIG. 27. Note that, in FIG. 27, portions corresponding to those in the case of FIG. 2 are denoted by like reference signs to those in FIG. 2, and description of them is suitably omitted.

A of FIG. 27 depicts the pixel 51 depicted in FIG. 2, and an arrow mark in the substrate 61 of the pixel 51 represents an electric field strength in the Z direction in the substrate 61.

In contrast, B of FIG. 27 depicts a configuration of the pixel 51 in the case where a bias (voltage) is applied to the light incident face of the substrate 61. Although the configuration of the pixel 51 in B of FIG. 27 is a basically same configuration as that of the pixel 51 depicted in FIG. 2, a P+ semiconductor region 601 is newly and additionally formed on a light incident face side interface of the substrate 61.

By applying a voltage (negative bias) of 0 V or less from the inside or the outside of the pixel array section 20 to the P+ semiconductor region 601 formed on the light incident face side interface of the substrate 61, the electric field in the Z direction is strengthened. An arrow mark in the substrate 61 of the pixel 51 in B of FIG. 27 represents an electric field strength in the Z direction in the substrate 61. The thickness of the arrow mark drawn in the substrate 61 in B of FIG. 27 is greater than that of the arrow mark in the pixel 51 in A of FIG. 27 and the electric field in the Z direction is strengthened further. By applying a negative bias to the P+ semiconductor region 601 formed on the light incident face side of the substrate 61 in this manner, the electric field in the Z direction can be strengthened and the extraction efficiency of electrons by the signal extraction portion 65 can be improved.

Note that the configuration for applying a voltage to the light incident face side of the substrate 61 is not limited to the configuration of provision of the P+semiconductor region 601 but any other configuration may be applied. For example, a transparent electrode film may be formed by stacking between the light incident face of the substrate 61 and the on-chip lens 62 such that a negative bias is applied by applying a voltage to the transparent electrode film.

Fourteenth Embodiment

<Example of Configuration of Pixel>

Furthermore, a reflection member of a large area may be provided on the face on the opposite side to the light incident face of the substrate 61 in order to improve the sensitivity of the pixel 51 to infrared rays.

Figure 28:
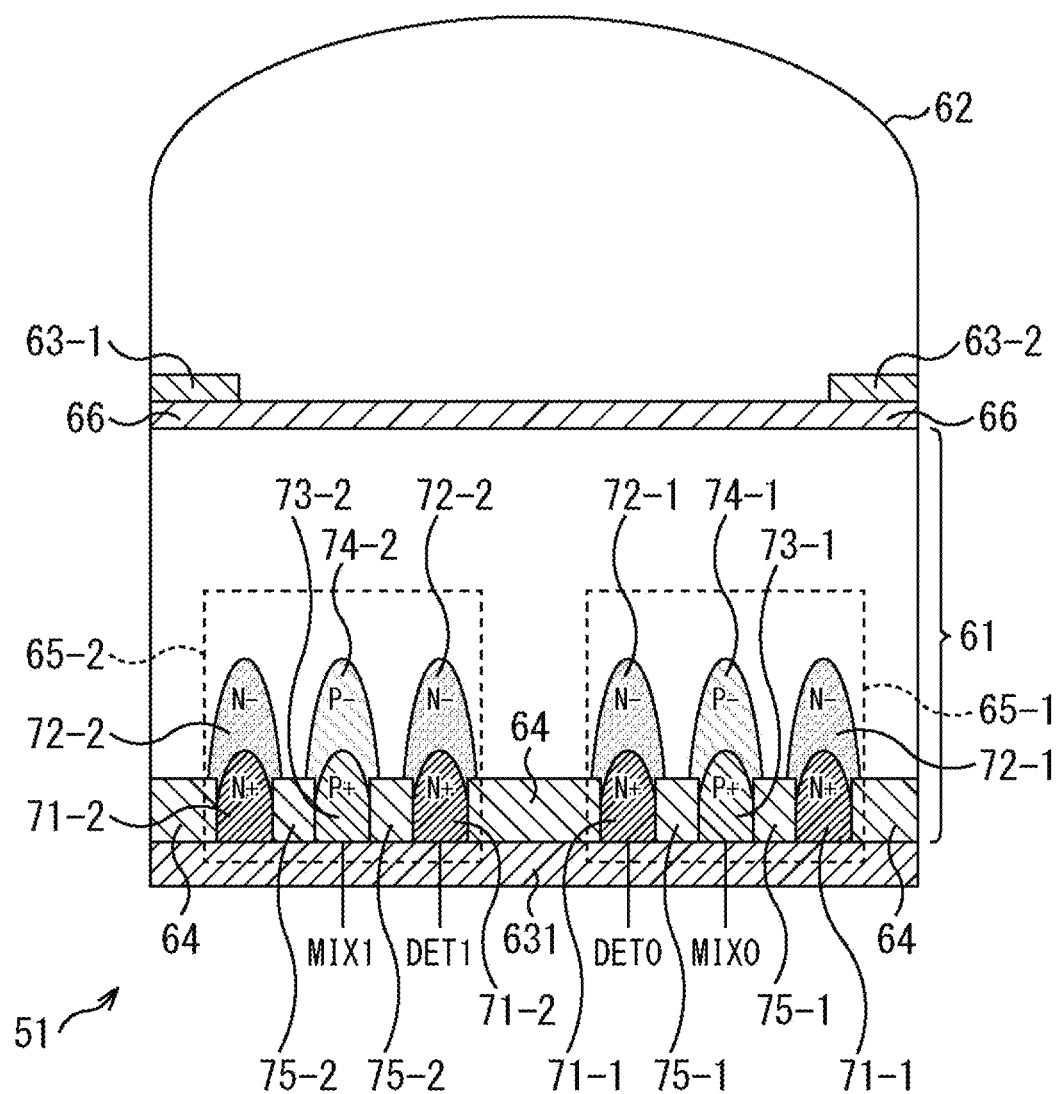
FIG. 28 is a view depicting a different example of a configuration of the pixel.

In such a case as just described, the pixel 51 is configured, for example, in such a manner as depicted in FIG. 28. Note that, in FIG. 28, portions corresponding to those in the case of FIG. 2 are denoted by like reference signs to those in FIG. 2, and description of them is suitably omitted.

The configuration of the pixel 51 depicted in FIG. 28 is different from the pixel 51 of FIG. 2 in that the reflection member 631 is provided on the face on the opposite side to the light incident face of the substrate 61 but is a configuration same as that of the pixel 51 of FIG. 2.

In the example depicted in FIG. 28, a reflection member 631 that reflects infrared light is provided in such a manner as to cover the overall face on the opposite side to the light incident face of the substrate 61.

This reflection member 631 may be any reflection member if the reflectivity of infrared light is high. For example, metal such as copper or aluminum provided in a multilayer wiring layer stacked on the face on the opposite side to the light incident face of the substrate 61 may be used as the reflection member 631, or a reflection structure of a polysilicon film or an oxide film may be formed on the face on the opposite side to the light incident face of the substrate 61 such that it serves as the reflection member 631.

By providing the reflection member 631 on the pixel 51 in this manner, infrared light having been incident to the inside of the substrate 61 from the light incident face through the on-chip lens 62 and having transmitted through the substrate 61 without being photoelectrically converted in the substrate 61 can be reflected by the reflection member 631 such that it is incident again to the inside of the substrate 61. This can further increase the amount of infrared light to be photoelectrically converted in the substrate 61 and improve the quantum efficiency (QE), more specifically, the sensitivity of the pixel 51 to infrared light.

Fifteenth Embodiment

<Example of Configuration of Pixel>

Furthermore, in order to suppress erroneous detection of light by a neighboring pixel, a shading member of a large area may be provided on the face on the opposite side to the light incident face of the substrate 61.

In such a case as just described, the pixel 51 can be configured such that, for example, the reflection member 631 depicted in FIG. 28 can be replaced by the shading member. More specifically, in the pixel 51 depicted in FIG. 28, the reflection member 631 that covers the overall face on the opposite side to the light incident face of the substrate 61 is used as a shading member 631' that shades infrared light. The shading member 631' substitutes the reflection member 631 of the pixel 51 of FIG. 28.

The shading member 631' may be any shading member if the infrared light shading rate thereof is high. For example, metal such as copper or aluminum provided in a multilayer wiring layer stacked on the face on the opposite side to the light incident face of the substrate 61 may be used as the shading member 631', or a shading structure of a polysilicon film or an oxide film may be formed on the face on the opposite side to the light incident face of the substrate 61 such that it serves as the shading member 631'.

By providing the shading member 631' on the pixel 51 in this manner, infrared light having been incident to the inside of the substrate 61 from the light incident face through the on-chip lens 62 and having transmitted through the substrate 61 without being photoelectrically converted in the substrate 61 can be suppressed from being scattered by the wiring layer and entering a neighboring pixel. This can prevent the neighboring pixel from detecting light in error.

Note that the shading member 631' can be caused to serve also as reflection member 631 by configuring the same, for example, from a material containing metal.

Sixteenth Embodiment

<Example of Configuration of Pixel>

Furthermore, a P-well region configured from a P-type semiconductor region may be formed in place of the oxide film 64 in the substrate 61 of the pixel 51.

Figure 29:
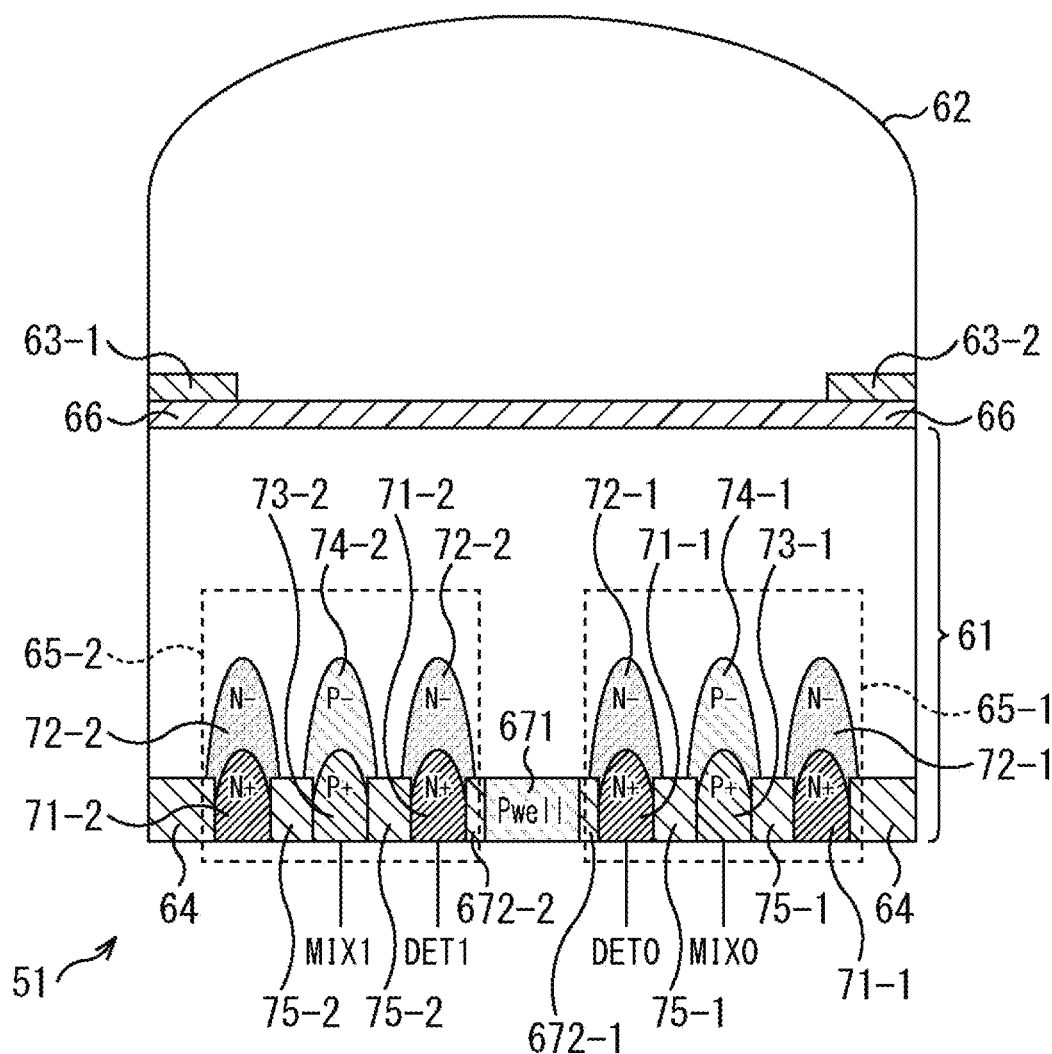
FIG. 29 is a view depicting a different example of a configuration of the pixel.

In such a case as just described, the pixel 51 is configured, for example, in such a manner as depicted in FIG. 29. Note that, in FIG. 29, portions corresponding to those in the case of FIG. 2 are denoted by like reference signs to those in FIG. 2, and description of them is suitably omitted.

The configuration of the pixel 51 depicted in FIG. 29 is different from the pixel 51 depicted in FIG. 2 in that a P well region 671, a separation region 672-1 and another separation region 672-2 are provided in place of the oxide film 64, but is same as the structure of the pixel 51 depicted in FIG. 2 in the other respects.

In the example depicted in FIG. 29, the P well region 671 configured from a P-type semiconductor region is formed at a middle portion on the inner side of the face side opposite to the light incident face, more specifically, of the face on the lower side in FIG. 29, in the substrate 61. Furthermore, between the P well region 671 and the N+ semiconductor region 71-1, the separation region 672-1 for separating the regions from each other includes an oxide film or the like. Similarly, also between the P well region 671 and the N+ semiconductor region 71-2, the separation region 672-2 for separating the regions from each other includes an oxide film or the like. In the pixel 51 depicted in FIG. 29, the P− semiconductor region 74 has a region greater in the upward direction in FIG. 29 than the N-semiconductor region 72.

Seventeenth Embodiment

<Example of Configuration of Pixel>

Furthermore, a P-well region configured from a P-type semiconductor region may be provided in addition to the oxide film 64 in the substrate 61 of the pixel 51.

Figure 30:
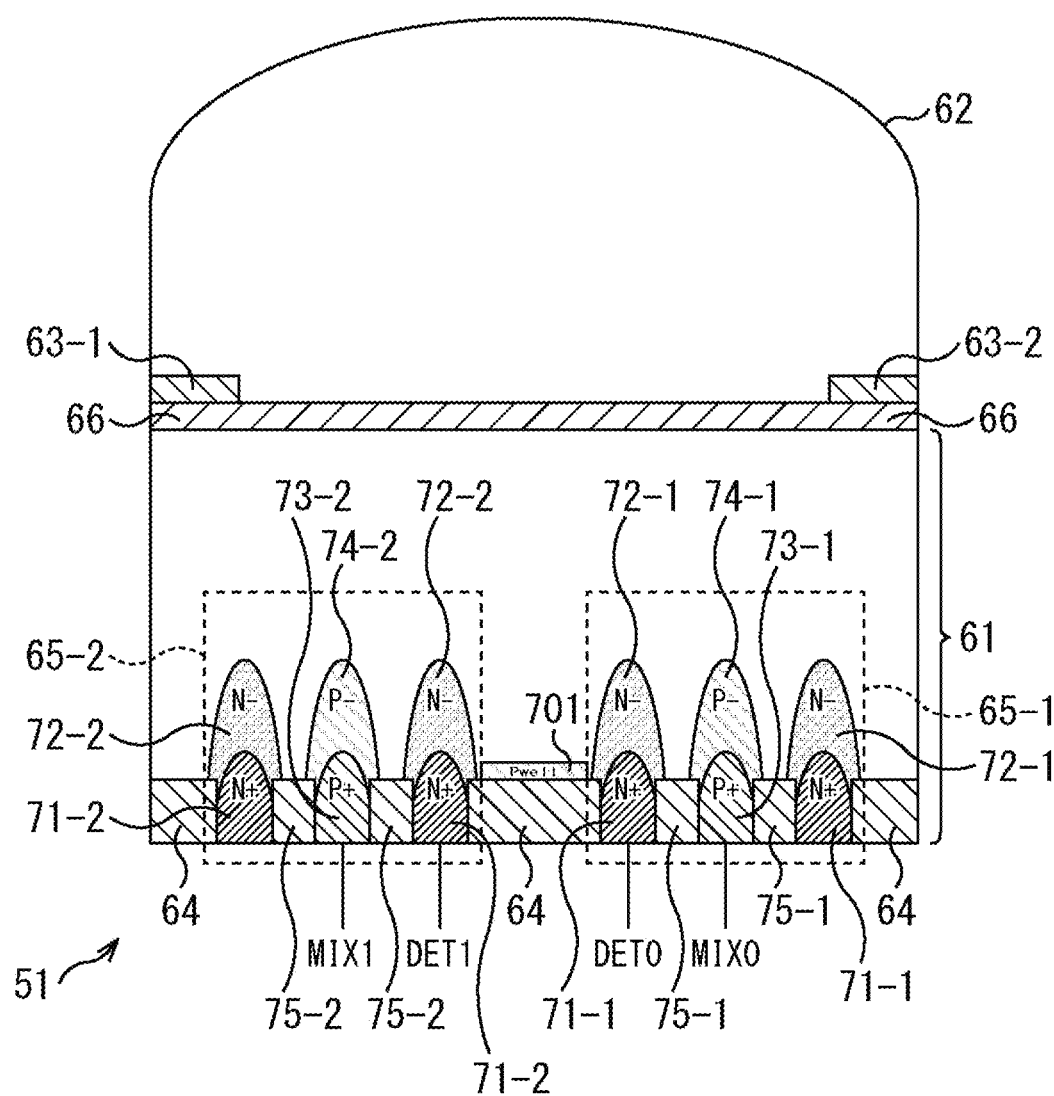
FIG. 30 is a view depicting a different example of a configuration of the pixel.

In such a case as just described, the pixel 51 is configured, for example, in such a manner as depicted in FIG. 30. Note that, in FIG. 30, portions corresponding to those in the case of FIG. 2 are denoted by like reference signs to those in FIG. 2, and description of them is suitably omitted.

The configuration of the pixel 51 depicted in FIG. 30 is different from the pixel 51 depicted in FIG. 2 in that a P well region 701 is provided newly but is a configuration same as that of the pixel 51 of FIG. 2 in the other respects. More specifically, in the example depicted in FIG. 30, the P well region 701 configured from a P-type semiconductor region is formed on the upper side of the oxide film 64 in the substrate 61.

According to the present technology, by configuring a CAPD sensor as that of the back-illuminated type as described above, characteristics such as the pixel sensitivity can be improved.

<Example of Configuration of Equivalent Circuit of Pixel>

Figure 31:
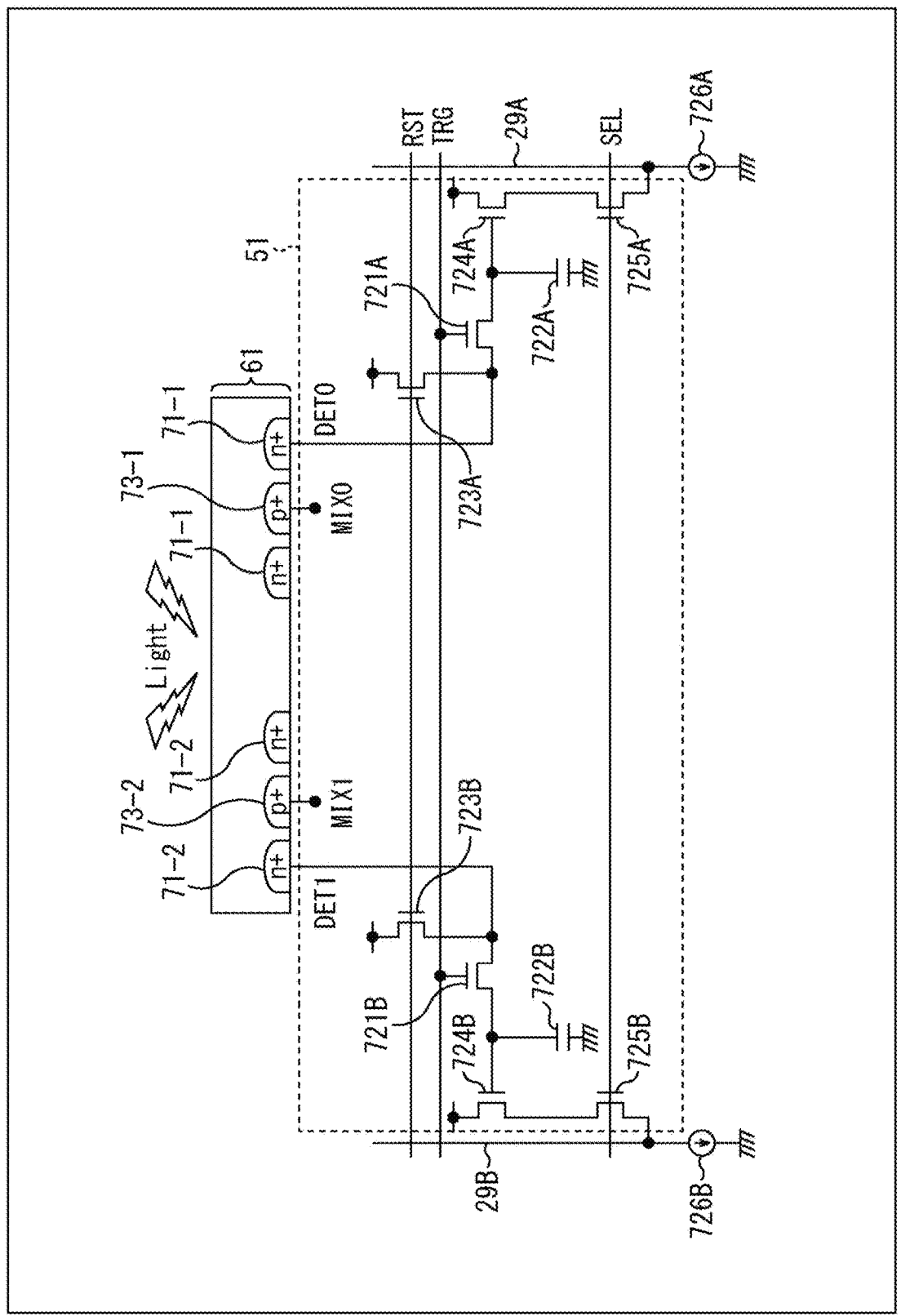
FIG. 31 is a view depicting a different example of a configuration of the pixel.

FIG. 31 depicts an equivalent circuit of the pixel 51.

The pixel 51 includes, for the signal extraction portion 65-1 including the N+ semiconductor region 71-1, P+ semiconductor region 73-1 and so forth, a transfer transistor 721A, an FD 722A, a reset transistor 723A, an amplification transistor 724A and a selection transistor 725A.

Furthermore, the pixel 51 includes, for the signal extraction portion 65-2 including the N+ semiconductor region 71-2, P+ semiconductor region 73-2 and so forth, a transfer transistor 721B, an FD 722B, a reset transistor 723B, an amplification transistor 724B and a selection transistor 725B.

The tap driving section 21 applies a predetermined voltage MIX0 (first voltage) to the P+ semiconductor region 73-1 and applies a predetermined voltage MIX1 (second voltage) to the P+ semiconductor region 73-2. In the example described hereinabove, one of the voltages MIX0 and MIX1 is 1.5 V and the other is 0 V. Each of the P+ semiconductor regions 73-1 and 73-2 is a voltage application portion to which the first voltage or the second voltage is applied.

The N+ semiconductor regions 71-1 and 71-2 are charge detection portions that detect and accumulate charge generated by photoelectric conversion of light incident to the substrate 61.

The transfer transistor 721A transfers the charge accumulated in the N+ semiconductor region 71-1 to the FD 722A when it is placed into a conducting state in response to that a driving signal TRG supplied to the gate electrode thereof is placed into an active state. The transfer transistor 721B transfers the charge accumulated in the N+ semiconductor region 71-2 to the FD 722B when it is placed into a conducting state in response to that the driving signal TRG supplied to the gate electrode thereof is placed into an active state.

The FD 722A temporarily retains charge DET0 supplied from the N+ semiconductor region 71-1. The FD 722B temporarily retains charge DET1 supplied from the N+ semiconductor region 71-2. The FD 722A corresponds to the FD portion A described hereinabove with reference to FIG. 2, and the FD 722B corresponds to the FD portion B.

The reset transistor 723A resets the potential of the FD 722A to a predetermined level (power supply voltage VDD) when it is placed into a conducting state in response to that a driving signal RST supplied to the gate electrode thereof is placed into an active state. The reset transistor 723B resets the potential of the FD 722B to a predetermined level (power supply voltage VDD) when it is placed into a conducting state in response to that the driving signal RST supplied to the gate electrode thereof is placed into an active state. Note that, when the reset transistors 723A and 723B are placed into an active state, also the transfer transistors 721A and 721B are placed into an active state simultaneously.

The amplification transistor 724A is connected at the source electrode thereof to a vertical signal line 29A through the selection transistor 725A to configure a source follower circuit together with a load MOS of a constant current source circuit section 726A connected to one end of the vertical signal line 29A. The amplification transistor 724B is connected at the source electrode thereof to another vertical signal line 29B through the selection transistor 725B to configure a source follower circuit together with a load MOS of a constant current source circuit section 726B connected to one end of the vertical signal line 29B.

The selection transistor 725A is connected between the source electrode of the amplification transistor 724A and the vertical signal line 29A. If a selection signal SEL supplied to the gate electrode of the selection transistor 725A is placed into an active state, then the selection transistor 725A is placed into a conducting state in response to this and outputs a pixel signal outputted from the amplification transistor 724A to the vertical signal line 29A.

The selection transistor 725B is connected between the source electrode of the amplification transistor 724B and the vertical signal line 29B. If a selection signal SEL supplied to the gate electrode of the selection transistor 725B is placed into an active state, then the selection transistor 725B is placed into a conducting state in response to this and outputs a pixel signal outputted from the amplification transistor 724B to the vertical signal line 29B.

The transfer transistors 721A and 721B, reset transistors 723A and 723B, amplification transistors 724A and 724B and selection transistors 725A and 725B of the pixel 51 are controlled, for example, by the vertical driving section 22.

<Different Example of Configuration of Equivalent Circuit of Pixel>

Figure 32:
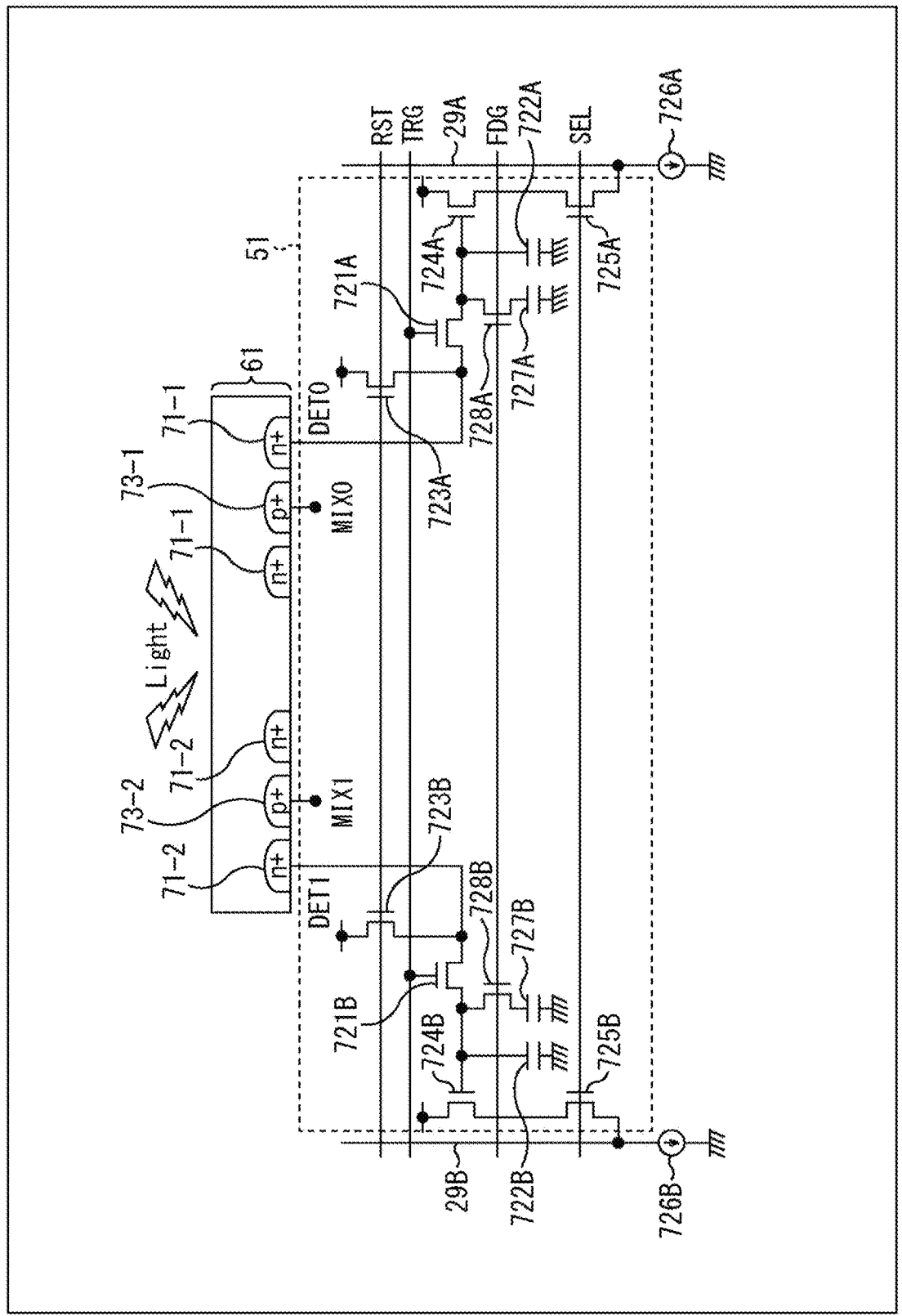
FIG. 32 is a view depicting another equivalent circuit of the pixel.

FIG. 32 depicts a different equivalent circuit of the pixel 51.

In FIG. 32, portions corresponding to those in the case of FIG. 31 are denoted by like reference signs to those in FIG. 31, and description of them is suitably omitted.

The equivalent circuit of FIG. 32 is different from the equivalent circuit of FIG. 31 in that an additional capacitor 727 and a switching transistor 728 for controlling connection of the additional capacitor 727 are added to both the signal extraction portions 65-1 and 65-2.

More specifically, an additional capacitor 727A is connected between the transfer transistor 721A and the FD 722A through a switching transistor 728A and another additional capacitor 727B is connected between the transfer transistor 721B and the FD 722B through a switching transistor 728B.

If a driving signal FDG supplied to the gate electrode of the switching transistor 728A is placed into an active state, then the switching transistor 728A is placed into a conducting state in response to this thereby to connect the additional capacitor 727A to the FD 722A. If the driving signal FDG supplied to the gate electrode of the switching transistor 728B is placed into an active state, then the switching transistor 728B is placed into a conducting stage in response to this thereby to connect the additional capacitor 727B to the FD 722B.

For example, at high illumination where the light amount of incident light is great, the arrow mark A22 places the switching transistors 728A and 728B into an active state to connect the FD 722A and the additional capacitor 727A to each other and connect the FD 722B and the additional capacitor 727B to each other. As a consequence, at high illumination, a greater amount of charge can be accumulated.

On the other hand, at low illumination where the light amount of incident light is small, the arrow mark A22 places the switching transistors 728A and 728B into an inactive state thereby to disconnect the additional capacitors 727A and 727B from the FDs 722A and 722B, respectively.

Although the additional capacitors 727 may be omitted as in the equivalent circuit of FIG. 31, where the additional capacitors 727 are provided and are selectively used in response to the incident light amount, a high dynamic range can be assured.

<Example of Arrangement of Voltage Supply Line>

Now, arrangement of voltage supply lines for applying a predetermined voltage MIX0 or MIX1 to the P+ semiconductor regions 73-1 and 73-2 that are voltage application portions of the signal extraction portion 65 of each pixel 51 is described with reference to FIGS. 33 to 35. A voltage supply line 741 depicted in FIGS. 33 and 34 corresponds to the voltage supply line 30 depicted in FIG. 1.

Figure 33:
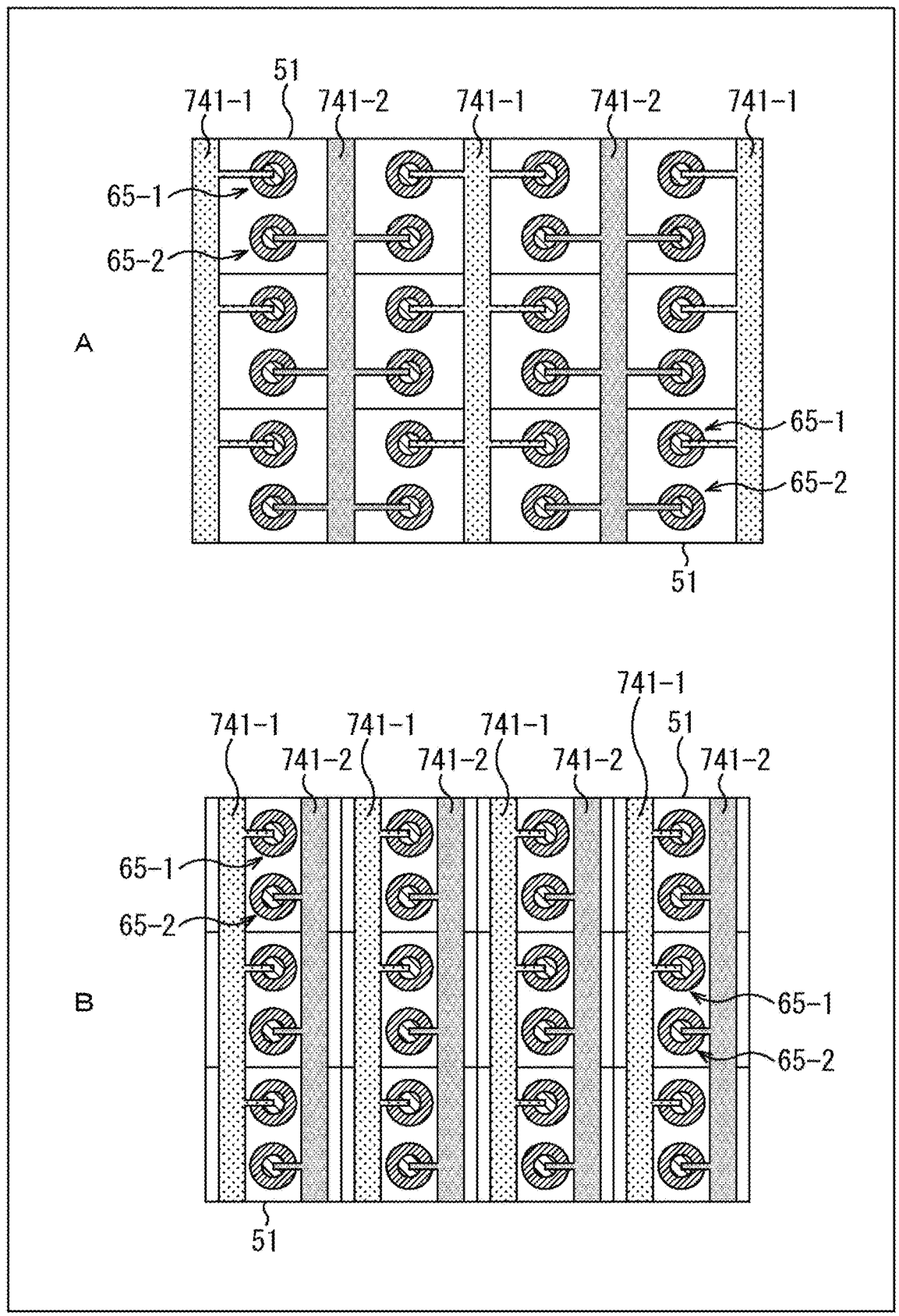
FIG. 33 is a view depicting an example of arrangement of a voltage supply line to which Periodic arrangement is adopted.
Figure 34:
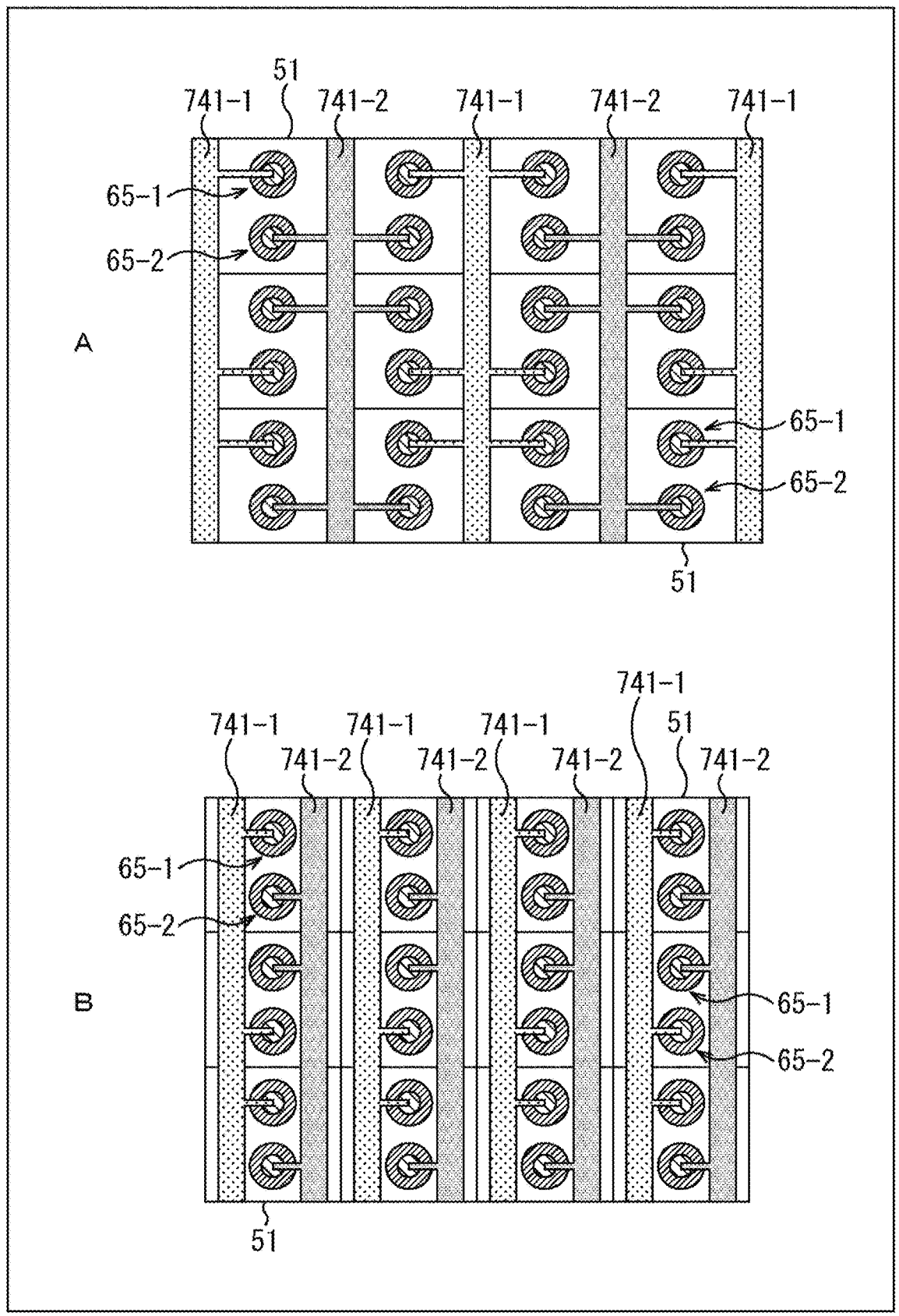
FIG. 34 is a view depicting an example of arrangement of a voltage supply line for which Mirror arrangement is adopted.

Note that, although the circular configuration depicted in FIG. 9 is adopted as the configuration of the signal extraction portion 65 of each pixel 51 in FIGS. 33 and 34, it is a matter of course that a different configuration may be adopted.

A of FIG. 33 is a plan view depicting a first arrangement example of voltage supply lines.

In the first arrangement example, a voltage supply line 741-1 or 741-2 is wired along a vertical direction between (on the boundary between) two pixels neighboring with each other in the horizontal direction among a plurality of pixels 51 arranged two-dimensionally in a matrix.

The voltage supply line 741-1 is connected to the P+ semiconductor region 73-1 of the signal extraction portion 65-1 that is one of the two signal extraction portions 65 in each pixel 51. The voltage supply line 741-2 is connected to the P+ semiconductor region 73-2 of the signal extraction portion 65-2 that is the other of the two signal extraction portions 65 in each pixel 51.

In this first arrangement example, since the two voltage supply lines 741-1 and 741-2 are arranged for two columns of pixels, the number of voltage supply lines 741 arranged in the pixel array section 20 is substantially equal to the number of columns of the pixels 51.

B of FIG. 33 is a plan view depicting a second arrangement example of a voltage supply line.

In the second arrangement example, for one pixel column of a plurality of pixels 51 arranged two-dimensionally in a matrix, two voltage supply lines 741-1 and 741-2 are wired along the vertical direction.

The voltage supply line 741-1 is connected to the P+ semiconductor region 73-1 of the signal extraction portion 65-1 that is one of the two signal extraction portions 65 in the pixel 51. The voltage supply line 741-2 is connected to the P+ semiconductor region 73-2 of the signal extraction portion 65-2 that is the other of the two signal extraction portions 65 in the pixel 51.

In this second arrangement example, since two voltage supply lines 741-1 and 741-2 are wired for one pixel column, four voltage supply lines 741 are arranged for two columns of pixels. In the pixel array section 20, the number of voltage supply lines 741 to be arranged is approximately twice the number of columns of the pixels 51.

Both the arrangement examples of A and B of FIG. 33 are Periodic arrangement (cyclic arrangement) in which the configuration that the voltage supply line 741-1 is connected to the P+ semiconductor region 73-1 of the signal extraction portion 65-1 and the voltage supply line 741-2 is connected to the P+ semiconductor region 73-2 of the signal extraction portion 65-2 is cyclically repeated for the pixels lined up in the vertical direction.

The first arrangement example of A of FIG. 33 can reduce the number of voltage supply lines 741-1 and 741-2 to be wired in the pixel array section 20.

Although the second arrangement example of B of FIG. 33 includes an increased number of wirings in comparison with the first arrangement example, since the number of signal extraction portions 65 to be connected to one voltage supply line 741 decreases to ½, the load to the wirings can be reduced. Therefore, the second arrangement example of B of FIG. 33 is effective when high speed driving is required or the total pixel number of pixels of the pixel array section 20 is great.

A of FIG. 34 is a plan view depicting a third arrangement example of voltage supply lines.

The third arrangement example is an example in which two voltage supply lines 741-1 and 741-2 are arranged for two columns of pixels similarly as in the first arrangement example of A of FIG. 33.

The third arrangement example is different from the first arrangement example of A of FIG. 33 in that the connection destinations of the signal extraction portions 65-1 and 65-2 are different between two pixels lined up in the vertical direction.

More specifically, for example, although, at a certain pixel 51, the voltage supply line 741-1 is connected to the P+ semiconductor region 73-1 of the signal extraction portion 65-1 and the voltage supply line 741-2 is connected to the P+ semiconductor region 73-2 of the signal extraction portion 65-2, at a pixel 51 above or below the certain pixel 51, the voltage supply line 741-1 is connected to the P+ semiconductor region 73-2 of the signal extraction portion 65-2 and the voltage supply line 741-2 is connected to the P+ semiconductor region 73-1 of the signal extraction portion 65-1.

B of FIG. 34 is a plan view depicting a fourth arrangement example of a voltage supply line.

The fourth arrangement example is an example in which two voltage supply lines 741-1 and 741-2 are arranged for two columns of pixels similarly as in the second arrangement example of B of FIG. 33.

The fourth arrangement example is different from the second arrangement example of B of FIG. 33 in that the connection destinations of the signal extraction portions 65-1 and 65-2 are different between two pixels lined up in the vertical direction.

More specifically, although, for example, at a certain pixel 51, the voltage supply line 741-1 is connected to the P+ semiconductor region 73-1 of the signal extraction portion 65-1 and the voltage supply line 741-2 is connected to the P+ semiconductor region 73-2 of the signal extraction portion 65-2, at a pixel 51 below or above the certain pixel 51, the voltage supply line 741-1 is connected to the P+ semiconductor region 73-2 of the signal extraction portion 65-2 and the voltage supply line 741-2 is connected to the P+semiconductor region 73-1 of the signal extraction portion 65-1.

The third arrangement example of A of FIG. 34 can reduce the number of voltage supply lines 741-1 and 741-2 to be wired in the pixel array section 20.

Although the fourth arrangement example of B of FIG. 34 includes an increased number of wirings in comparison with the third arrangement example, since the number of signal extraction portions 65 connected to one voltage supply line 741 decreases to ½, the load to the wirings can be reduced, and the fourth arrangement example is effective when high speed driving is required or the total pixel number of pixels of the pixel array section 20 is great.

Both the arrangement examples of A and B of FIG. 34 are Mirror arrangement in which the connection destinations of two pixels neighboring with each other upwardly and downwardly (in the vertical direction) are mirror inverted.

Figure 35:
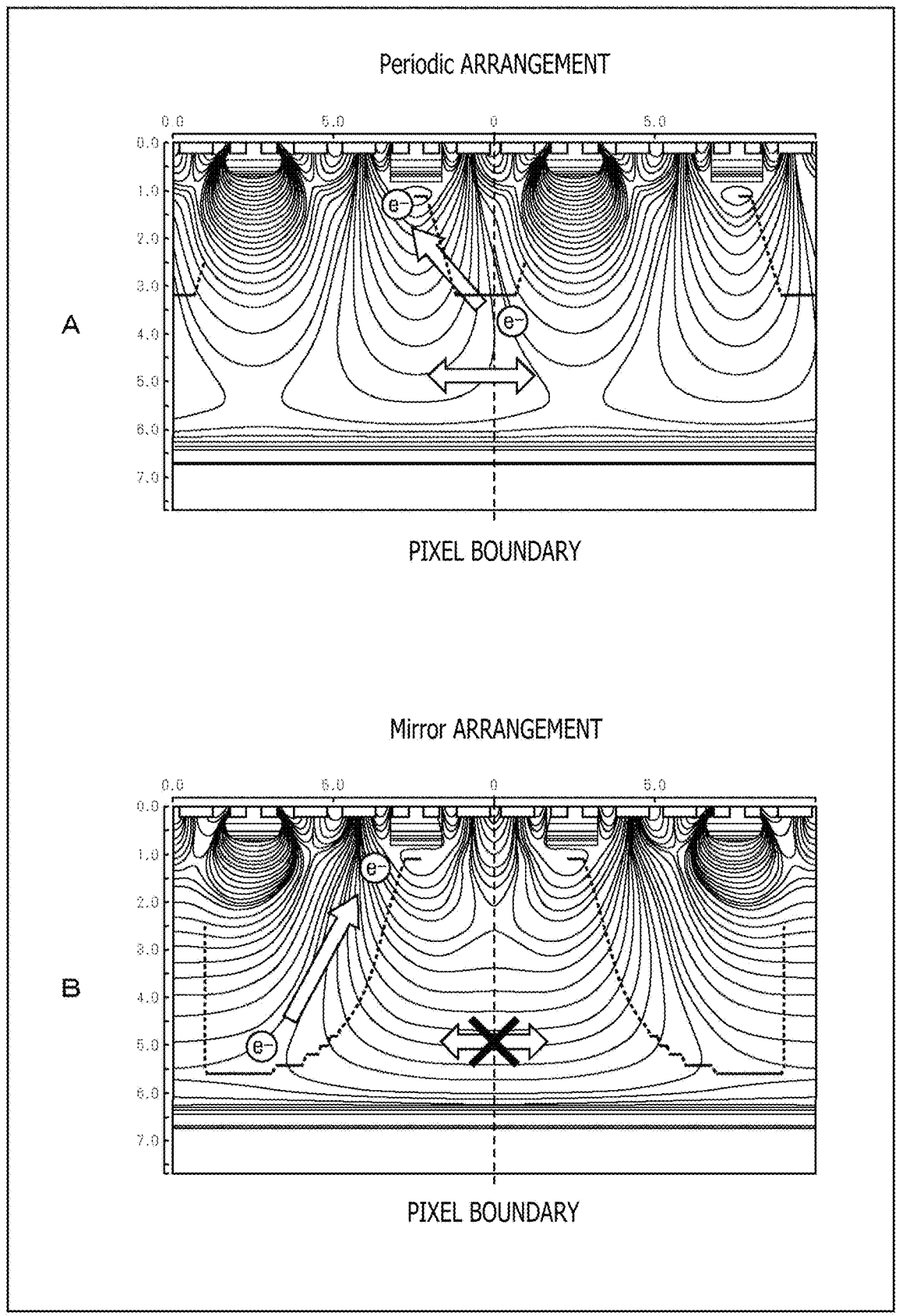
FIG. 35 is a view illustrating characteristics of the Periodic arrangement and the Mirror arrangement.

In the Periodic arrangement, since the voltages to be applied to two signal extraction portions 65 neighboring with each other across a pixel boundary are different voltages, transfer of charge occurs between the neighboring pixels, as depicted in A of FIG. 35. Therefore, although the transfer efficiency of charge is higher than that of the Mirror arrangement, the crosstalk characteristic between neighboring pixels is inferior to that of the Mirror arrangement.

On the other hand, in the Mirror arrangement, since the voltages to be applied to two signal extraction portions 65 neighboring with each other across a pixel boundary are equal voltages to each other, transfer of charge between the neighboring pixels is suppressed, as depicted in B of FIG. 35. Therefore, although the transfer efficiency of charge is inferior to that of the Periodic arrangement, the crosstalk characteristic between the neighboring pixels is better than that of the Periodic arrangement.

Sectional Configuration of Plural Pixels in Fourteenth Embodiment

In the sectional configuration of pixels depicted in FIG. 2 and so forth, illustration of multilayer wiring layers formed on the front face side opposite to the light incident face of the substrate 61 is omitted.

Therefore, in the following, sectional views of plural pixels neighboring with each other are depicted in a form in which multilayer wiring layers are not omitted in several ones of the embodiments described above.

Figure 36:
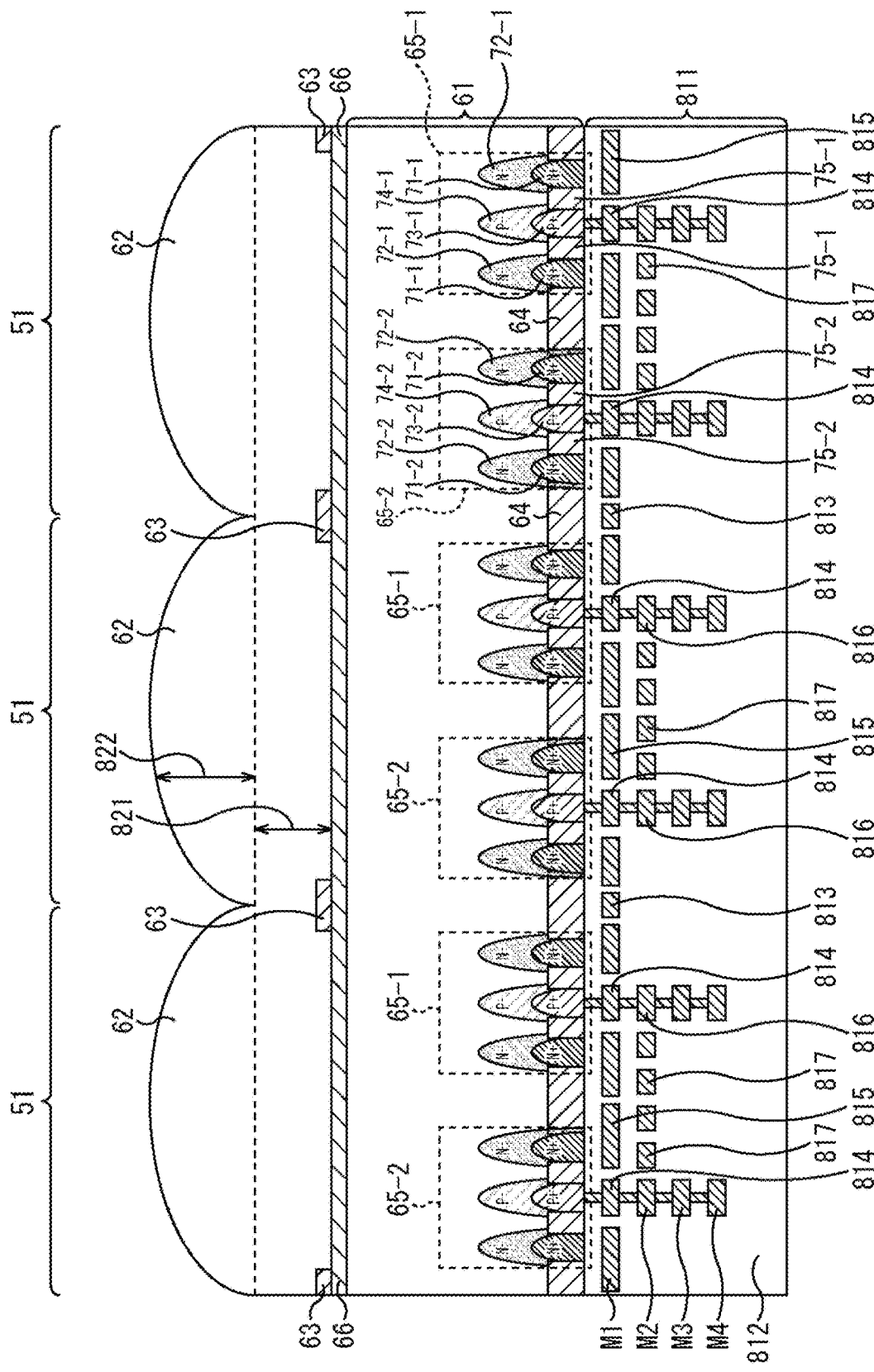
FIG. 36 is a sectional view of a plurality of pixels in a fourteenth embodiment.
Figure 37:
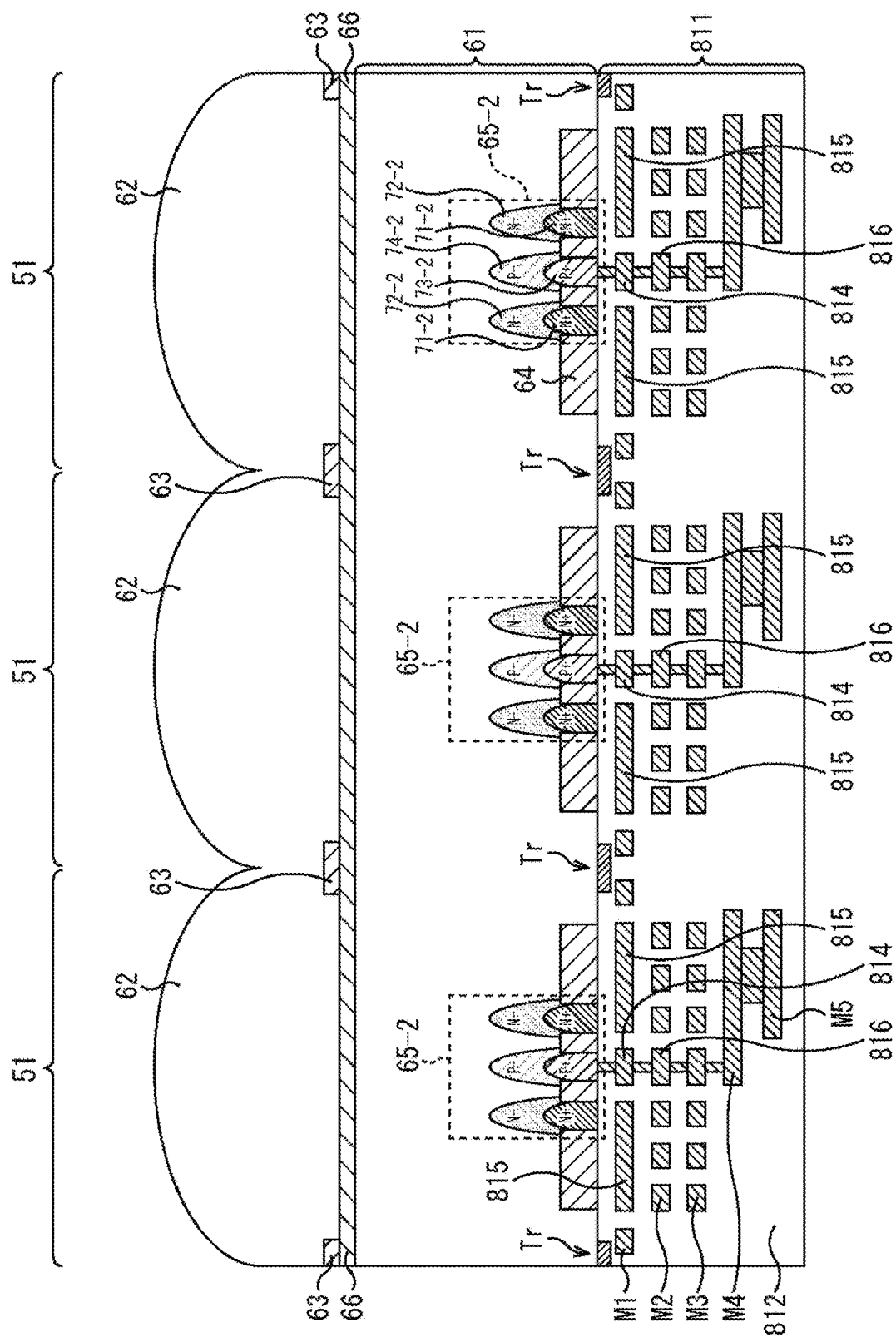
FIG. 37 is a sectional view of a plurality of pixels in the fourteenth embodiment.

First, sectional views of plural pixels of the fourteenth embodiment depicted in FIG. 28 are depicted in FIGS. 36 and 37.

The fourteenth embodiment depicted in FIG. 28 is directed to a configuration of pixels including a reflection member 631 of a large area on the opposite side to the light incident face of the substrate 61.

FIG. 36 is correspond to a sectional view taken along line B-B' of FIG. 11, and FIG. 37 is correspond to a sectional view taken along line A-A' of FIG. 11. Also, a sectional view taken along line C-C' of FIG. 17 can be indicated in such a manner as in FIG. 36.

As depicted in FIG. 36, an oxide film 64 is formed at a central portion of each pixel 51, and a signal extraction portion 65-1 and another signal extraction portion 65-2 are formed on the opposite sides of the oxide film 64.

In the signal extraction portion 65-1, an N+ semiconductor region 71-1 and another N− semiconductor region 72-1 are formed in such a manner as to be centered at the P+ semiconductor region 73-1 and the P− semiconductor region 74-1 and surround the P+ semiconductor region 73-1 and the P− semiconductor region 74-1, respectively. The P+ semiconductor region 73-1 and the N+ semiconductor region 71-1 are held in contact with a multilayer wiring layer 811. The P− semiconductor region 74-1 is arranged above the P+ semiconductor region 73-1 (on the on-chip lens 62 side) in such a manner as to cover the P+ semiconductor region 73-1, and the N− semiconductor region 72-1 is arranged above the N+ semiconductor region 71-1 (on the on-chip lens 62 side) in such a manner as to cover the N+ semiconductor region 71-1. More specifically, the P+ semiconductor region 73-1 and the N+ semiconductor region 71-1 are arranged on the multilayer wiring layer 811 side in the substrate 61, and the N− semiconductor region 72-1 and the P− semiconductor region 74-1 are arranged on the on-chip lens 62 side in the substrate 61. Furthermore, between the N+ semiconductor region 71-1 and the P+ semiconductor region 73-1, a separation portion 75-1 for separating the regions from each other includes an oxide film or the like.

In the signal extraction portion 65-2, the N+ semiconductor region 71-2 and the N− semiconductor region 72-2 are formed in such a manner as to be centered at the P+ semiconductor region 73-2 and the P− semiconductor region 74-2 and surround the P+ semiconductor region 73-2 and the P− semiconductor region 74-2, respectively. The P+ semiconductor region 73-2 and the N+ semiconductor region 71-2 are held in contact with the multilayer wiring layer 811. The P− semiconductor region 74-2 is arranged above the P+ semiconductor region 73-2 (on the on-chip lens 62 side) in such a manner as to cover the P+ semiconductor region 73-2, and the N− semiconductor region 72-2 is arranged above the N+ semiconductor region 71-2 (on the on-chip lens 62 side) in such a manner as to cover the N+ semiconductor region 71-2. More specifically, the P+ semiconductor region 73-2 and the N+ semiconductor region 71-2 are arranged on the multilayer wiring layer 811 side in the substrate 61, and the N− semiconductor region 72-2 and the P− semiconductor region 74-2 are arranged on the on-chip lens 62 side in the substrate 61. Furthermore, between the N+ semiconductor region 71-2 and the P+ semiconductor region 73-2, a separation portion 75-2 for separating the regions from each other includes an oxide film or the like.

Also, between the N+ semiconductor region 71-1 of the signal extraction portion 65-1 of a predetermined pixel 51, which is a boundary region between pixels 51 neighboring with each other, and the N+ semiconductor region 71-2 of the signal extraction portion 65-2 of a next pixel 51, an oxide film 64 is formed.

A fixed charge film 66 is formed on an interface on the light incident face side of the substrate 61 (upper face in FIGS. 36 and 37).

As depicted in FIG. 36, if the on-chip lens 62 formed for each pixel on the light incident face side of the substrate 61 is divided into a raised portion 821 having a thickness increased uniformly over an overall area of a region in the pixel and a curved face portion 822 having a thickness that varies depending upon the position in the pixel, then the thickness of the raised portion 821 is formed smaller than that of the curved face portion 822. As the thickness of the raised portion 821 increases, oblique incident light is reflected more likely by the inter-pixel shading films 63, and therefore, by forming the raised portion 821 thinner, also oblique incident light can be taken into the substrate 61. Furthermore, as the thickness of the curved face portion 822 is increased, the incident light can be condensed more to the pixel center.

The multilayer wiring layer 811 is formed on the opposite side to the light incident face side of the substrate 61 on which the on-chip lens 62 is formed for each pixel. More specifically, the substrate 61 that is a semiconductor layer is arranged between the on-chip lens 62 and the multilayer wiring layer 811. The multilayer wiring layer 811 is configured from five layers of metal layers M1 to M5 and an interlayer insulating film 812 between the metal layers M1 to M5. More specifically, in FIG. 36, since the metal layer M5 on the outermost side from among the five layers of metal layers M1 to M5 of the multilayer wiring layer 811 is at a place that is not visible, this is not depicted. However, the metal layer M5 is depicted in FIG. 37 that is a sectional view from a direction different from that of the sectional view of FIG. 36.

As depicted in FIG. 37, a pixel transistor Tr is formed in a pixel boundary region at an interface portion of the multilayer wiring layer 811 to the substrate 61. The pixel transistor Tr is one of a transfer transistor 721, a reset transistor 723, an amplification transistor 724 and a selection transistor 725 depicted in FIGS. 31 and 32.

The metal film M1 nearest to the substrate 61 from among the five layers of metal layers M1 to M5 of the multilayer wiring layer 811 includes a power supply line 813 for supplying a power supply voltage, a voltage application wire 814 for applying a predetermined voltage to the P+ semiconductor region 73-1 or 73-2 and a reflection member 815 that is a member for reflecting incident light. Although, in the metal film M1 of FIG. 36, wires other than the power supply line 813 and the voltage application wire 814 serve as the reflection member 815, in order to prevent the illustration from being complicated, some reference signs are omitted. The reflection member 815 is a dummy wire provided in order to reflect incident light and is correspond to the reflection member 631 depicted in FIG. 28. The reflection member 815 is arranged below the N+ semiconductor regions 71-1 and 71-2 such that they overlap with the N+ semiconductor regions 71-1 and 71-2 serving as the charge detection sections as viewed in plan. Note that, in the case where the shading member 631' of the fifteenth embodiment is provided in place of the reflection member 631 of the fourteenth embodiment depicted in FIG. 28, the portion of the reflection member 815 of FIG. 36 serves as the shading member 631'.

Furthermore, in the metal film M1, in order to transfer charge accumulated in the N+ semiconductor region 71 to the FD 722, also a charge extraction wire (not depicted in FIG. 36) that connects the N+ semiconductor region 71 and the transfer transistor 721 to each other is formed.

Note that, although, in the present example, the reflection member 815 (reflection member 631) and the charge extraction wire are arranged in the same layer of the metal film M1, they are not necessarily arranged restrictively in the same layer.

In the metal film M2 of the second layer from the substrate 61 side, for example, a voltage application wire 816 connected to the voltage application wire 814, for example, of the metal film M1, a control line 817 for transmitting a driving signal TRG, another driving signal RST, a selection signal SEL, a further driving signal FDG and so forth, a ground line and so forth are formed. Furthermore, in the metal film M2, an FD 722B and an additional capacitor 727A are formed.

In the metal film M3 of the third layer from the substrate 61 side, for example, a vertical signal line 29, a VSS wire for shielding and so forth are formed.

In the metal films M4 and M5 of the fourth and fifth layers from the substrate 61 side, voltage supply lines 741-1 and 741-2 (FIGS. 33 and 34) for applying a predetermined voltage MIX0 or MIX1 are formed, for example, in the P+ semiconductor regions 73-1 and 73-2 that are a voltage application section of the signal extraction portion 65.

Note that planar arrangement of the metal layers M1 to M5 of the five layers of the multilayer wiring layer 811 is hereinafter described with reference to FIGS. 42 and 43.

Sectional Configuration of Plural Pixels of Ninth Embodiment

Figure 38:
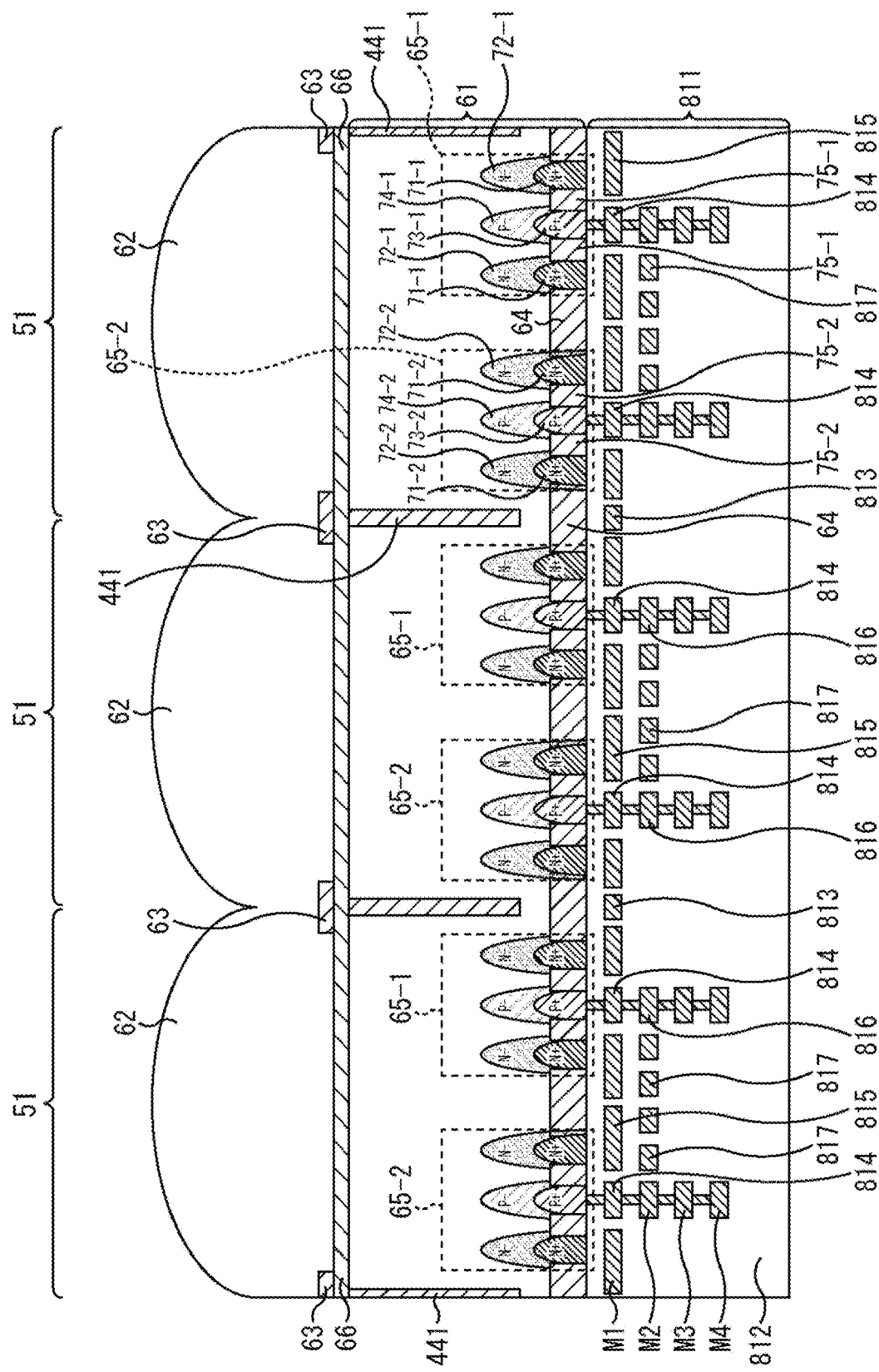
FIG. 38 is a sectional view of a plurality of pixels in a ninth embodiment.

FIG. 38 is a sectional view depicting the pixel structure of the ninth embodiment depicted in FIG. 22 in regard to a plurality of pixels without omitting a multilayer wiring layer.

The ninth embodiment depicted in FIG. 22 is a configuration of a pixel that includes a separation region 441 in which a long groove (trench) is formed to a predetermined depth from the rear face (light incident face) side of the substrate 61 at a pixel boundary portion in the substrate 61 and is filled with a shading film.

The configuration of the other part including the signal extraction portions 65-1 and 65-2, five layers of the metal layers M1 to M5 of the multilayer wiring layer 811 and so forth is similar to the configuration depicted in FIG. 36.

Sectional Configuration Plural Pixels of Modification 1 of Ninth Embodiment

Figure 39:
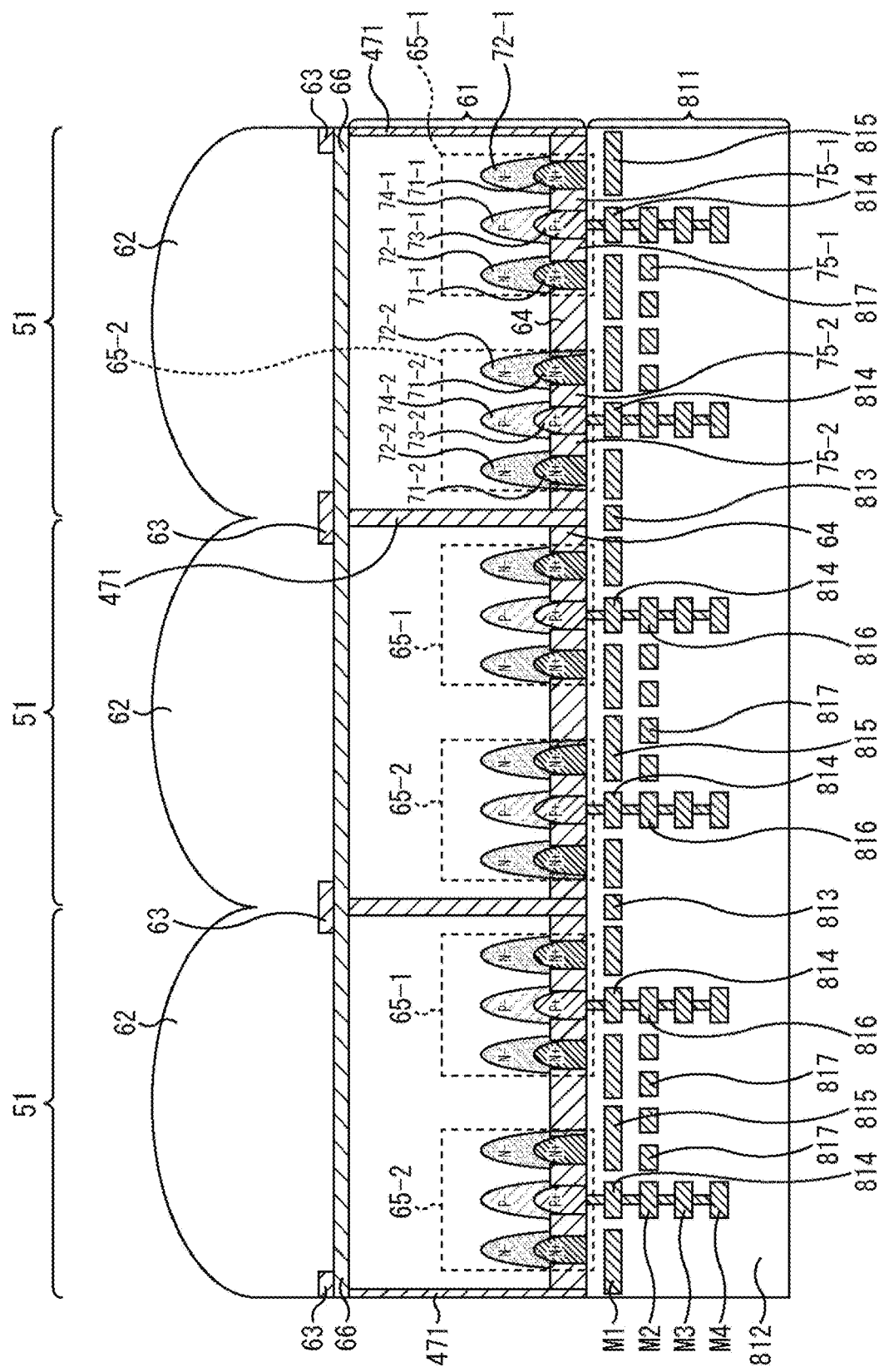
FIG. 39 is a sectional view of a plurality of pixels in a modification 1 of the ninth embodiment.

FIG. 39 is a sectional view depicting a pixel structure of a modification 1 of the ninth embodiment depicted in FIG. 23 in regard to a plurality of pixels in a form in which the multilayer wiring layer is not omitted.

The modification 1 of the ninth embodiment depicted in FIG. 23 is a configuration of a pixel that includes a separation region 471, which extends through the entire substrate 61, at a pixel boundary portion in the substrate 61.

The configuration of the other part including the signal extraction portions 65-1 and 65-2, the five layers of metal layers M1 to M5 of the multilayer wiring layer 811 and so forth is similar to the configuration depicted in FIG. 36.

Sectional Configuration of Plural Pixels of Sixteenth Embodiment

Figure 40:
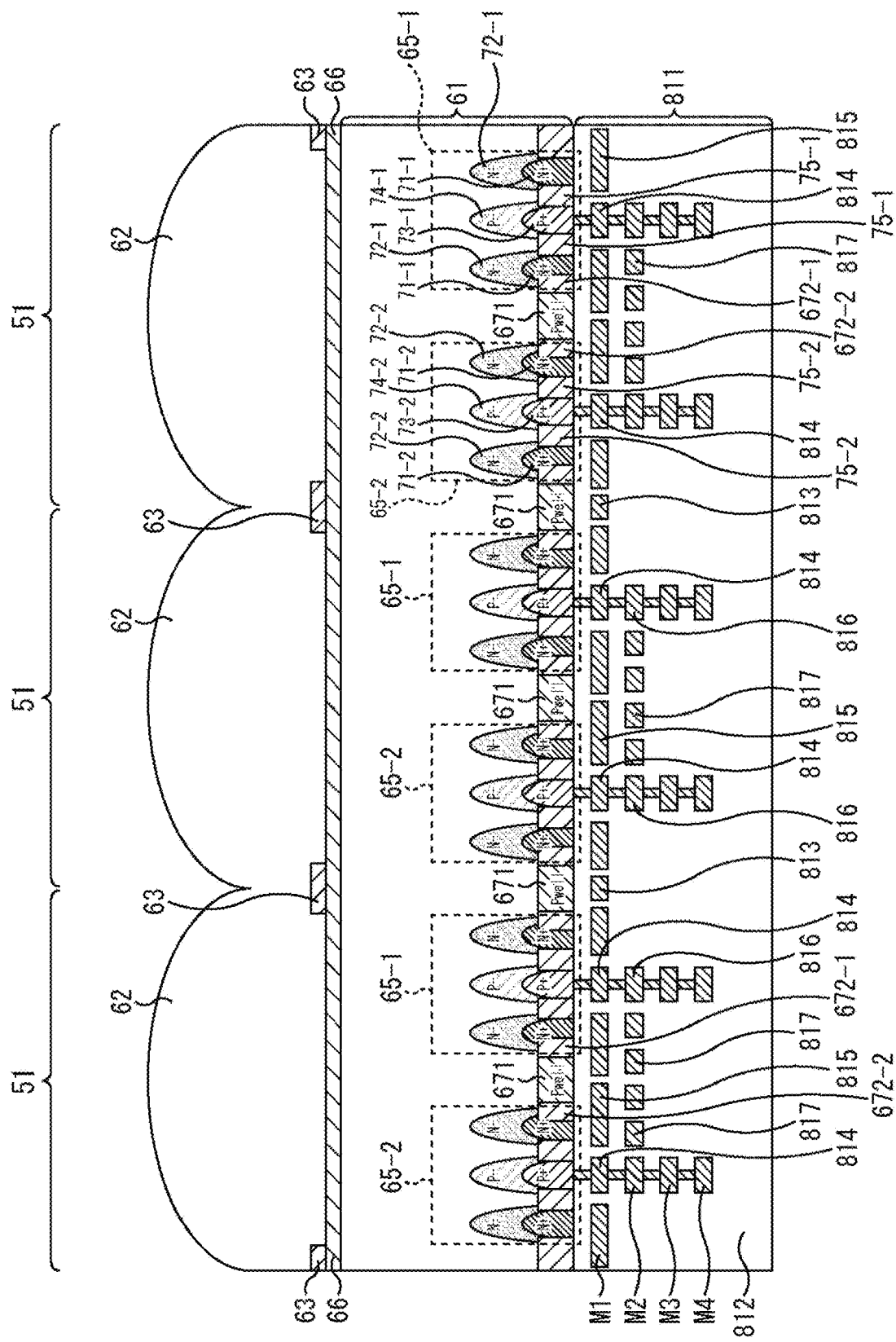
FIG. 40 is a sectional view of a plurality of pixels in a fifteenth embodiment.

FIG. 40 is a sectional view depicting a pixel structure of the sixteenth embodiment depicted in FIG. 29 in regard to a plurality of pixels in a form in which the multilayer wiring layer is not omitted.

The sixteenth embodiment depicted in FIG. 29 is a configuration including a P well region 671 provided at a middle portion on the inner side of the opposite face side to the light incident face in the substrate 61, more specifically, of the lower side face in FIG. 40. Furthermore, a separation region 672-1 includes an oxide film or the like between the P well region 671 and the N+ semiconductor region 71-1. Similarly, also between the P well region 671 and the N+ semiconductor region 71-2, another separation region 672-2 includes an oxide film or the like. Also, at a pixel boundary portion of the lower side face of the substrate 61, a P well region 671 is formed.

The configuration of the other part including the signal extraction portions 65-1 and 65-2, the five layers of metal layers M1 to M5 of the multilayer wiring layer 811 and so forth is similar to the configuration depicted in FIG. 36.

Sectional Configuration of Plural Pixels of Tenth Embodiment

Figure 41:
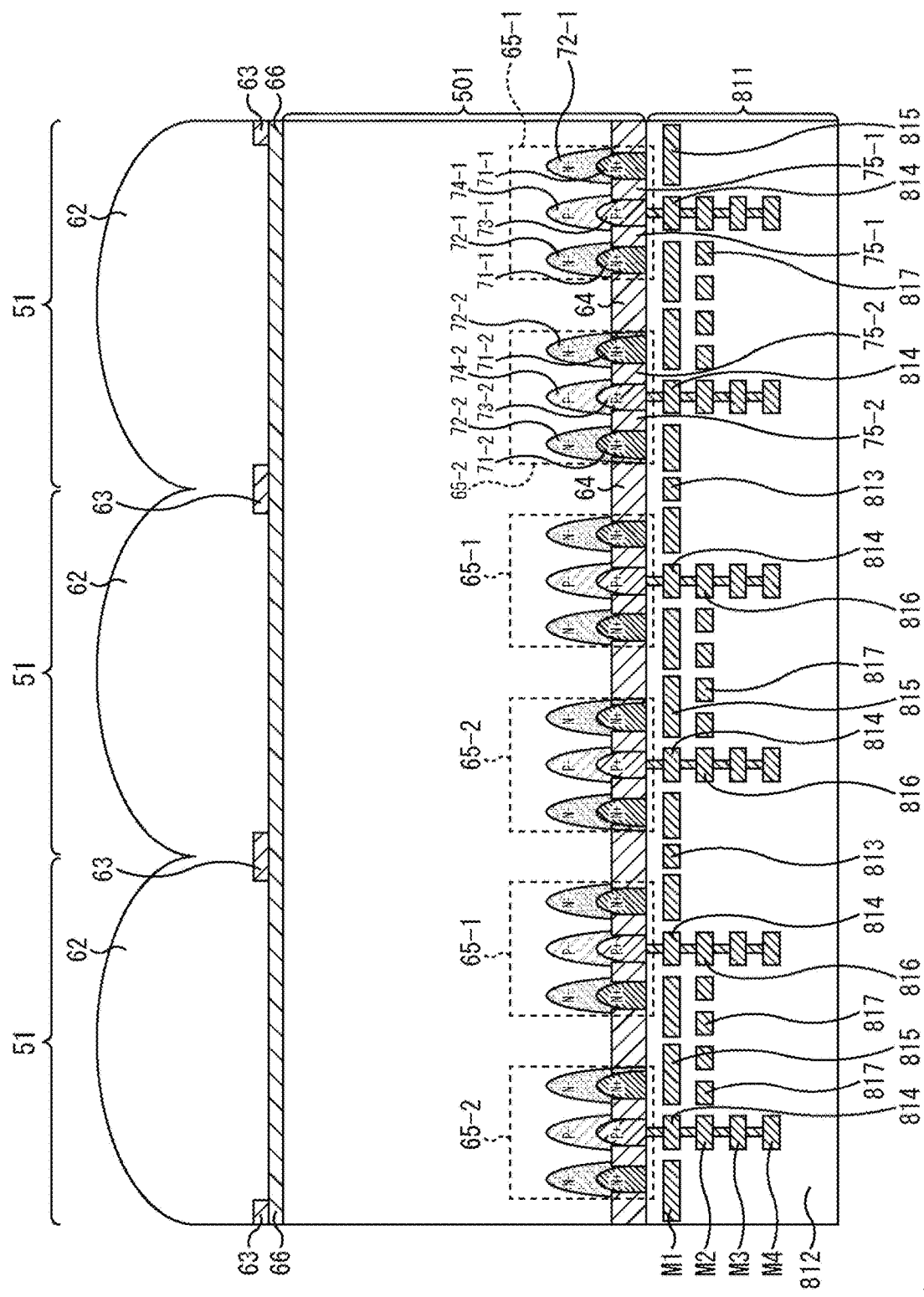
FIG. 41 is a sectional view of a plurality of pixels in a tenth embodiment.

FIG. 41 is a sectional view depicting a pixel structure of the tenth embodiment depicted in FIG. 24 in regard to a plurality of pixels in a form in which the multilayer wiring layer is not omitted.

The tenth embodiment depicted in FIG. 24 is directed to a configuration of a pixel in which a substrate 501 of an increased substrate thickness is provided in place of the substrate 61.

The configuration of the other part including the signal extraction portions 65-1 and 65-2, the five layers of metal layers M1 to M5 of the multilayer wiring layer 811 and so forth is similar to the configuration depicted in FIG. 36.

<Example of Planar Arrangement of Five Layers of Metal Layers M1 to M5>

Figure 42:
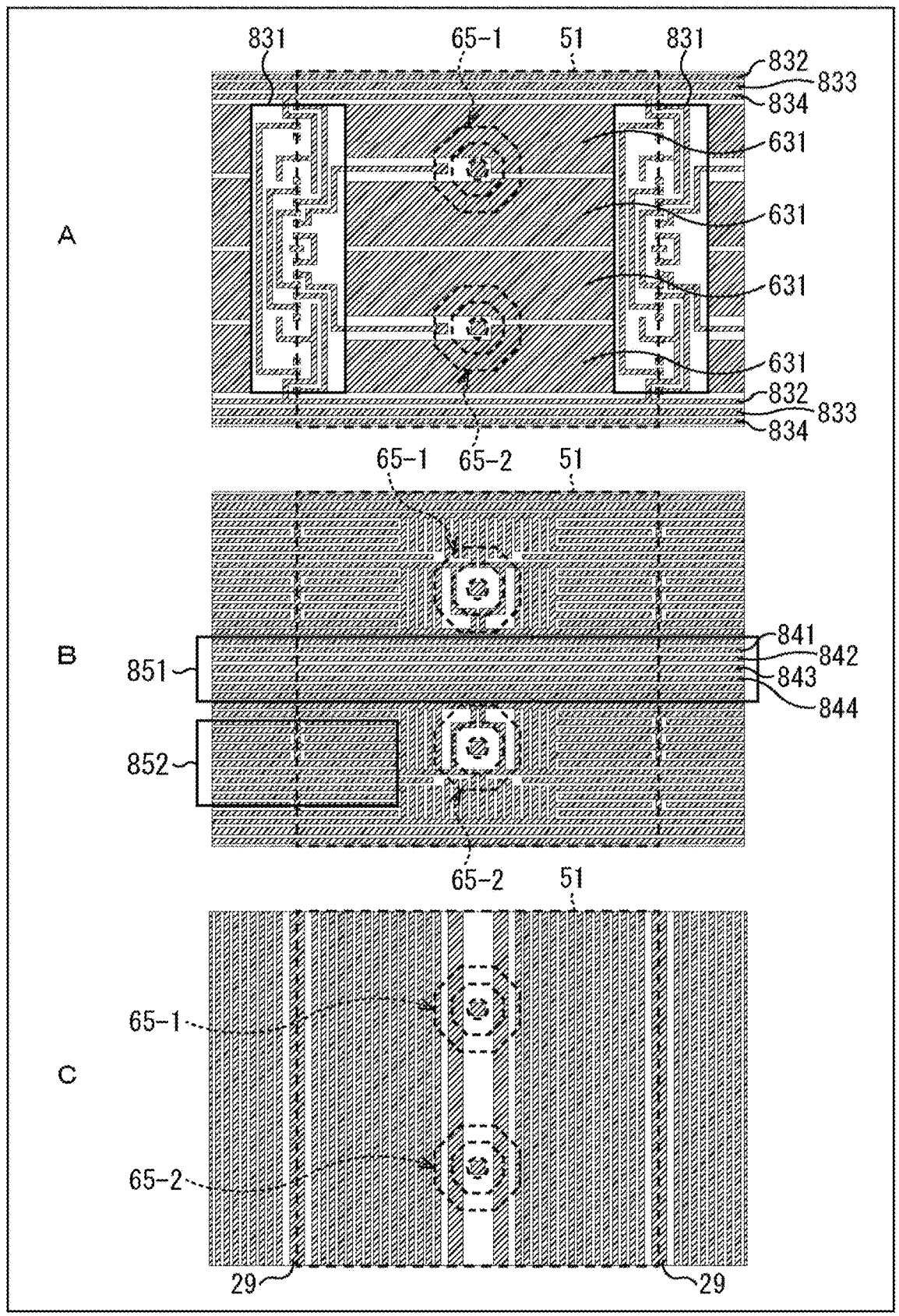
FIG. 42 is a view illustrating five layers of metal films of a multilayer wire layer.
Figure 43:
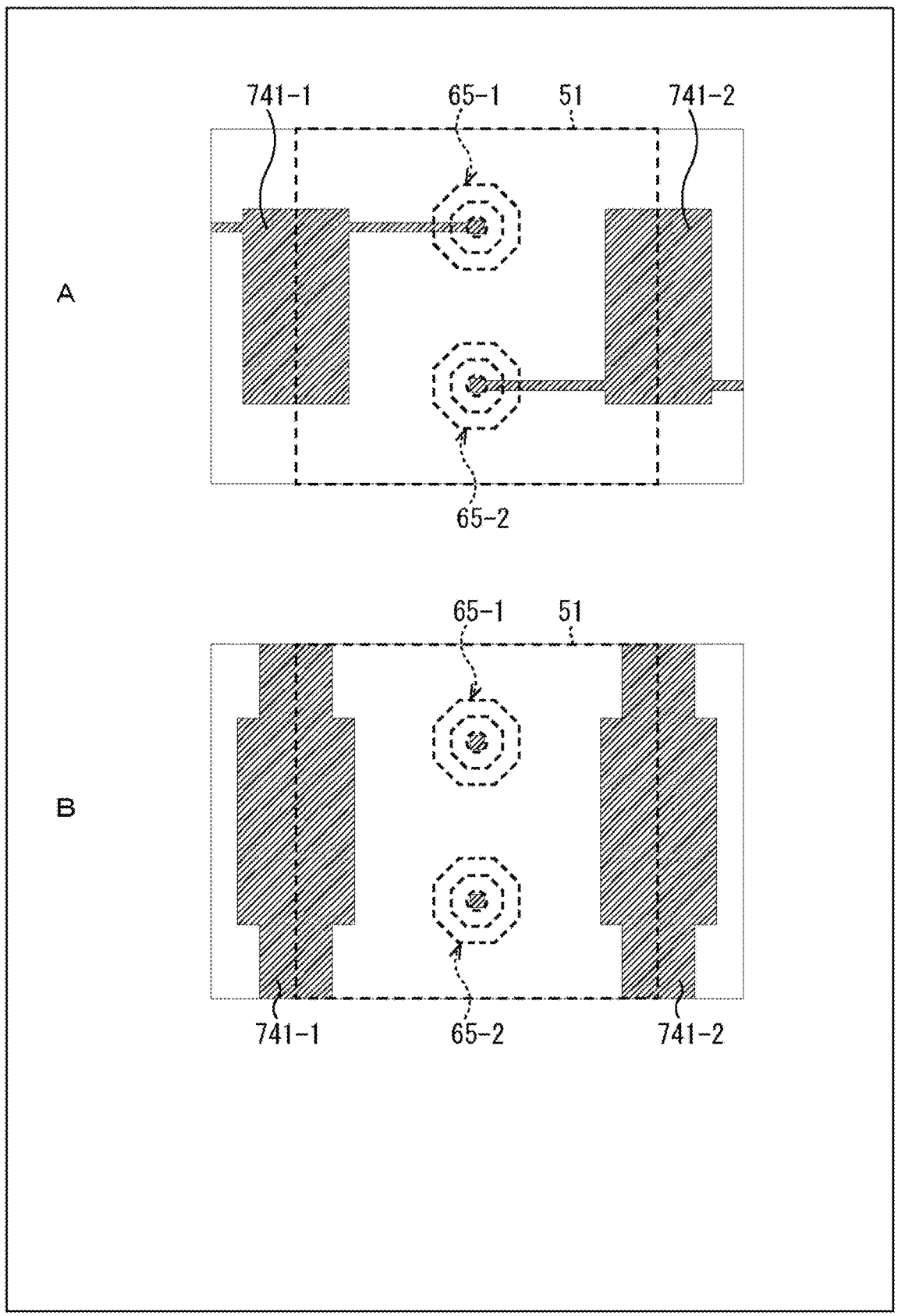
FIG. 43 is a view illustrating five layers of metal films of the multilayer wire layer.

Now, examples of planar arrangement of the five layers of metal layers M1 to M5 of the multilayer wiring layer 811 depicted in FIGS. 36 to 46 are described with reference to FIGS. 42 and 43.

A of FIG. 42 depicts a planar arrangement example of the metal film M1 of the first layer from among the five layers of metal layers M1 to M5 of the multilayer wiring layer 811.

B of FIG. 42 depicts a planar arrangement example of the metal film M2 of the second layer from among the five layers of metal layers M1 to M5 of the multilayer wiring layer 811.

C of FIG. 42 depicts a planar arrangement example of the metal film M3 of the third layer from among the five layers of metal layers M1 to M5 of the multilayer wiring layer 811.

A of FIG. 43 depicts a planar arrangement example of the metal film M4 of the fourth layer from among the five layers of metal layers M1 to M5 of the multilayer wiring layer 811.

B of FIG. 43 depicts a planar arrangement example of the metal layer M5 of the fifth layer from among the five layers of metal layers M1 to M5 of the multilayer wiring layer 811.

Note that, in A to C of FIG. 42 and A and B of FIG. 43, a region of a pixel 51 and regions of signal extraction portions 65-1 and 65-2 having an octagonal shape depicted in FIG. 11 are indicted by broken lines.

In A to C of FIG. 42 and A and B of FIG. 43, the vertical direction of the drawings is a vertical direction of the pixel array section 20 and the horizontal direction of the drawings is a horizontal direction of the pixel array section 20.

In the metal film M1 of the first layer of the multilayer wiring layer 811, a reflection member 631 that reflects infrared light is formed as indicated in A of FIG. 42. In the region of the pixel 51, two reflection members 631 are formed for each of the signal extraction portions 65-1 and 65-2, and the two reflection members 631 of the signal extraction portion 65-1 and the two reflection member 631 of the signal extraction portion 65-1 are formed symmetrically with respect to the vertical direction.

Furthermore, between the reflection member 631 of pixels 51 neighboring with each other in the horizontal direction, a pixel transistor wiring region 831 is arranged. In the pixel transistor wiring region 831, wires for connecting the pixel transistors Tr of the transfer transistor 721, reset transistor 723, amplification transistor 724 or selection transistor 725 are formed. Also, the wires for the pixel transistors Tr are formed symmetrically in the vertical direction with reference to an intermediate line (not depicted) between the two signal extraction portions 65-1 and 65-2.

Furthermore, between the reflection members 631 of pixels 51 neighboring with each other in the vertical direction, such wires as a ground line 832, a power supply line 833, another ground line 834 and so forth are formed. Also, the wires are formed symmetrically in the vertical direction with reference to an intermediate line between the two signal extraction portions 65-1 and 65-2.

Since the metal film M1 of the first layer is arranged symmetrically between the region on the signal extraction portion 65-1 side in the pixel and the region on the signal extraction portion 65-2 side in this manner, the wiring load is adjusted equally between the signal extraction portions 65-1 and 65-2. As a consequence, driving dispersion of the signal extraction portions 65-1 and 65-2 is reduced.

In the metal film M1 of the first layer, since the reflection member 631 of a large area is formed on the lower side of the signal extraction portions 65-1 and 65-2 formed on the substrate 61, infrared light having been incident to the inside of the substrate 61 through the on-chip lens 62 and having transmitted through the substrate 61 without photoelectrically converted in the substrate 61 can be reflected by the reflection member 631 so as to be incident on the inside of the substrate 61 again. As a consequence, the amount of infrared light that is photoelectrically converted in the substrate 61 is increased further, and the quantum efficiency (QE), more specifically, the sensitivity of the pixel 51 to infrared light, can be improved.

On the other hand, in the case where, in the metal film M1 of the first layer, a shading member 631' is arranged in a region same as that of the reflection member 631 in place of the reflection member 631, light having been incident to the inside of the substrate 61 through the on-chip lens 62 and having transmitted through the substrate 61 without photoelectrically converted in the substrate 61 is scattered by the wiring layer and can be suppressed from being incident to a neighboring pixel. As a consequence, light can be prevented from being detected in error by the neighboring pixel.

In the metal film M2 of the second layer of the multilayer wiring layer 811, a control line region 851 in which control lines 841 to 844 for transmitting a predetermined signal in a horizontal direction and so forth are formed is arranged between the signal extraction portions 65-1 and 65-2 as depicted in B of FIG. 42. The control lines 841 to 844 are lines for transmitting, for example, a driving signal TRG, another driving signal RST, a selection signal SEL or a driving signal FDG.

By arranging the control line region 851 between two signal extraction portions 65, the influences of them upon the signal extraction portions 65-1 and 65-2 become equal, and a driving dispersion between the signal extraction portions 65-1 and 65-2 can be reduced.

Furthermore, in a predetermined region different from the control line region 851 of the metal film M2 of the second layer, a capacitance region 852 in which an FD 722B and an additional capacitor 727A are formed is arranged. In the capacitance region 852, the FD 722B or the additional capacitor 727A is configured by forming the metal film M2 into a pattern of a comb tooth shape.

By arranging the FD 722B or the additional capacitor 727A in the metal film M2 of the second layer, the pattern of the FD 722B or the additional capacitor 727A can be arranged freely in response to a desired line capacity in design, and the degree of freedom in design can be improved.

In the metal film M3 of the third layer of the multilayer wiring layer 811, at least a vertical signal line 29 for transmitting a pixel signal outputted from each pixel 51 to the column processing section 23 is formed, as depicted in C of FIG. 42. As the vertical signal line 29, three or more lines can be arranged for one pixel column in order to assure a high reading out speed of a pixel signal. Furthermore, in addition to the vertical signal line 29, a shield wire may be arranged to reduce the coupling capacitance.

In the metal film M4 of the fourth layer and the metal layer M5 of the fifth layer of the multilayer wiring layer 811, voltage supply lines 741-1 and 741-2 for applying a predetermined voltage MIX0 or MIX1 are formed in the P+ semiconductor regions 73-1 and 73-2 of the signal extraction portion 65 of each pixel 51.

The metal film M4 and the metal layer M5 depicted in A and B of FIG. 43 indicate an example in the case where the voltage supply line 741 of the first arrangement example depicted in A of FIG. 33 is adopted.

The voltage supply line 741-1 of the metal film M4 is connected to the voltage application wire 814 (for example, FIG. 36) of the metal film M1 through the metal films M3 and M2, and the voltage application wire 814 is connected to the P+ semiconductor region 73-1 of the signal extraction portion 65-1 of the pixel 51. Similarly, the voltage supply line 741-2 of the metal film M4 is connected to the voltage application wire 814 (for example, FIG. 36) of the metal film M1 through the metal films M3 and M2, and the voltage application wire 814 is connected to the P+ semiconductor region 73-2 of the signal extraction portion 65-2 of the pixel 51.

The voltage supply lines 741-1 and 741-2 of the metal layer M5 are connected to the tap driving section 21 around the pixel array section 20. The voltage supply line 741-1 of the metal film M4 and the voltage supply line 741-1 of the metal layer M5 are connected to each other through a via or the like not depicted at a predetermined position at which both metal films exist in a planar region. The predetermined voltage MIX0 or MIX1 from the tap driving section 21 is transmitted through the voltage supply lines 741-1 and 741-2 of the metal layer M5 and supplied to the voltage supply lines 741-1 and 741-2 of the metal film M4 and then supplied from the voltage supply lines 741-1 and 741-2 to the voltage application wire 814 of the metal film M1 through the metal films M3 and M2.

By forming the light reception device 1 as a CAPD sensor of the back-illuminated type, the line width and the layout of driving lines can be designed freely in that, for example, as depicted in A and B of FIG. 43, the voltage supply lines 741-1 and 741-2 for applying the predetermined voltage MIX0 or MIX1 to the signal extraction portion 65 of each pixel 51 can be wired in the vertical direction as depicted in A and B of FIG. 43. Furthermore, also wiring suitable for high speed driving or wiring taking load reduction into consideration is possible.

<Example of Planar Arrangement of Pixel Transistor>

Figure 44:
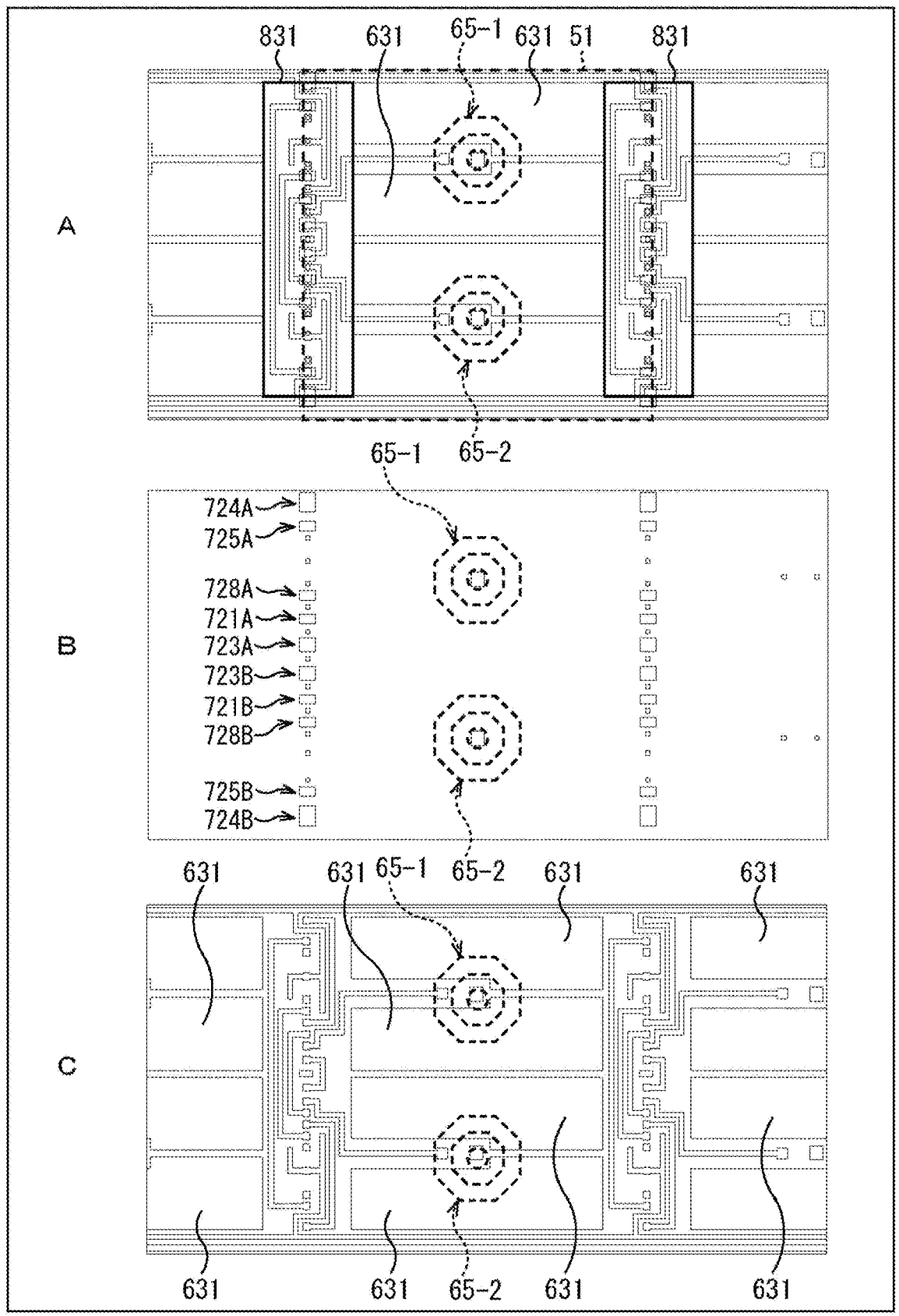
FIG. 44 is a view illustrating a polysilicon layer.

FIG. 44 is a plan view where the metal film M1 of the first layer depicted in A of FIG. 42 and a polysilicon layer for forming gate electrodes and so forth of pixel transistors Tr formed on the metal film M1 are laid one on the other.

A of FIG. 44 is a plan view where a metal film M1 of C of FIG. 44 and a polysilicon layer of B of FIG. 44 are placed one on the other. B of FIG. 44 is a plan view only of the polysilicon layer, and C of FIG. 44 is a plan view only of the metal film M1. Although the plan view of the metal film M1 of C of FIG. 44 is same as the plan view depicted in A of FIG. 42, slanting lines are omitted.

As described hereinabove with reference to A of FIG. 42, a pixel transistor wiring region 831 is formed between reflection members 631 of pixels.

In the pixel transistor wiring region 831, pixel transistors Tr individually corresponding to the signal extraction portions 65-1 and 65-2 are arranged in such a manner as depicted, for example, in B of FIG. 44.

In B of FIG. 44, with reference to an intermediate line (not depicted) between the two signal extraction portions 65-1 and 65-2, the gate electrodes of reset transistors 723A and 723B, transfer transistors 721A and 721B, switching transistors 728A and 728B, selection transistors 725A and 725B and amplification transistors 724A and 724B include the nearer side to the intermediate line.

Also, lines for connecting the pixel transistors Tr of the metal film M1 depicted in C of FIG. 44 are formed symmetrically in the vertical direction with reference to an intermediate line (not depicted) between the signal extraction portions 65-1 and 65-2.

By arranging a plurality of pixel transistors Tr included in the pixel transistor wiring region 831 symmetrically in a region on the signal extraction portion 65-1 side and another region on the signal extraction portion 65-2 side, a driving dispersion of the signal extraction portions 65-1 and 65-2 can be reduced.

<Modification of Reflection Member 631>

Now, a modification of the reflection member 631 formed in the metal film M1 is described with reference to FIGS. 45 and 46.

In the example described above, the reflection member 631 of a large area is arranged in a peripheral region of the signal extraction portion 65 in the pixel 51 as depicted in A of FIG. 42.

Figure 45:
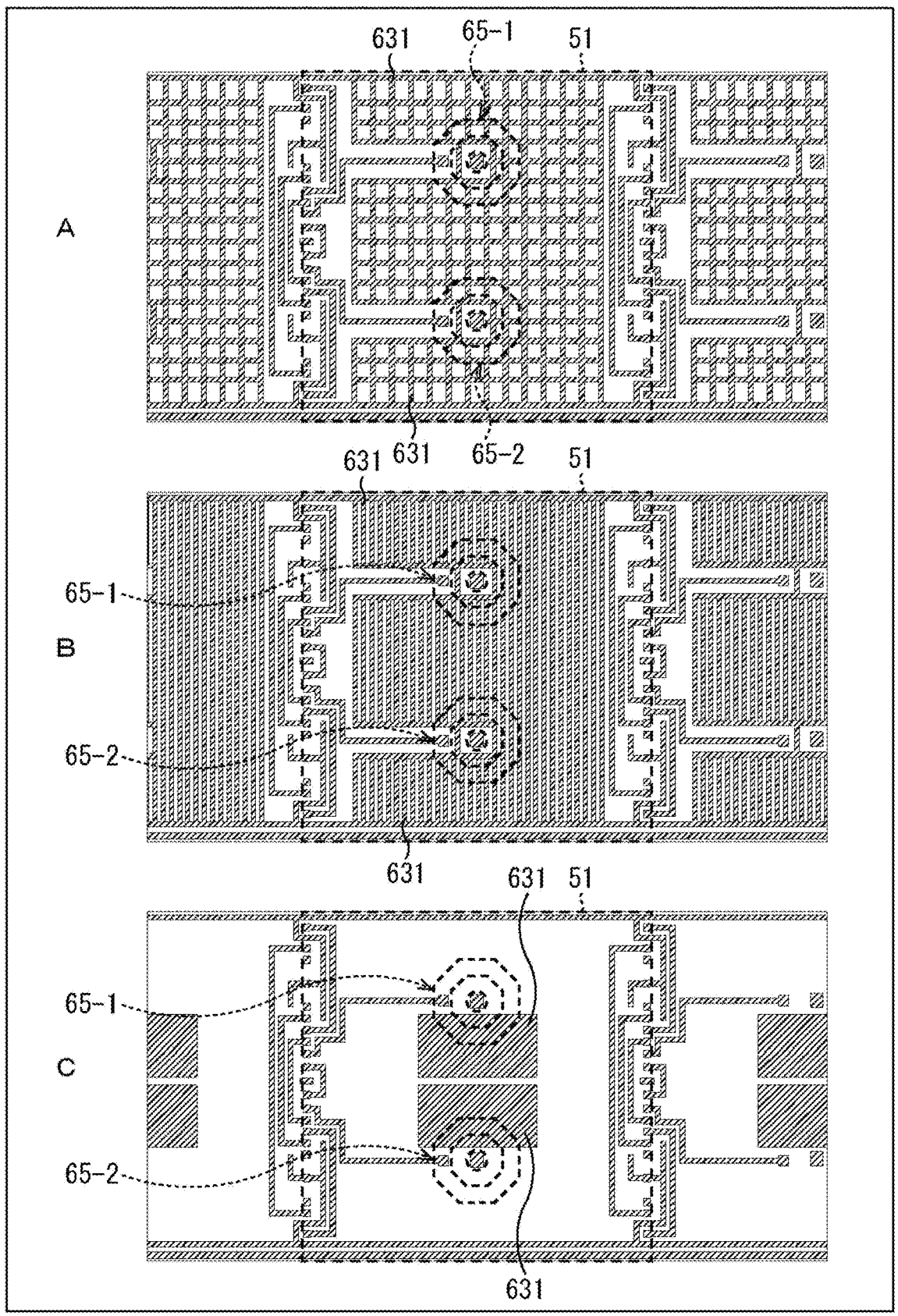
FIG. 45 is a view depicting a modification of a reflection member to be formed on the metal film.

In contrast, it is also possible to arrange the reflection member 631 in a lattice-shaped pattern as indicated, for example, in A of FIG. 45. By forming the reflection member 631 in a lattice-shaped pattern in this manner, the pattern anisotropy can be eliminated and the XY anisotropy of the reflection capability can be reduced. More specifically, by forming the reflection member 631 in a lattice-shaped pattern, reflection of incident light to a one-sided partial region can be reduced, and it is possible to reflect the incident light isotropically. Therefore, distance measurement accuracy is improved.

As an alternative, the reflection member 631 may be arranged in a stripe-shaped pattern as depicted, for example, in B of FIG. 45. By forming the reflection member 631 in a stripe-shaped pattern in this manner, it is also possible to use the pattern of the reflection member 631 as a wiring capacitor, and therefore, a configuration that expands the dynamic range to the maximum can be improved.

Note that, although B of FIG. 45 depicts an example of a stripe shape in the vertical direction, alternatively a strip shape in the horizontal direction may be applied.

As another alternative, the reflection member 631 may be arranged only in a pixel central region, more particularly, only between two signal extraction portions 65, as depicted, for example, in C of FIG. 45. By forming the reflection member 631 in a pixel central region but not at pixel ends in this manner, while an advantageous effect of sensitivity improvement by the reflection member 631 is achieved in the pixel central region, a component to be reflected to a neighboring pixel when oblique light is incident can be suppressed, and a configuration that focuses on suppression of crosstalk can be implemented.

Figure 46:
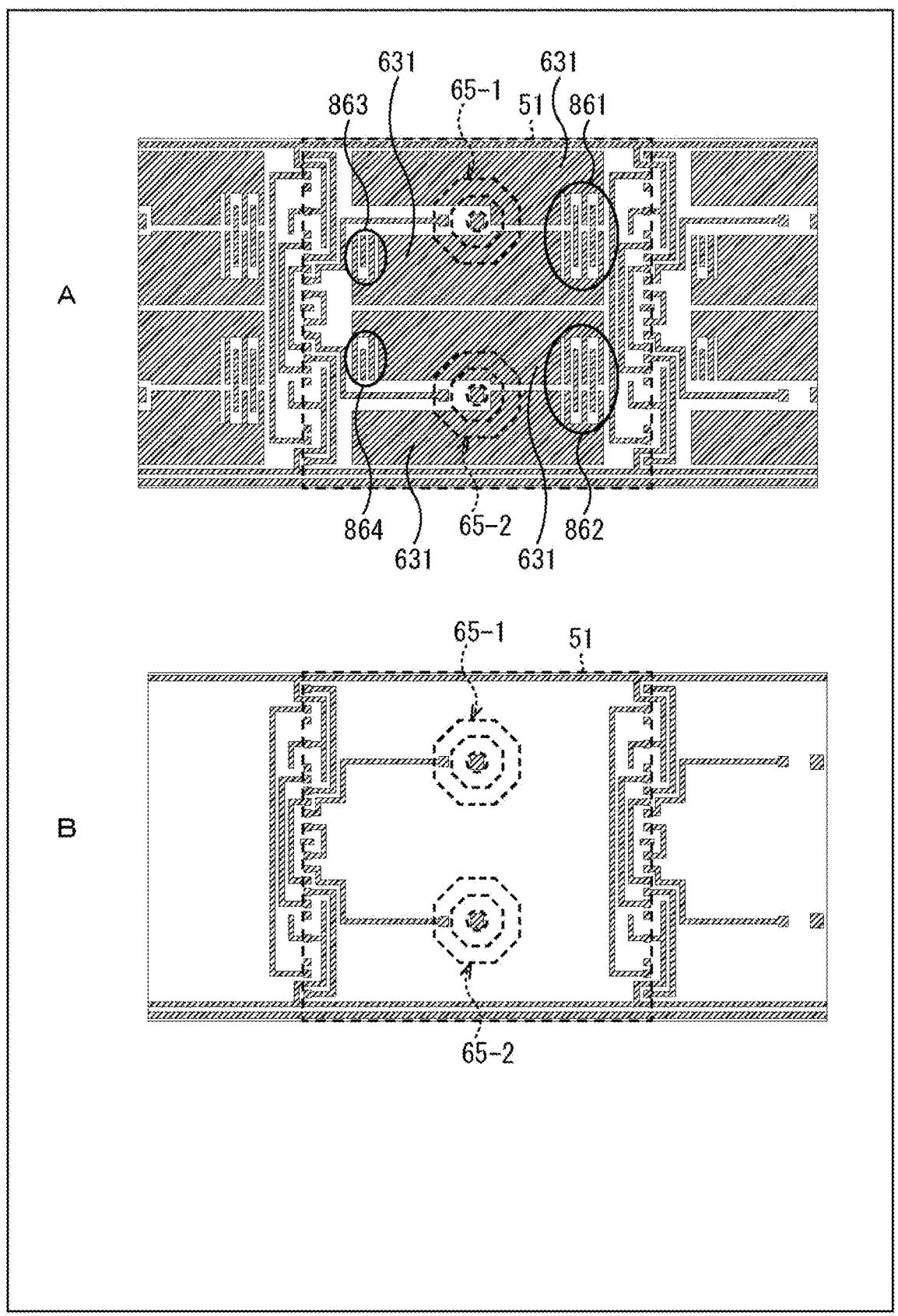
FIG. 46 is a view depicting a modification of a reflection member to be formed on the metal film.

As a further alternative, by arranging part of the reflection member 631 in a comb tooth pattern as depicted, for example, in A of FIG. 46, part of the metal film M1 may be allocated to a wiring capacitance of the FD 722 or the additional capacitor 727. The comb tooth shape in the regions 861 to 864 surrounded by a solid line round mark in A of FIG. 46 configures at least part of the FD 722 or the additional capacitor 727. The FD 722 or the additional capacitor 727 may be arranged such that it is suitably distributed to the metal film M1 and the metal film M2. The pattern of the metal film M1 can be arranged in a good balance to the capacitance of the FD 722 or the additional capacitor 727.

B of FIG. 46 depicts a pattern of the metal film M1 in the case where the reflection member 631 is not arranged. In order to further increase the amount of infrared light to be photoelectrically converted in the substrate 61 to improve the sensitivity of the pixel 51, it is preferable to arrange the reflection member 631. However, it is also possible to adopt a configuration in which the reflection member 631 is not arranged.

The arrangement examples of the reflection member 631 depicted in FIGS. 45 and 46 can be applied similarly also to the shading member 631'.

<Example of Substrate Configuration of Light Reception Device>

Figure 47:
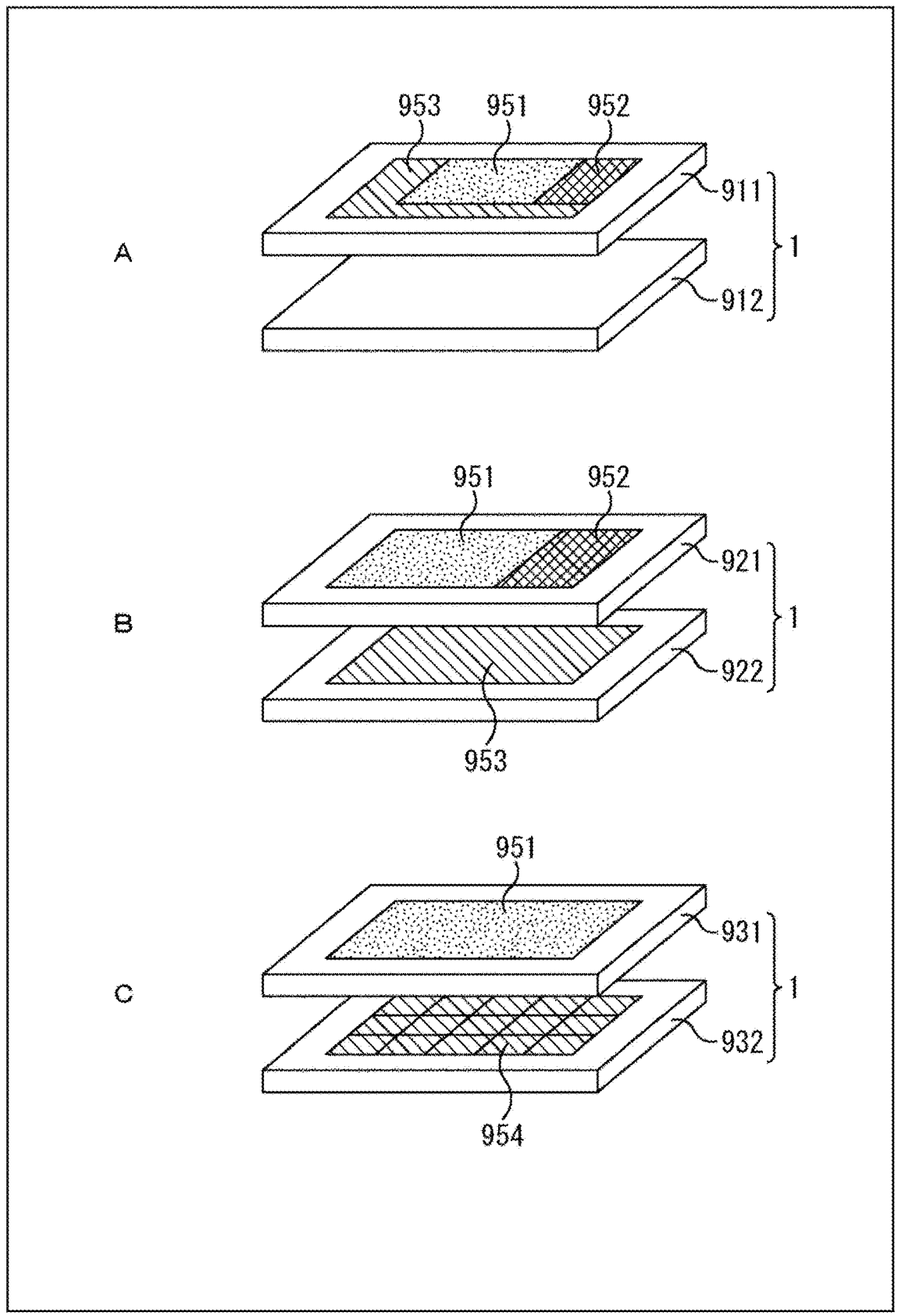
FIG. 47 is a view illustrating a substrate configuration of the light reception device.

The light reception device 1 of FIG. 1 can adopt one of substrate configurations of A to C of FIG. 47.

A of FIG. 47 depicts an example in which the light reception device 1 is configured from a single semiconductor substrate 911 and an underlying support substrate 912.

In this case, on the upper side semiconductor substrate 911, a pixel array region 951 corresponding to the pixel array section 20 described hereinabove, a control circuit 952 for controlling the pixels of the pixel array region 951 and a logic circuit 953 including a signal processing circuit of a pixel signal.

The control circuit 952 includes the tap driving section 21, the vertical driving section 22, the horizontal driving section 24 and so forth described hereinabove. The logic circuit 953 includes a column processing section 23 for performing an AD conversion process of a pixel signal and so forth and a signal processing section 31 that performs a distance measurement process for calculating a distance from a ratio of pixel signals obtained by two or more signal extraction portions 65 in the pixel, a calibration process and so forth.

As an alternative, it is also possible to configure the light reception device 1 such that a first semiconductor substrate 921 on which a pixel array region 951 and a control circuit 952 are formed and a second semiconductor substrate 922 on which a logic circuit 953 is formed are stacked as indicated in B of FIG. 47. Note that the first semiconductor substrate 921 and the second semiconductor substrate 922 are electrically connected to each other, for example, by a penetrating via or Cu—Cu metal bond.

As another alternative, it is also possible to configure the light reception device 1 such that a first semiconductor substrate 931 on which only a pixel array region 951 is formed and a second semiconductor substrate 932 on which an area controlling circuit 954 in which a control circuit for controlling each pixel and a signal processing circuit for processing a pixel signal are provided in a unit of one pixel or in a unit of an area of a plurality of pixels is formed are stacked as depicted in C of FIG. 47. The first semiconductor substrate 931 and the second semiconductor substrate 932 are electrically connected to each other, for example, through penetrating vias or Cu—Cu metal bond.

With the configuration in which a control circuit and a signal processing circuit are provided in a unit of one pixel or in a unit of an area of a plurality of pixels as in the light reception device 1 of C of FIG. 47, an optimum driving timing or gain can be set for each divisional control unit, and optimized distance information can be acquired irrespective of the distance or the reflectivity. Furthermore, since not the overall area of the pixel array region 951 but only part of the region can be driven to calculate distance information, it is also possible to suppress the power consumption in response to an operation mode.

Eighteenth Embodiment

<Example of Configuration of Pixel>

Now, further embodiments are described in addition to the first to seventeenth embodiments described above. For example, in such a case that the thickness of the substrate 61 is increased, it is concerned that the electric field in a photoelectric conversion region spaced away from the P+ semiconductor region 73 that is a voltage application portion or the N+ semiconductor region 71 that is a charge detection portion may become weak. Therefore, in the following embodiments, configurations that strengthen the electric field of the photoelectric conversion region to implement improvement of the quantum efficiency (QE) and high speed driving are described.

Figure 48:
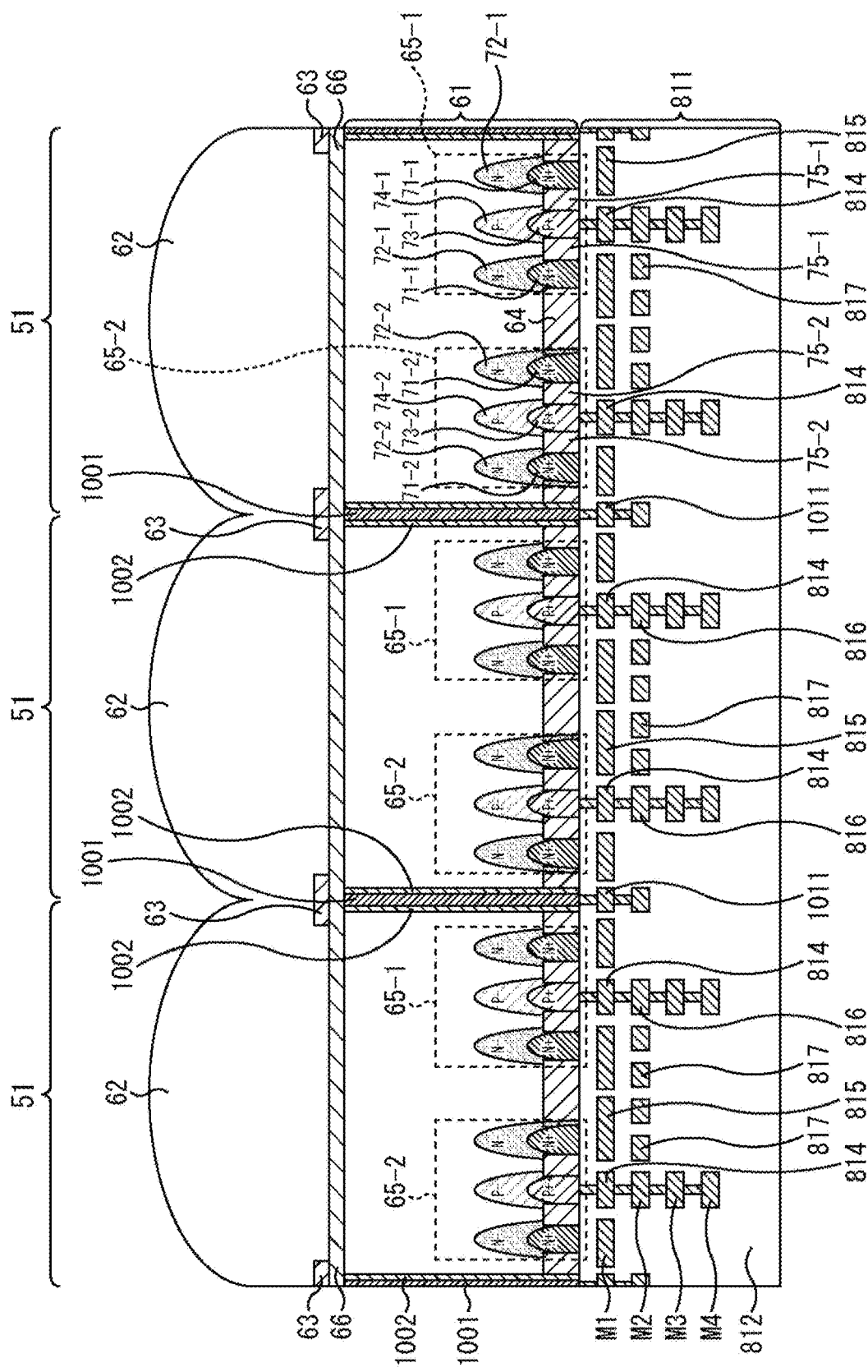
FIG. 48 is a sectional view of a plurality of pixels in an eighteenth embodiment.

FIG. 48 is a sectional view of a pixel according to an eighteenth embodiment.

FIG. 48 depicts a sectional view of a plurality of pixels taken along line B-B' of FIG. 11 similarly to FIG. 36 and so forth described hereinabove.

In FIG. 48, elements corresponding to those in the sectional view of a plurality of pixels of the fourteenth embodiment depicted in FIG. 36 are denoted by like reference characters to those in FIG. 36, and description of them is omitted suitably.

Comparing the configuration of the pixel 51 according to the eighteenth embodiment of FIG. 48 with the configuration of the pixel 51 according to the fourteenth embodiment depicted in FIG. 36, a through electrode 1001 that extends through the substrate 61 that is a P-type semiconductor layer and separating a neighboring pixel 51 and an insulating film 1002 that covers an outer periphery (side wall) of the through electrode 1001 are formed newly at a pixel boundary portion that is a boundary portion with the neighboring pixel 51. The through electrode 1001 includes a metal material such as, for example, tungsten (W), aluminum (Al), copper (Cu), titanium (Ti), titanium nitride (TiN), tantalum (Ta) or tantalum nitride (TaN), or polysilicon or the like. The insulating film 1002 includes, for example, silicon oxide ($SiO_2$), silicon oxynitride (SiON) or the like. The material of the insulating film 1002 may otherwise be an oxide or a nitride that contains at least one element from among hafnium (Hf), aluminum (Al), zirconium (Zr), tantalum (Ta) and titanium (Ti), an oxide or a nitride that contains at least one element from among lanthanum (La), praseodymium (Pr), cerium (Ce), neodymium (Nd), promethium (Pm), samarium (Sm), europium (Eu), gadolinium (Gd), terbium (Tb), dysprosium (Dy), holmium (Ho), thulium (Tm), ytterbium (Yb), lutetium (Lu) and yttrium (Y) or the like. The through electrode 1001 functions as a pixel separation portion for separating semiconductor layers (substrates 61) of neighboring pixels 51. It is to be noted that also it is possible to grasp that the pixel separation portion is configured from the through electrode 1001 including the insulating film 1002 on the outer periphery thereof and the insulating film 1002.

The through electrode 1001 is electrically connected to a voltage application wire 1011 of the metal film M1 that is a metal layer nearest to the substrate 61 in the multilayer wiring layer 811, and a predetermined bias (voltage) is applied to the through electrode 1001 through the voltage application wire 1011. Here, the bias applied to the through electrode 1001 is a voltage lower than a voltage applied to the P+ semiconductor region 73 of the signal extraction portion 65 that is made an inactive tap, and since, in the example described above, 0 V is applied to the P+ semiconductor region 73 of the signal extraction portion 65 that is made an inactive tap is applied to the through electrode 1001, the bias is a voltage lower than 0 V, namely, a negative bias.

The through electrode 1001 and the insulating film 1002 can be formed by forming a trench from the front face side or the rear face side of the substrate 61 to the opposite side substrate face by dry etching or the like, forming the insulating film 1002 and then filling polycrystalline silicon or metal material from which the through electrode 1001 is to be formed.

Figure 49:
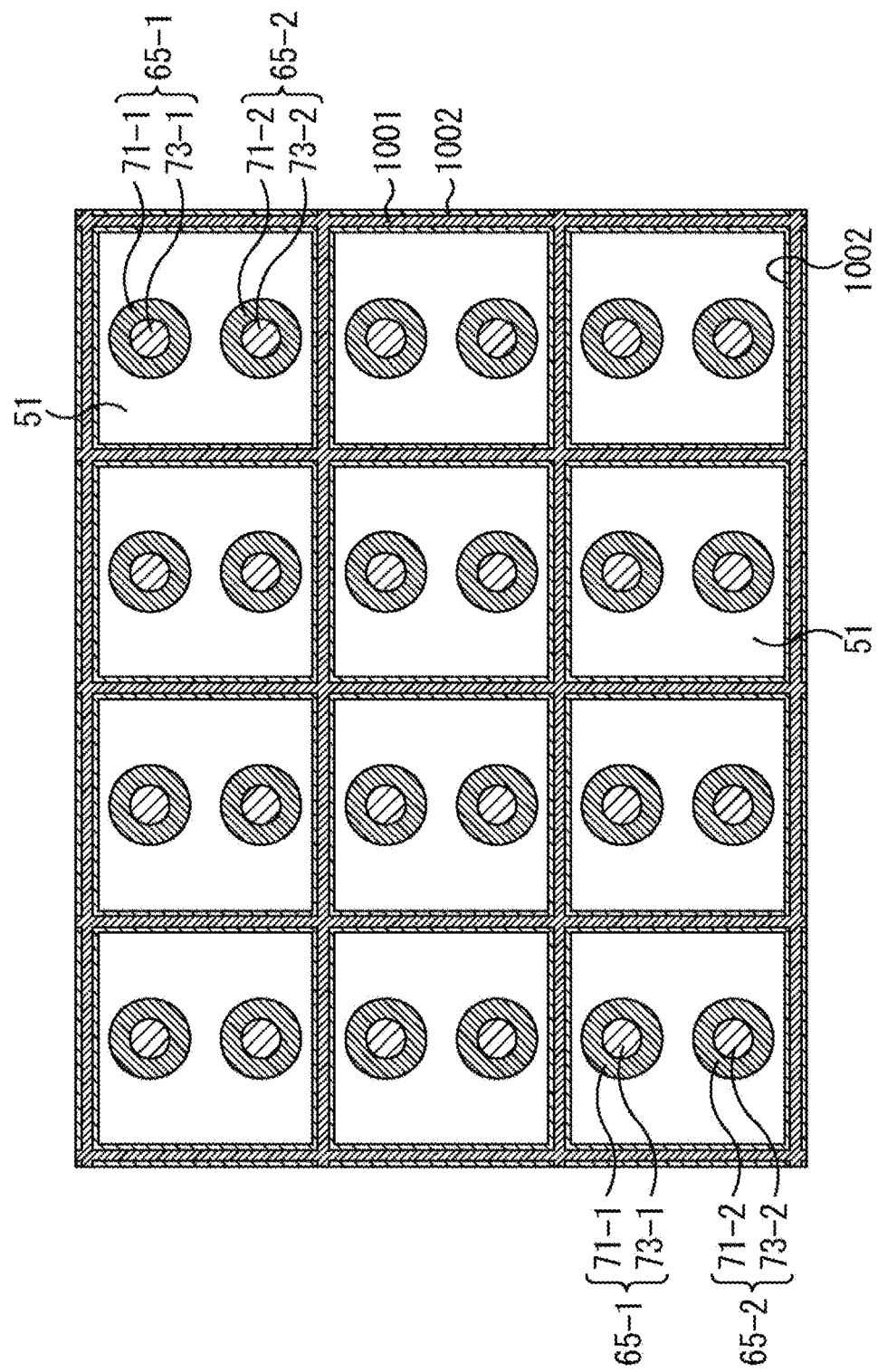
FIG. 49 is a plan view of a plurality of pixels of FIG. 48.

FIG. 49 is a plan view of a plurality of pixels 51 of FIG. 48 as viewed in plan.

As depicted in FIG. 49, the through electrode 1001 is arranged so as to have a lattice pattern at a boundary portion to a neighboring pixel 51, and the insulating film 1002 is formed so as to cover the side wall of the through electrode 1001.

With the pixel 51 according to the eighteenth embodiment, the through electrode 1001 as a pixel separation portion is formed at a boundary portion of the pixel 51, and a negative bias is applied to the through electrode 1001. Consequently, an electric field in a planar direction directed to the signal extraction portion 65 (tap) can be strengthened, and improvement of the quantum efficiency (QE) and high speed driving can be implemented. Further, the withstanding property for high speed driving is improved.

Figure 50:
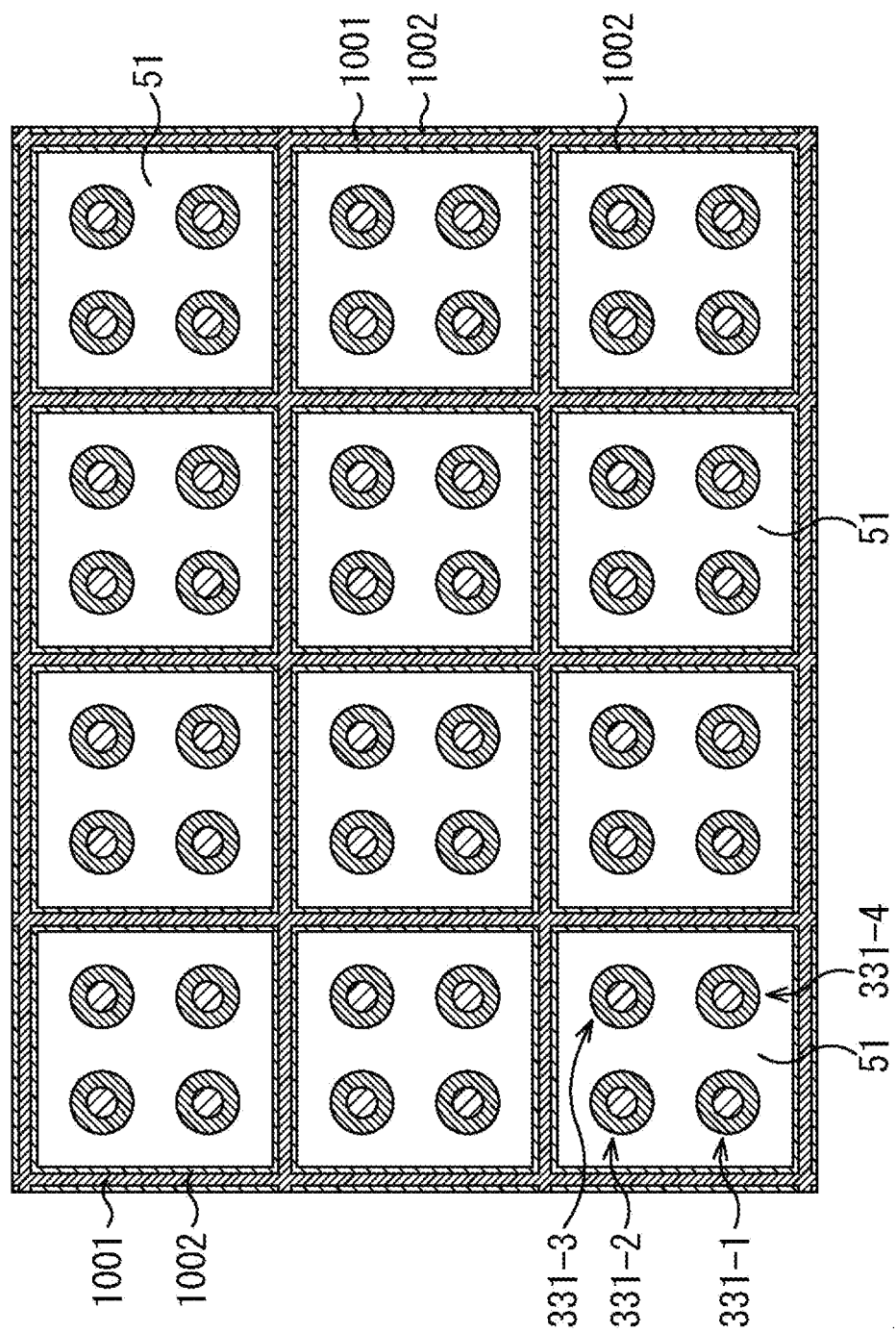
FIG. 50 is a plan view depicting an example of arrangement of a through electrode and an insulating film in a four-tap pixel structure.

It is to be noted that, although FIG. 49 depicts what is called a two-tap type pixel structure in which one pixel 51 has two signal extraction portions 65, a plan view in the case where the pixel 51 has what is called a four-tap pixel structure in which it has four signal extraction portions is such as depicted in FIG. 50.

FIG. 50 is a plan view depicting an example of arrangement of a through electrode 1001 and an insulating film 1002 in the four-tap pixel structure depicted in FIG. 17.

Also in the case where the pixel 51 has a four-tape pixel structure, the through electrode 1001 is arranged so as to have a lattice pattern at a boundary portion to a neighboring pixel 51 and the insulating film 1002 is formed so as to cover an outer periphery (side all) of the through electrode 1001 similarly as in the case of the two-tap type pixel 51.

Modification 1 of Eighteenth Embodiment

<Example of Configuration of Pixel>

Although, in the pixel 51 according to the eighteenth embodiment depicted in FIGS. 48 and 49, the through electrode 1001 and the insulating film 1002 are formed at a pixel boundary portion on the overall periphery of the pixel 51, the through electrode 1001 and the insulating film 1002 may otherwise be formed such that the outer periphery of the pixel 51 is divided into two.

Figure 51:
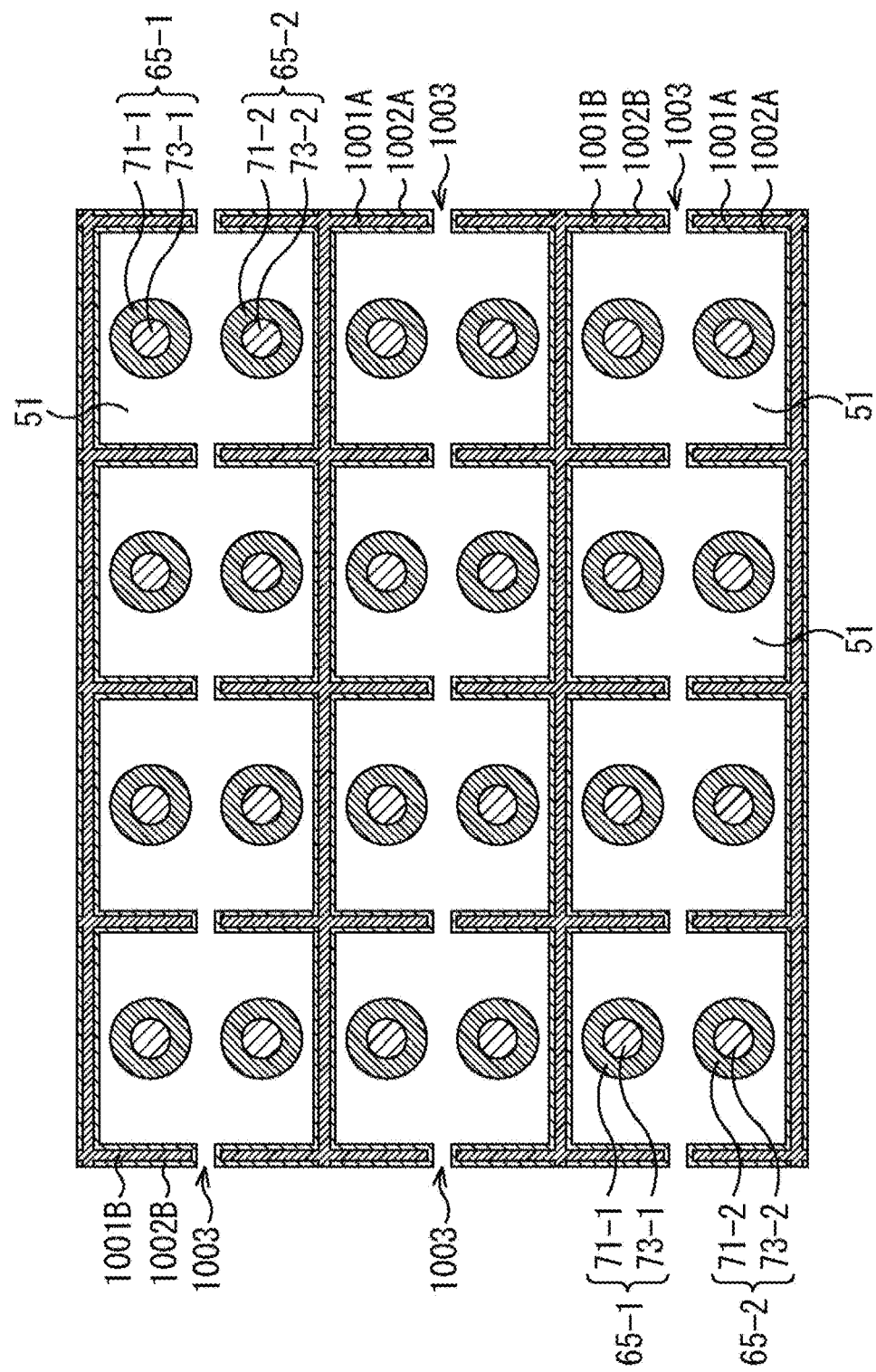
FIG. 51 is a plan view depicting a pixel of a two-tap pixel structure according to a modification of the eighteenth embodiment.

FIG. 51 is a plan view of a pixel according to a modification of the eighteenth embodiment in the case where the pixel 51 has a two-tap pixel structure.

In the case where the pixel 51 has a two-tap pixel structure, a gap portion 1003 is provided at a pixel boundary portion intersecting with an intermediate line (not depicted) between the two signal extraction portions 65 such that the through electrode 1001 and the insulating film 1002 are separated into a through electrode 1001A and an insulating film 1002A on the side of one of the signal extraction portions 65 and a through electrode 1001B and an insulating film 1002B on the other signal extraction portion 65 side.

Looking on the pixel-by-pixel basis, the through electrode 1001 and the insulating film 1002 of the pixel 51 are configured from the through electrode 1001A and the insulating film 1002A arranged on the pixel boundary portion on the one signal extraction portion 65 side and the through electrode 1001B and the insulating film 1002B arranged on the pixel boundary portion on the other signal extraction portion 65 side with reference to an intermediate line between the two signal extraction portions 65.

Figure 52:
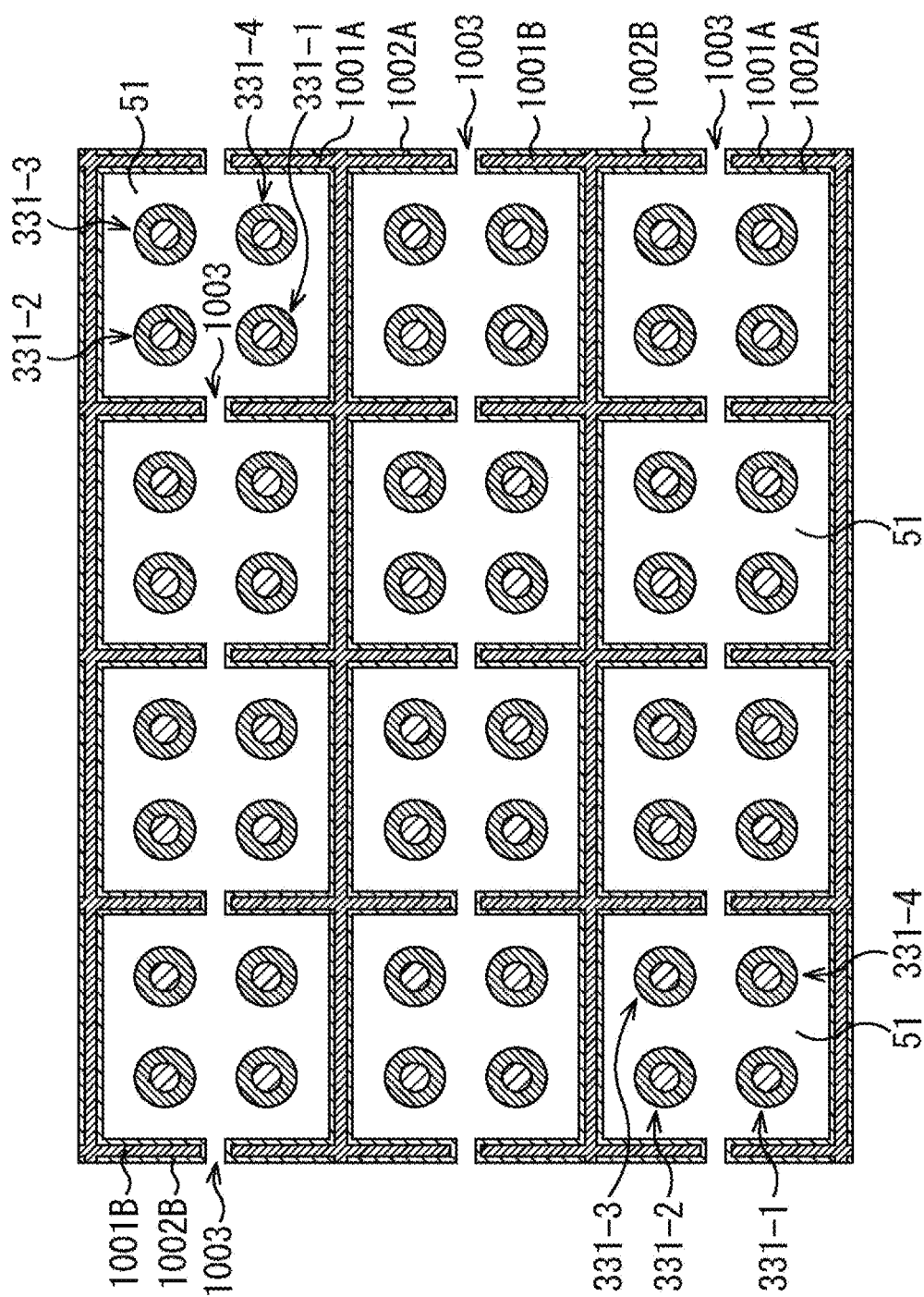
FIG. 52 is a plan view depicting a pixel of a four-tap pixel structure according to a modification of the eighteenth embodiment.

FIG. 52 is a plan view of a pixel according to the modification of the eighteenth embodiment in the case where the pixel 51 has a four-tap pixel structure.

In the case where the pixel 51 has a four-tap pixel structure, for example, by providing the gap portion 1003 at a pixel boundary portion that intersects with an intermediate line (not depicted) that divides the four signal extraction portions 65 into units of two pixels in the vertical direction or the horizontal direction, the through electrode 1001 and the insulating film 1002 are separated into the through electrode 1001A and the insulating film 1002A on a predetermine two signal extraction portions 65 side and the through electrode 1001B and the insulating film 1002B on the remaining two signal extraction portions 65 side. FIG. 52 depicts an example of a configuration in which the gap portion 1003 is provided at a pixel boundary portion intersecting with an intermediate line that divides the four signal extraction portions 65 into two units in the vertical direction.

As depicted in FIGS. 51 and 52, also in the case where the gap portion 1003 is provided at a boundary portion between neighboring pixels 51, by applying a negative bias to the through electrode 1001 through the voltage application wire 1011, improvement of the quantum efficiency (QE) and high speed driving can be implemented and the withstanding property of high speed driving is improved.

It is to be noted that, in the modification in which the gap portion 1003 is provided at part of a pixel separation portion, a negative bias may be applied to both of the through electrodes 1001A and 1001B at a same timing similarly as in the configuration of the pixel separation portion that surrounds the full periphery of the pixel without providing the gap portion 1003, or a negative bias may be applied at different timings.

Figure 53:
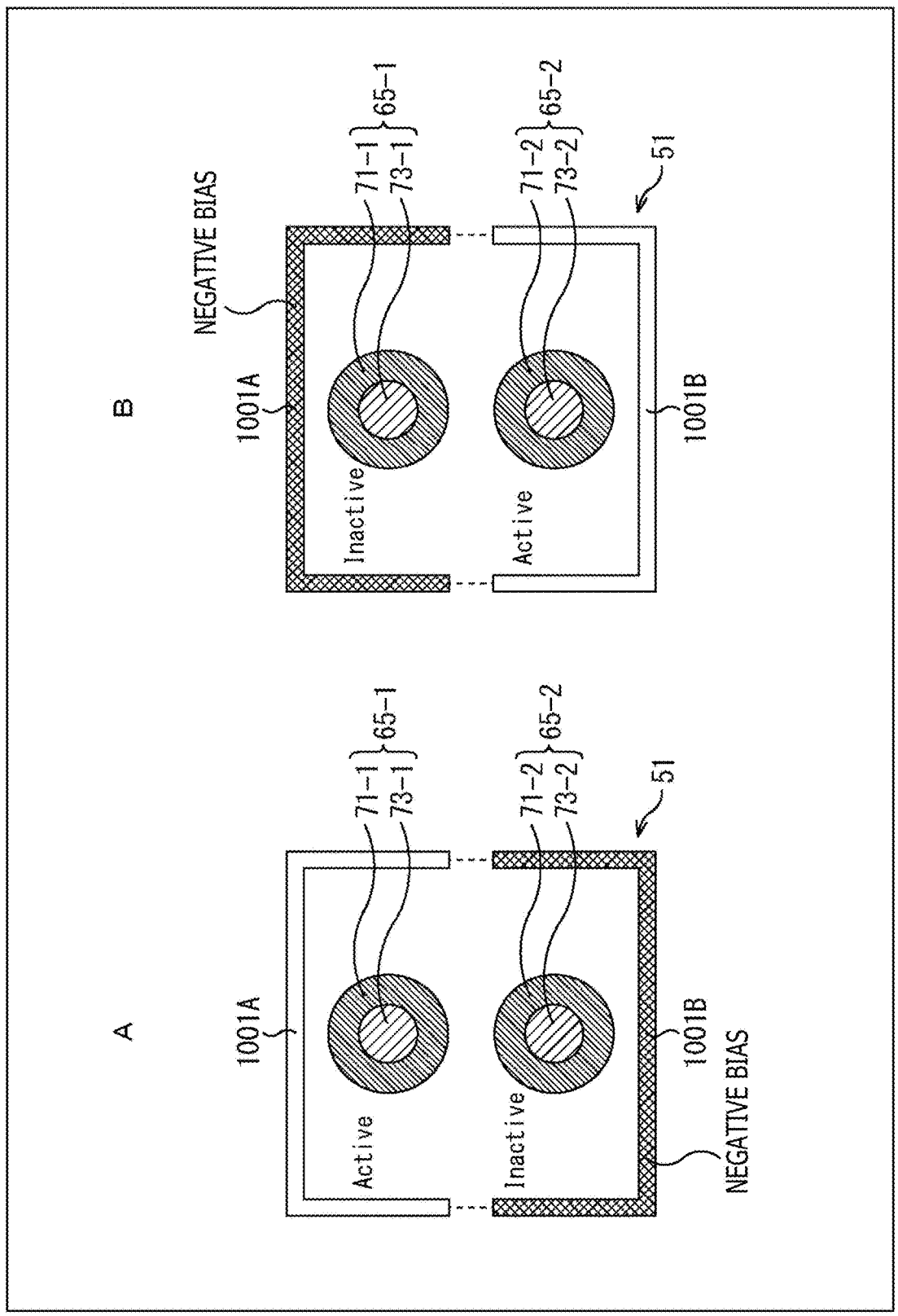
FIG. 53 is a view illustrating driving in which a negative bias is applied.

FIG. 53 is a view illustrating driving in the case where a negative bias is applied at timings different from each other to the through electrode 1001A and the through electrode 1001B in the case where the pixel 51 has a two-tap pixel structure.

For example, in the case where a positive voltage is applied to the P+ semiconductor region 73-1 of the signal extraction portion 65-1 such that the signal extraction portion 65-1 is made an active tape as indicated in A of FIG. 53, a negative bias is applied to the through electrode 1001B that is a pixel separation portion on the inactive tap side.

On the other hand, in the case where a positive voltage is applied to the P+ semiconductor region 73-2 of the signal extraction portion 65-2 such that the signal extraction portion 65-2 is made an active tap as depicted in B of FIG. 53, a negative bias is applied to the through electrode 1001A that is a pixel separation portion on the inactive tap side. For example, the tap driving section 21 can be constructed such that it performs the application of a negative bias.

By applying a negative bias to the pixel separation portion on the inactive tap side on the opposite side to the signal extraction portion 65 that is made an active tap, an electric field in the planar direction from the inactive tap side to the active tap side is strengthened, and therefore, improvement of the quantum efficiency (QE) and high speed driving can be implemented. Further, the withstanding property for high speed driving is improved.

Figure 54:
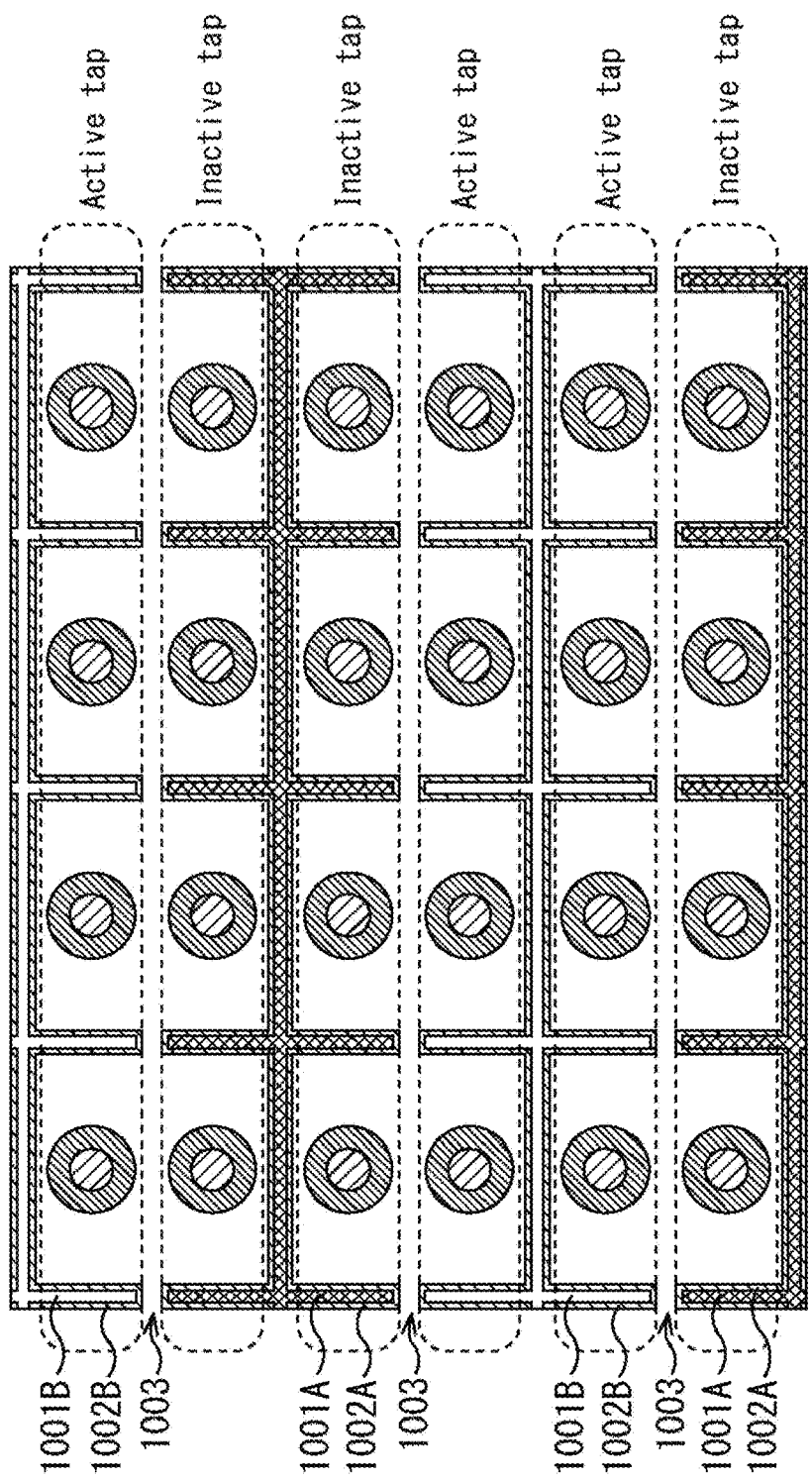
FIG. 54 is a view depicting driving in which a negative bias is applied at different timings.
Figure 55:
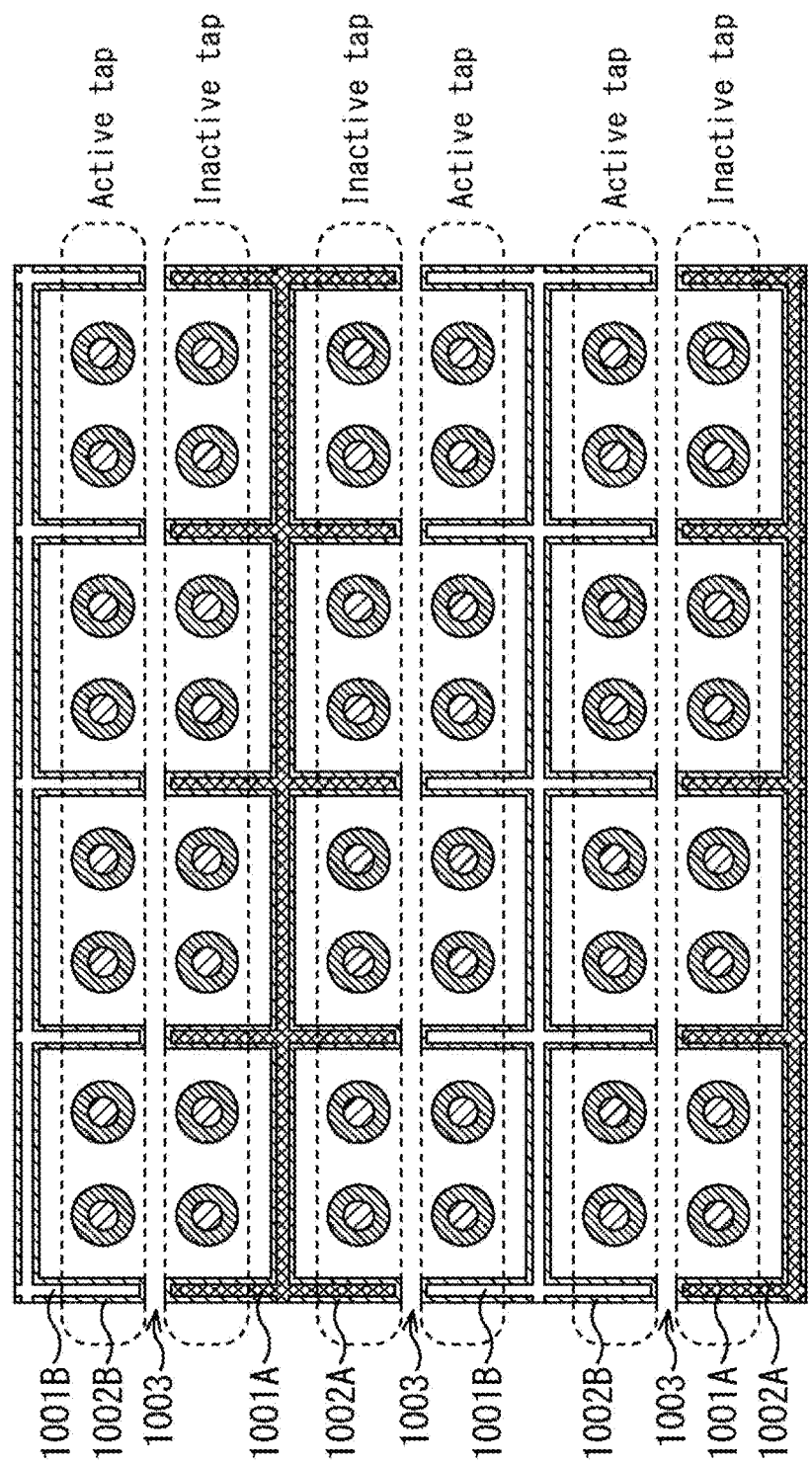
FIG. 55 is a view depicting driving in which a negative bias is applied at different timings.

FIGS. 54 and 55 are views depicting driving in which a negative bias is applied at different timings to a plurality of pixels 51 arranged two-dimensionally in a matrix.

FIG. 54 depicts driving in the case where the pixel 51 has a two-tap pixel structure, and FIG. 55 depicts driving in the case where the pixel 51 has a four-tap pixel structure.

Since each of the through electrodes 1001A and 1001B is shared by two pixels 51 neighboring in the vertical direction with each other, if it is assumed that the two pixels 51 neighboring in the vertical direction with each other is a first pixel 51 and a second pixel 51, then the signal extraction portion 65 on the lower side of the first pixel 51 and the signal extraction portion 65 on the upper side of the second pixel 51 are simultaneously made active taps, and corresponding to this, a negative bias is applied to the pixel separation portion (through the electrode 1001A or 1001B) on the inactive tap side. Accordingly, in the two pixels 51 neighboring in the vertical direction with each other, the positions of the signal extraction portion 65 that is made an active tap and the signal extraction portion 65 that is made an inactive tape are reverse to each other. Such driving can be implemented by the third and fourth arrangement examples of the voltage supply lines depicted in A and B of FIG. 34.

Nineteenth Embodiment

<Example of Configuration of Pixel>

Figure 56:
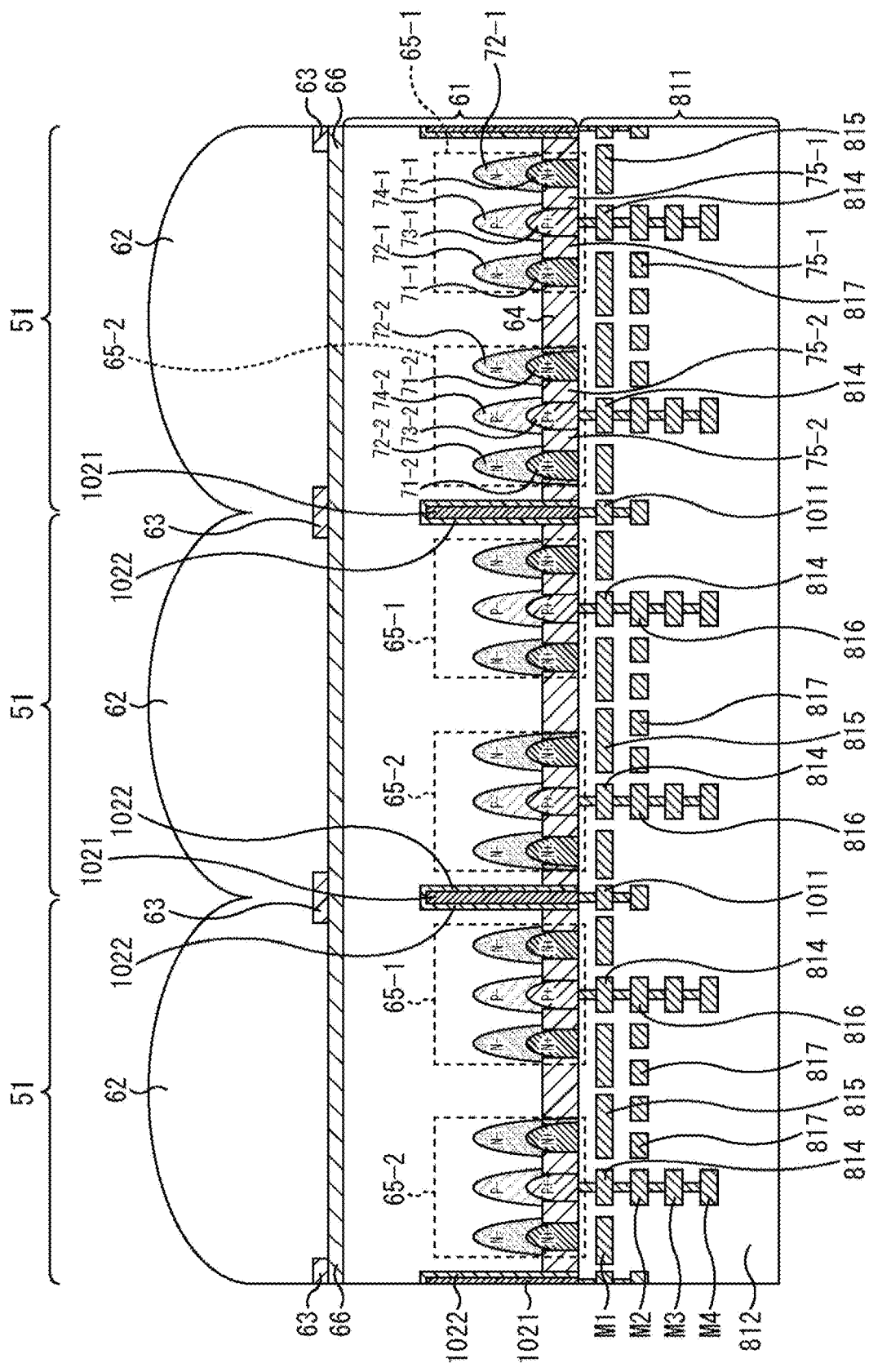
FIG. 56 is a sectional view of a plurality of pixels in a nineteenth embodiment.

FIG. 56 is a sectional view of a pixel according to a nineteenth embodiment.

FIG. 56 depicts a cross sectional view of a plurality of pixels taken along a line B-B' of FIG. 11 similarly to FIG. 36 and so forth described above.

Referring to FIG. 56, elements corresponding to those in the sectional view of a plurality of pixels of the fourteenth embodiment depicted in FIG. 36 are denoted by like reference characters to those in FIG. 36, and description of them is omitted suitably.

Comparing the configuration of the pixel 51 according to the nineteenth embodiment of FIG. 56 with the configuration of the pixel 51 according to the fourteenth embodiment depicted in FIG. 36, at a boundary portion of a neighboring pixel 51, a DTI (Deep Trench Isolation) 1021 that separates the neighboring pixel 51 and an insulating film 1022 that covers the outer periphery (side wall) of the DTI 1021 are formed newly such that they extend to a predetermined depth from the face on the multilayer wiring layer 811 side of the substrate 61 that is a P-type semiconductor layer. The DTI 1021 includes, for example, a metal material such as tungsten (W), aluminum (Al), copper (Cu), titanium (Ti), titanium nitride (TiN), tantalum (Ta) or tantalum nitride (TaN), or polysilicon or the like. The insulating film 1022 includes, for example, silicon oxide ($SiO_2$), silicon oxynitride (SiON) or the like. The material of the insulating film 1022 may otherwise be an oxide or a nitride that contains at least one element from among hafnium (Hf), aluminum (Al), zirconium (Zr), tantalum (Ta) or titanium (Ti), and an oxide or a nitride that contains at least one element from among lanthanum (La), praseodymium (Pr), cerium (Ce), neodymium (Nd), promethium (Pm), samarium (Sm), europium (Eu), gadolinium (Gd), terbium (Tb), dysprosium (Dy), holmium (Ho), thulium (Tm), ytterbium (Yb), lutetium (Lu) or yttrium (Y) or the like. The DTI 1021 functions as a pixel separation portion for separating semiconductor layers (substrates 61) of neighboring pixels 51. It is to be noted that also it is possible to grasp that the pixel separation portion is configured from the DTI 1021 including the insulating film 1022 on the outer periphery and the insulating film 1022.

The DTI 1021 is electrically connected to the voltage application wire 1011 of the metal film M1 that is a metal layer nearest to the substrate 61 in the multilayer wiring layer 811, and a negative bias is applied to the DTI 1021 through the voltage application wire 1011. Here, the negative bias applied to the DTI 1021 is a voltage lower than a voltage applied to the P+ semiconductor region 73 of the signal extraction portion 65 that is made an inactive tap.

The DTI 1021 and the insulating film 1022 can be formed by forming a trench from the front face side (multilayer wiring layer 811 side) of the substrate 61 to a predetermined depth by dry etching or the like, forming the insulating film 1022 and then filling polysilicon or metal material from which the DTI 1021 is to be formed.

Comparing the configuration of the pixel 51 according to the nineteenth embodiment of FIG. 56 with the configuration of the pixel 51 according to the eighteenth embodiment depicted in FIG. 48, the pixel 51 according to the nineteenth embodiment is common in that a pixel separation portion that separates the substrate 61 that is a P-type semiconductor layer is provided at a pixel boundary portion and a negative bias is applied to the pixel separation portion through the voltage application wire 1011. On the other hand, the pixel 51 according to the eighteenth embodiment is different from the pixel 51 according to the eighteenth embodiment depicted in FIG. 48 in that the DTI 1021 and the insulating film 1022 do not extend through the substrate 61 but are formed only to a position of a predetermined depth from the rear face side of the substrate 61.

Although a plan view of the DTI 1021 and the insulating film 1022 is omitted, the DTI 1021 is arranged so as to have a comb pattern at the boundary portion of the two-dimensionally arranged pixels 51, and the insulating film 1022 is formed so as to cover the side wall of the DTI 1021.

With the pixel 51 according to the nineteenth embodiment, the DTI 1021 is formed as a pixel separation portion at a boundary portion of the pixel 51, and a negative bias is applied to the DTI 1021. Consequently, an electric field in a planar direction directed to the signal extraction portion 65 (tap) can be strengthened, and improvement of the quantum efficiency (QE) and high speed driving can be implemented. Further, the withstanding property for high speed driving is improved.

Twentieth Embodiment

<Example of Configuration of Pixel>

Figure 57:
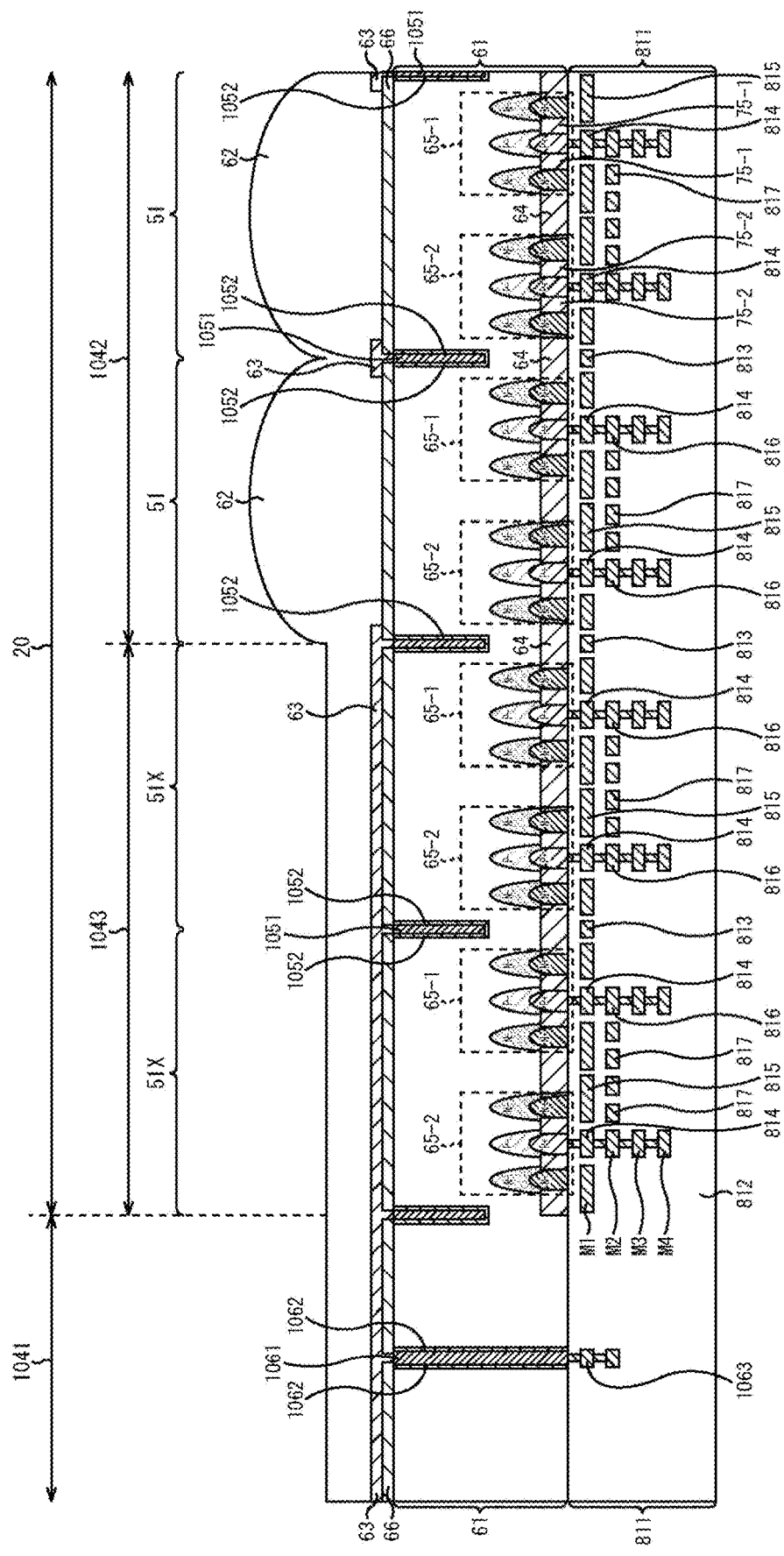
FIG. 57 is a sectional view of a plurality of pixels in a twentieth embodiment.

FIG. 57 is a sectional view of a pixel according to a twentieth embodiment.

In FIG. 57, elements corresponding to those in the sectional view of a plurality of pixels of the fourteenth embodiment depicted in FIG. 36 are denoted by like reference characters to those in FIG. 36, and description of them is omitted suitably.

FIG. 57 depicts a sectional view of a plurality of pixels taken along line B-B' of FIG. 11 and depicts a sectional view of a pixel array section 20 in which pixels 51 are arranged two-dimensionally in a matrix and a peripheral circuit section 1041 around the pixel array section 20. In the peripheral circuit section 1041, for example, a tap driving section 21, a vertical driving section 22 and so forth are formed as described hereinabove with reference to FIG. 1.

Figure 58:
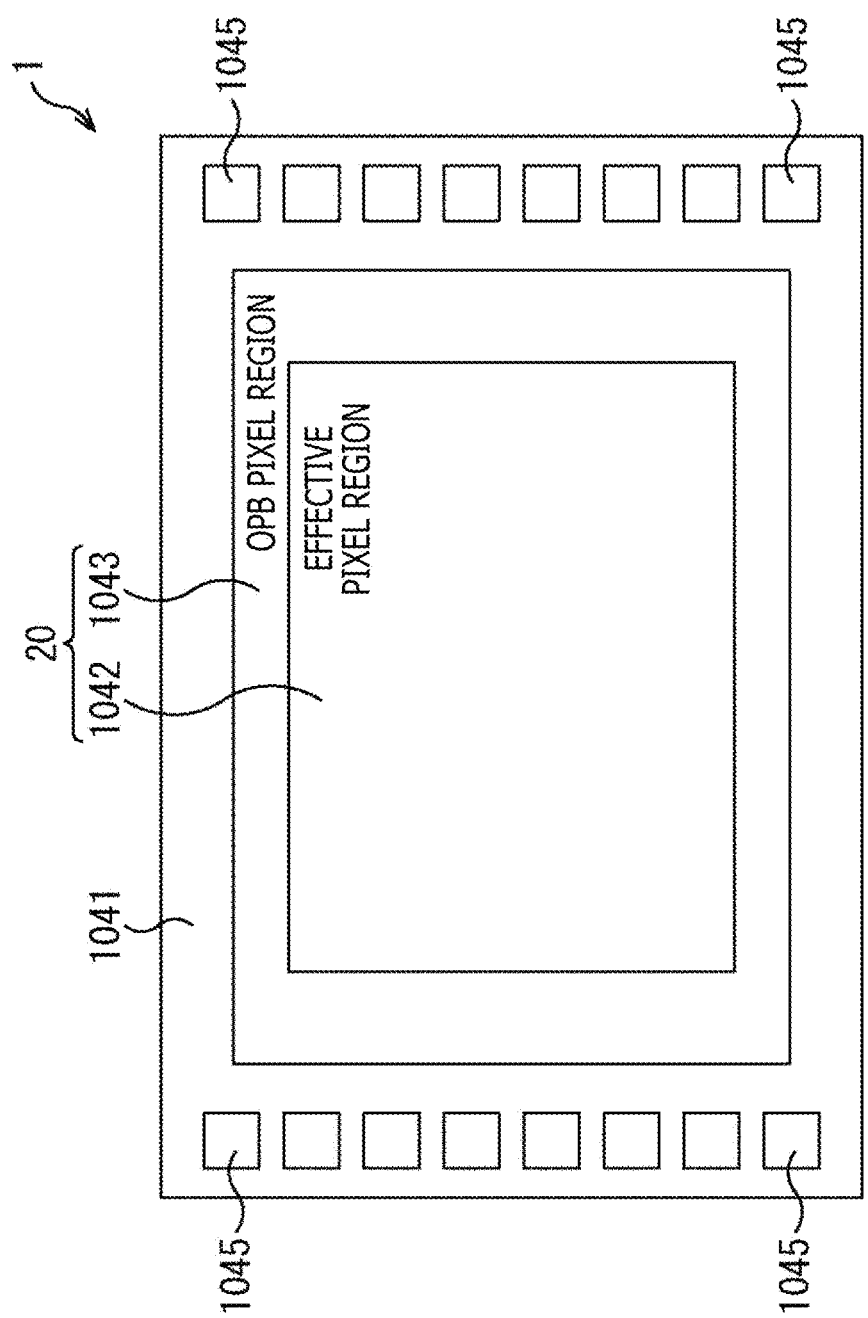
FIG. 58 is a plan view depicting a positional relationship between a pixel array section and a peripheral circuit section.

FIG. 58 is a plan view depicting a positional relationship between the pixel array section 20 and the peripheral circuit section 1041.

As depicted in FIG. 58, the pixel array section 20 is configured from an effective pixel region 1042 in which a plurality of pixels 51 is arranged and an OPB pixel region 1043 around the effective pixel region 1042. Further, the peripheral circuit section 1041 is arranged on an outer peripheral portion of the pixel array section 20. In the peripheral circuit section 1041, a plurality of electrode pads 1045 as input/output terminals of the light reception devices 1 is formed.

Referring back to FIG. 57, in the effective pixel region 1042 of the pixel array section 20, pixels 51 that output a signal according to a light amount of incident light are arranged in a matrix. In the OPB pixel region 1043, shading pixels 51X in which an inter-pixel shading film 63 is formed over an overall area of the pixel region are arranged. The inter-pixel shading film 63 is formed on the fixed charge film 66 of the pixel array section 20 and the effective pixel region 1042 except an opening of each pixel 51 in the effective pixel region 1042 (other than pixel boundary portions). It is to be noted that, although, in the example of FIG. 57, the shading pixels 51X are formed in two columns or two rows, they may otherwise be configured in one column or in one row or may be configured in three or more columns or three or more rows.

Comparing the configuration of the pixel 51 according to the twentieth embodiment of FIG. 57 with the configuration of the pixel 51 according to the fourteenth embodiment depicted in FIG. 36, at a boundary portion of a neighboring pixel 51, a DTI (Deep Trench Isolation) 1051 that separates the neighboring pixel 51 and an insulating film 1052 that covers the outer periphery (side wall) of the DTI 1051 are newly formed such that they extend to a predetermined depth from the light incident face of the substrate 61 that is a P-type semiconductor layer. The DTI 1051 includes a metal material such as, for example, tungsten (W), aluminum (Al), copper (Cu), titanium (Ti), titanium nitride (TiN), tantalum (Ta) or tantalum nitride (TaN), or polysilicon or the like. The insulating film 1052 includes, for example, silicon oxide ($SiO_2$), silicon oxynitride (SiON) or the like. The material of the insulating film 1052 may otherwise be an oxide or a nitride that contains at least one element from among hafnium (Hf), aluminum (Al), zirconium (Zr), tantalum (Ta) or titanium (Ti), and an oxide or a nitride that contains at least one element from among lanthanum (La), praseodymium (Pr), cerium (Ce), neodymium (Nd), promethium (Pm), samarium (Sm), europium (Eu), gadolinium (Gd), terbium (Tb), dysprosium (Dy), holmium (Ho), thulium (Tm), ytterbium (Yb), lutetium (Lu) or yttrium (Y) or the like. The DTI 1051 functions as a pixel separation portion for separating semiconductor layers (substrates 61) of neighboring pixels 51. It is to be noted that also it is possible to grasp that the pixel separation portion is configured from the DTI 1051 including the insulating film 1052 on the outer periphery and the insulating film 1052. The DTI 1051 and the insulating film 1052 are formed also on a boundary portion of the neighboring shading pixel 51X in the OPB pixel region 1043 together with that in the pixels 51.

The DTI 1051 and the insulating film 1052 can be formed by forming a trench from the flight incident side (front face side) of the substrate 61 to a predetermined depth by dry etching or the like, forming the insulating film 1052 and then filling polysilicon or metal material from which the DTI 1051 is to be formed.

Although a plan view of the DTI 1051 and the insulating film 1052 is omitted, the DTI 1051 is arranged so as to have a comb pattern at the boundary portion of the two-dimensionally arranged pixels 51 similarly as in FIG. 49, and the insulating film 1052 is formed so as to cover the side wall of the DTI 1051.

The DTI 1051 is connected to the inter-pixel shading film 63 on the light incident face side of the substrate 61. The inter-pixel shading film 63 is connected also to a through electrode 1061 formed in the peripheral circuit section 1041, and the through electrode 1061 is connected to a voltage application wire 1063 of the multilayer wiring layer 811. The outer periphery (side wall) of the through electrode 1061 is covered with an insulating film 1062.

To the voltage application wire 1063 formed in the multilayer wiring layer 811 of the peripheral circuit section 1041, a negative bias (negative voltage) is supplied, and the negative bias is applied to the DTI 1051 through the through electrode 1061 and the inter-pixel shading film 63.

Comparing the configuration of the pixel 51 according to the twentieth embodiment of FIG. 57 with the configuration of the pixel 51 according to the eighteenth embodiment depicted in FIG. 48, the pixel 51 according to the twentieth embodiment is common in that a pixel separation portion for separating the substrate 61 that is a P-side semiconductor layer is provided at a pixel boundary portion of the pixel 51 and a negative bias is applied to the pixel separation portion through a predetermined voltage application wire.

On the other hand, the pixel 51 according to the twentieth embodiment is different from the pixel 51 according to the eighteenth embodiment depicted in FIG. 48 in that the DTI 1051 and the insulating film 1052 do not extend through the substrate 61 and are formed only to a position of a predetermined depth from the light incident face side of the substrate 61. Further, the pixel 51 according to the twentieth embodiment is different also in that, to the DTI 1051 as a pixel separation portion, a negative bias is applied to the DTI 1051 from the voltage application wire 1063 formed in the peripheral circuit section 1041 on the outer side of the pixel array section 20 through the through electrode 1061 formed in the peripheral circuit section 1041 and the inter-pixel shading film 63 on the upper face of the fixed charge film 66. It is to be noted that not the configuration that a negative bias is applied to the DTI 1051 from the voltage application wire 1063 of the peripheral circuit section 1041 through the inter-pixel shading film 63 but a different configuration that a negative bias is supplied from the outside of the light reception device 1 to the inter-pixel shading film 63 on the upper face of the fixed charge film 66 and supplied to the DTI 1051.

With the pixel 51 according to the twentieth embodiment, the DTI 1051 is formed as a pixel separation portion at a boundary portion of the pixel 51 and a negative bias is applied to the DTI 1051. Consequently, an electric field in a planar direction directed to the signal extraction portion 65 (tap) can be strengthened, and improvement of the quantum efficiency (QE) and high speed driving can be implemented. Further, the withstanding property for high speed driving is improved.

Twenty-First Embodiment

<Example of Configuration of Pixel>

Figure 59:
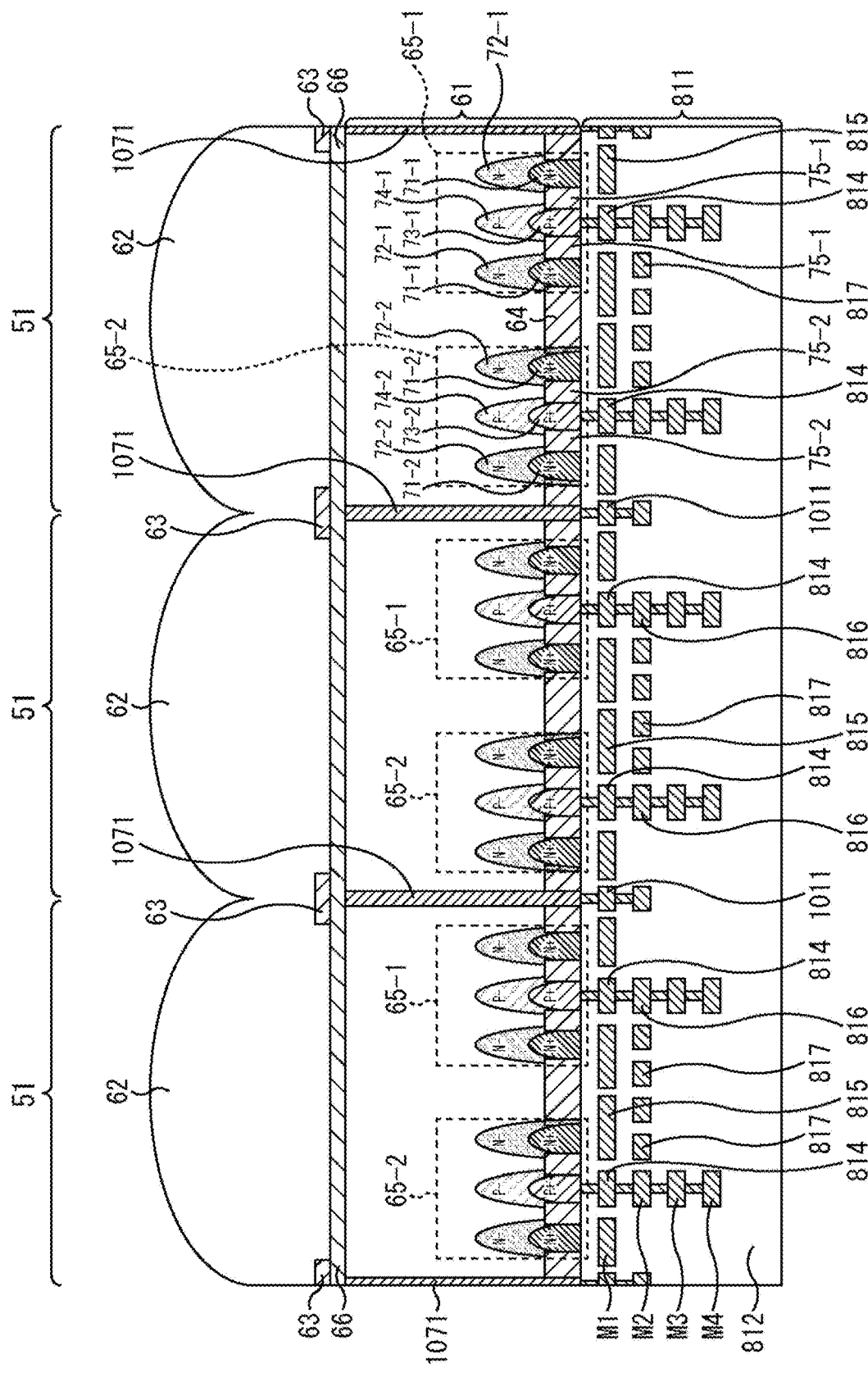
FIG. 59 is a sectional view of a plurality of pixels in a twenty-first embodiment.

FIG. 59 is a sectional view of a pixel according to a twenty-first embodiment.

FIG. 59 depicts a sectional view of a plurality of pixels taken along line B-B' of FIG. 11 similarly to FIG. 36 and so forth described hereinabove.

In FIG. 59, elements corresponding to those in the sectional view of a plurality of pixels of the fourteenth embodiment depicted in FIG. 36 are denoted by like reference characters to those in FIG. 36, and description of them is omitted suitably.

Comparing the configuration of the pixel 51 according to the twenty-first embodiment of FIG. 59 with the configuration of the pixel 51 according to the fourteenth embodiment depicted in FIG. 36, a P+semiconductor region 1071 that is a P-type semiconductor region of a high concentration is newly formed, for example, by ion implantation in the overall region in the depthwise direction of the substrate 61 at a boundary portion of the neighboring pixel 51. The P+ semiconductor region 1071 functions as a pixel separation portion that separates semiconductor layers (substrates 61) of neighboring pixels 51 from each other.

The P+ semiconductor region 1071 is electrically connected to the voltage application wire 1011 of the metal film M1 that is a metal layer nearest to the substrate 61 in the multilayer wiring layer 811, and a negative bias is applied to the P+ semiconductor region 1071 through the voltage application wire 1011.

Although a plan view of the P+ semiconductor region 1071 is omitted, the P+ semiconductor region 1071 is formed so as to have a lattice pattern at a boundary portion of pixels 51 arranged two-dimensionally similarly as in FIG. 49.

With the pixel 51 according to the twenty-first embodiment, the P+ semiconductor region 1071 as a pixel separation portion is formed at a boundary portion of a neighboring pixel 51, and a negative bias is applied to the P+ semiconductor region 1071. Consequently, an electric field in a planar direction directed to the signal extraction portion 65

(tap) can be strengthened, and improvement of the quantum efficiency (QE) and high speed driving can be implemented. Further, the withstanding property for high speed driving is improved.

The eighteenth to twenty-first embodiments described above are configured such that a negative bias is applied to a pixel separation portion formed at a pixel boundary portion of a pixel 51. Here, the negative bias is a voltage lower than a voltage (0 V) applied to the P+ semiconductor region 73 of the signal extraction portion 65 that is made an inactive tap. Consequently, an electric field in a planar direction directed to the signal extraction portion 65 (tap) can be strengthened, and improvement of the quantum efficiency (QE) and high speed driving can be implemented. Further, the withstanding property for high speed driving is improved.

Twenty-Second Embodiment

<Example of Configuration of Pixel>

Now, in addition to the eighteenth to twenty-first embodiments described above, further embodiments are described.

Although the foregoing description of the eighteenth to twenty-first embodiments described above is directed to the configuration that a negative bias is applied using a pixel separation portion formed at a boundary portion of a neighboring pixel 51 to strengthen an electric field in a planar direction, the twenty-second to twenty-fifth embodiments described below are directed to a configuration that an electric field in a depthwise direction perpendicular to the substrate 61 is strengthened.

Figure 60:
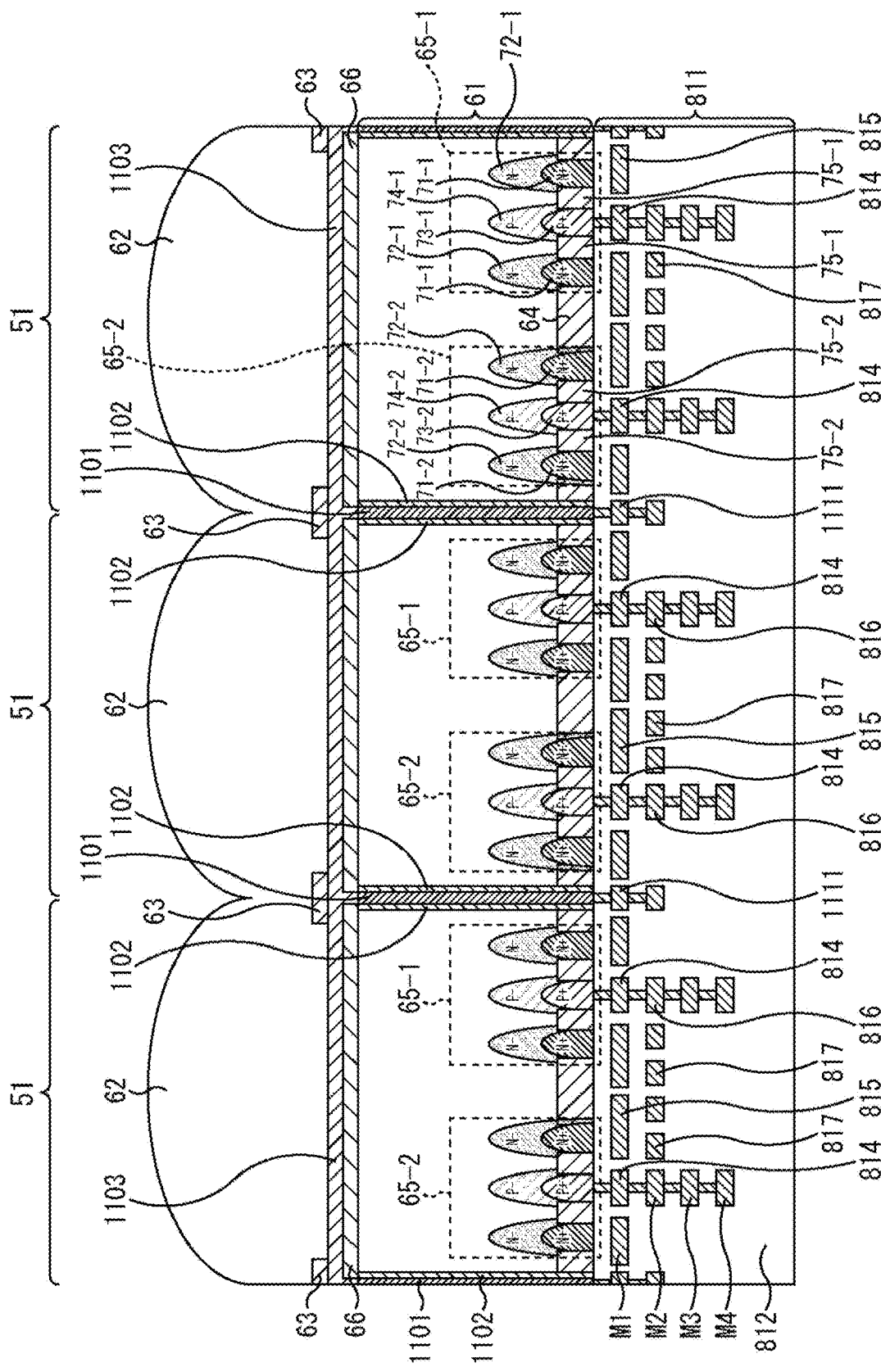
FIG. 60 is a sectional view of a plurality of pixels in a twenty-second embodiment.

FIG. 60 is a sectional view of a pixel according to the twenty-second embodiment.

FIG. 60 depicts a sectional view of a plurality of pixels taken along line B-B' of FIG. 11 similarly to FIG. 36 and so forth described hereinabove.

In FIG. 60, elements corresponding to those in the sectional view of a plurality of pixels of the fourteenth embodiment depicted in FIG. 36 are denoted by like reference characters to those in FIG. 36, and description of them is omitted suitably.

Comparing the configuration of the pixel 51 according to the twenty-second embodiment of FIG. 60 with the configuration of the pixel 51 according to the fourteenth embodiment depicted in FIG. 36, at a pixel boundary portion of a neighboring pixel 51, a through-electrode 1101 that extends through the substrate 61 that is a P-type semiconductor layer and separates the neighboring pixel 51 and an insulating film 1102 that covers the outer periphery (side wall) of the through-electrode 1101 are newly formed such that they extend through the substrate 61 that is a P-type semiconductor layer. The through-electrode 1101 includes a metal material such as, for example, tungsten (W), aluminum (Al), copper (Cu), titanium (Ti), titanium nitride (TiN), tantalum (Ta) or tantalum nitride (TaN), or polysilicon or the like. The insulating film 1102 includes, for example, silicon oxide ($SiO_2$), silicon oxynitride (SiON) or the like. The material of the insulating film 1102 may otherwise be an oxide or a nitride that contains at least one element from among hafnium (Hf), aluminum (Al), zirconium (Zr), tantalum (Ta) and titanium (Ti), an oxide or a nitride that contains at least one element from among lanthanum (La), praseodymium (Pr), cerium (Ce), neodymium (Nd), promethium (Pm), samarium (Sm), europium (Eu), gadolinium (Gd), terbium (Tb), dysprosium (Dy), holmium (Ho), thulium (Tm), ytterbium (Yb), lutetium (Lu) and yttrium (Y) or the like. The through-electrode 1101 functions as a pixel separation portion for separating semiconductor layers (substrates 61) of neighboring pixels 51. It is to be noted that also it is possible to grasp that the pixel separation portion is configured from the through-electrode 1101 including the insulating film 1102 on the outer periphery and the insulating film 1102.

The through-electrode 1101 and the insulating film 1102 can be formed by forming a trench from the front face side or rear face side of the substrate 61 to the reverse side substrate face by dry etching or the like, forming the insulating film 1102 and then filling polysilicon or metal material from which the through-electrode 1101 is to be formed.

A transparent conductive film 1103 is formed on an upper face of the fixed charge film 66 formed on the light incident face of the substrate 61 of each pixel 51, and the transparent conductive film 1103 is connected to the through-electrode 1101 at a boundary portion of the pixel 51. For the transparent conductive film 1103, such materials as ITO (Indium-tin-oxide), ZnO, SnO, $Cd2SnO_4$ and $TiO_2$:Nb can be adopted.

The through-electrode 1101 is electrically connected to a voltage application wire 1111 in the metal film M1 that is a metal film nearest to the substrate 61 in the multilayer wiring layer 811, and to the voltage application wire 1111, a negative bias is supplied. The negative bias of the voltage application wire 1111 is applied to the fixed charge film 66 through the through-electrode 1101 and the transparent conductive film 1103.

With the pixel 51 according to the twenty-second embodiment, the through-electrode 1101 is formed as a pixel separation portion at a boundary portion of the pixel 51 and the transparent conductive film 1103 is formed on the upper face of the fixed charge film 66. Further, a negative bias supplied from the voltage application wire 1111 of the multilayer wiring layer 811 is applied to the fixed charge film 66 through the through-electrode 1101 and the transparent conductive film 1103. Consequently, an electric field in a depthwise direction directed to the signal extraction portion 65 (tap) from the light incident face of the substrate 61 can be strengthened, and improvement of the quantum efficiency (QE) and high speed driving can be implemented. Further, the withstanding property for high speed driving is improved.

It is to be noted that, in the case where the fixed charge film 66 is not formed on the light incident face of the substrate 61 in the pixel 51, a configuration can be adopted that an insulating film formed from an oxide film or the like is formed on the light incident face of the substrate 61 and a negative bias is applied to the insulating film through the through-electrode 1101 and the transparent conductive film 1103. The insulating film is not limited to a single layer film but may be a stacked film.

Twenty-Third Embodiment

<Example of Configuration of Pixel>

Figure 61:
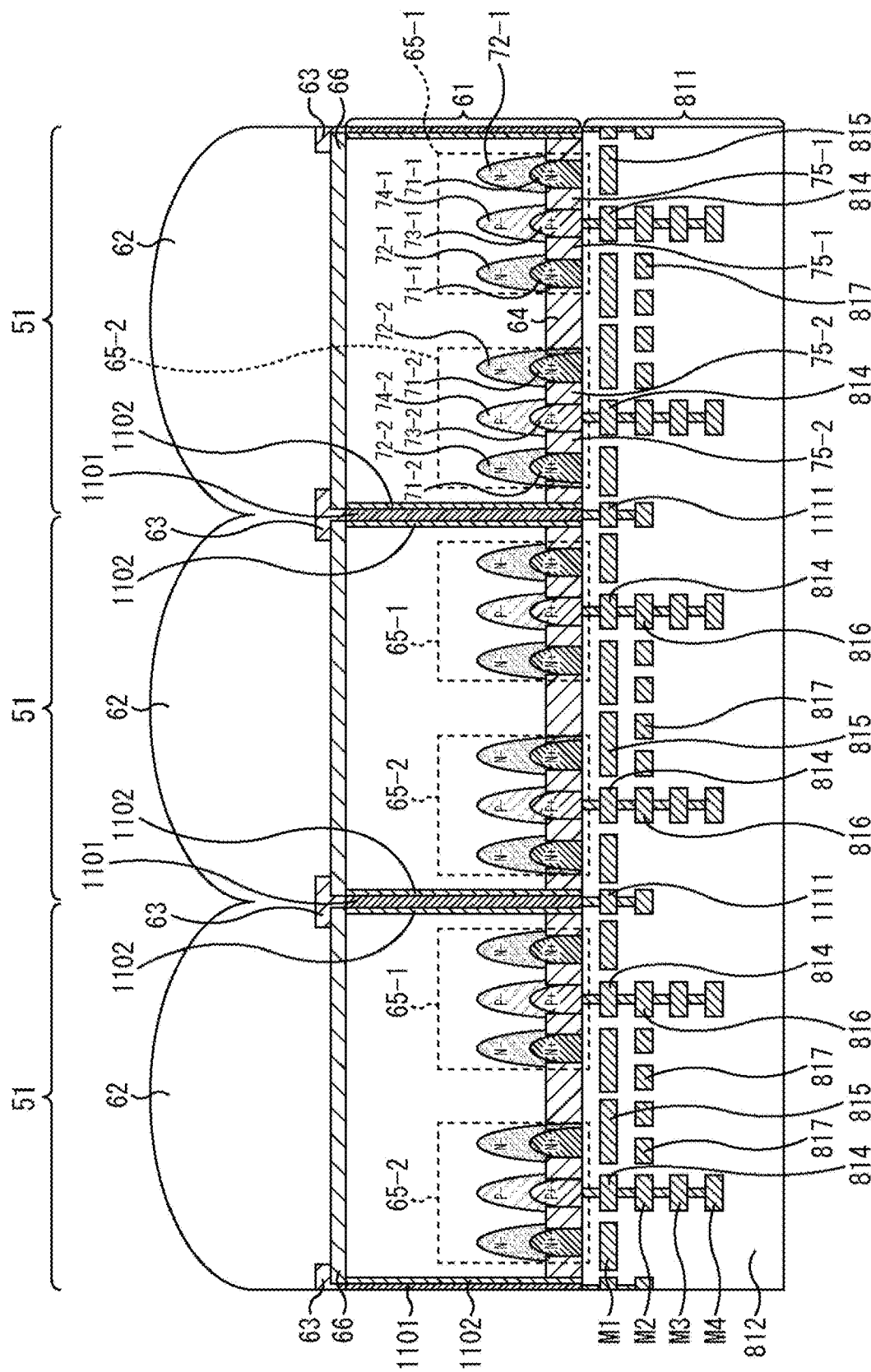
FIG. 61 is a sectional view of a plurality of pixels in a twenty-third embodiment.

FIG. 61 is a sectional view of a pixel according to the twenty-third embodiment.

FIG. 61 depicts a sectional view of a plurality of pixels taken along line B-B' of FIG. 11 similarly to FIG. 60 and so forth.

In FIG. 61, elements corresponding to those in the sectional view of a plurality of pixels of the twenty-second embodiment depicted in FIG. 60 are denoted by like reference characters, and description of them is omitted suitably.

Comparing the configuration of the pixel 51 according to the twenty-third embodiment of FIG. 61 with the configuration of the pixel 51 according to the twenty-second embodiment depicted in FIG. 60, the pixel 51 according to the twenty-third embodiment is common in that the through-electrode 1101 and the insulating film 1102 that covers an outer periphery (side wall) of the through-electrode 1101 are formed at a boundary portion of the pixel 51. Further, the through-electrode 1101 is electrically connected to the voltage application wire 1111 of the metal film M1 nearest to the substrate 61 of the multilayer wiring layer 811 and a negative bias is supplied to the voltage application wire 1111.

On the other hand, although, in the pixel 51 according to the twenty-second embodiment depicted in FIG. 60, the transparent conductive film 1103 is formed on the upper face of the fixed charge film 66, the twenty-third embodiment of FIG. 61 is different in that the transparent conductive film 1103 is not formed and the inter-pixel shading film 63 extends through the fixed charge film 66 and is connected to the through-electrode 1101. The inter-pixel shading film 63 includes a metal material such as, for example, tungsten (W), aluminum (Al) or copper (Cu) and has a shading property and conductivity.

With such a pixel 51 according to the twenty-third embodiment as described above, the through-electrode 1101 is formed as a pixel separation portion at a boundary portion of the pixel 51 and the through-electrode 1101 is connected to the inter-pixel shading film 63. Further, a negative bias supplied from the voltage application wire 1111 of the multilayer wiring layer 811 is applied to the fixed charge film 66 through the through-electrode 1101 and the inter-pixel shading film 63. Consequently, an electric field in a depthwise direction directed to the signal extraction portion 65 (tap) from the light incident face of the substrate 61 can be strengthened, and improvement of the quantum efficiency (QE) and high speed driving can be implemented. Further, the withstanding property for high speed driving is improved.

It is to be noted that, in the case where the fixed charge film 66 is not formed on the light incident face of the substrate 61 in the pixel 51, a configuration can be adopted that an insulating film formed from an oxide film or the like is formed on the light incident face of the substrate 61 and a negative bias is applied to the insulating film through the through-electrode 1101 and the inter-pixel shading film 63. The insulating film is not limited to a single layer film but may be a stacked film.

Twenty-Fourth Embodiment

<Example of Configuration of Pixel>

Figure 62:
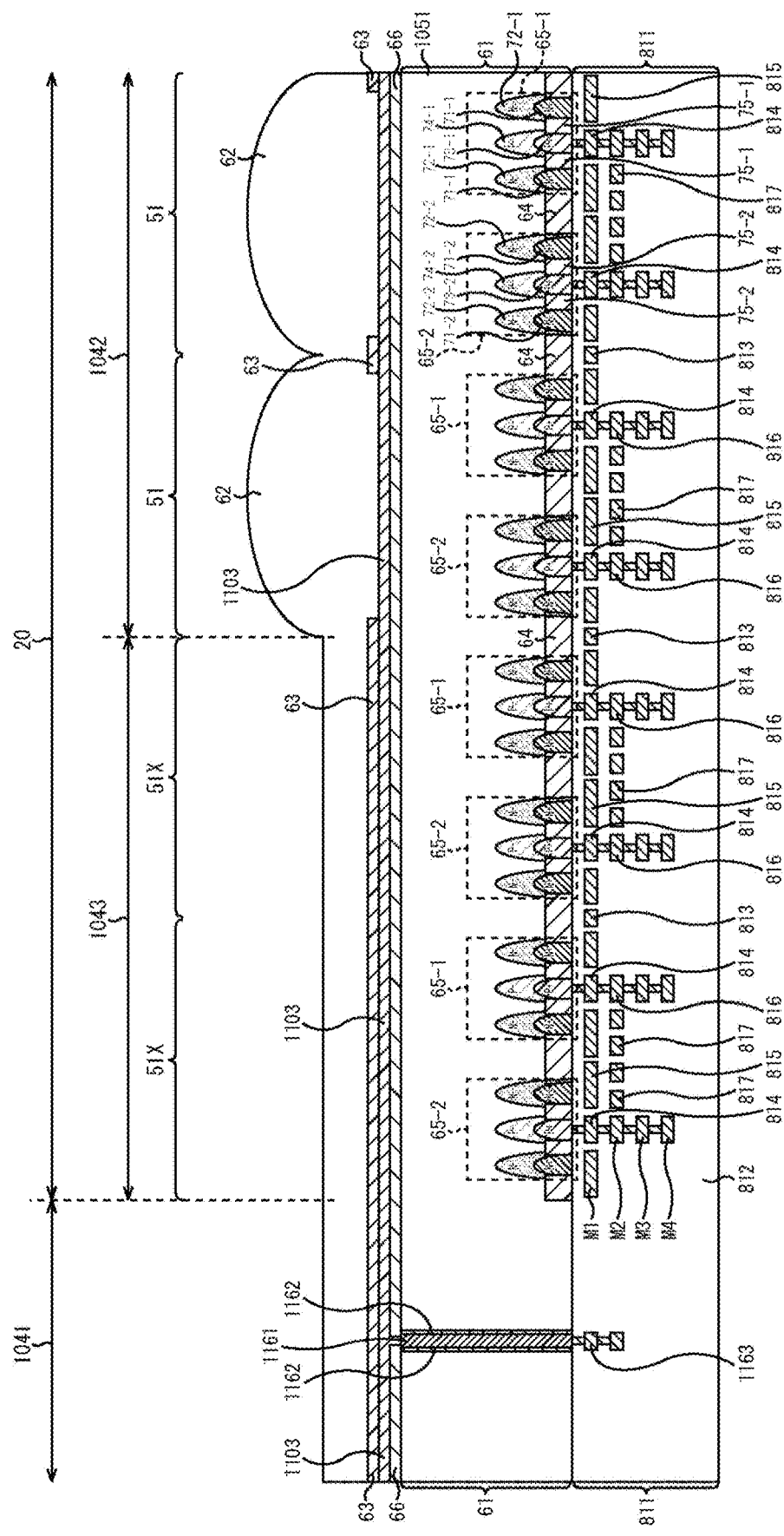
FIG. 62 is a sectional view of a plurality of pixels in a twenty-fourth embodiment.

FIG. 62 is a sectional view of a pixel according to a twenty-fourth embodiment.

FIG. 62 depicts a sectional view of a plurality of pixels taken along line B-B' of FIG. 11 similarly to FIG. 60 and so forth.

In FIG. 62, elements corresponding to those in the sectional view of a plurality of pixels of the twenty-second embodiment depicted in FIG. 60 are denoted by like reference characters to those in FIG. 60, and description of them is omitted suitably.

Comparing the configuration of the pixel 51 according to the twenty-fourth embodiment of FIG. 62 with the configuration of the pixel 51 according to the twenty-second embodiment depicted in FIG. 60, the pixel 51 according to the twenty-fourth embodiment is common in that the transparent conductive film 1103 is formed on the upper face of the fixed charge film 66 but is different in that the through-electrode 1101 and the insulating film 1102 are not formed at a boundary portion with a neighboring pixel 51.

In the twenty-fourth embodiment of FIG. 62, since the through-electrode 1101 is not formed in the pixel array section 20, a negative bias cannot be applied from the through-electrode 1101. Therefore, in the twenty-fourth embodiment, a negative bias is supplied from a voltage application wire 1163 formed in the peripheral circuit section 1041 on the outer side with respect to the pixel array section 20 to the transparent conductive film 1103 through a through electrode 1161, and a negative bias is applied from the transparent conductive film 1103 to the fixed charge film 66.

In particular, in the twenty-fourth embodiment, the voltage application wire 1163 is formed in the multilayer wiring layer 811 of the peripheral circuit section 1041 on the outer side with respect to the pixel array section 20, and a negative bias is supplied to the voltage application wire 1163. Further, in the peripheral circuit section 1041 of the substrate 61, the through electrode 1161 the outer periphery of which is covered with an insulating film 1162 is formed, and the through electrode 1161 is connected to the transparent conductive film 1103 on the light incident face of the substrate 61.

With such a pixel 51 according to the twenty-fourth embodiment as described above, a negative bias supplied from the voltage application wire 1163 of the multilayer wiring layer 811 is applied to the fixed charge film 66 through the through electrode 1161 and the transparent conductive film 1103. Consequently, an electric field in a depthwise direction directed to the signal extraction portion 65 (tap) from the light incident face of the substrate 61 can be strengthened, and improvement of the quantum efficiency (QE) and high speed driving can be implemented. Further, the withstanding property for high speed driving is improved.

It is to be noted that, in the case where the fixed charge film 66 is not formed on the light incident face of the substrate 61 in the pixel 51, a configuration can be adopted that an insulating film formed from an oxide film or the like is formed on the light incident face of the substrate 61 and a negative bias is applied to the insulating film through the through-electrode 1101 and the transparent conductive film 1103. The insulating film is not limited to a single layer film but may be a stacked film.

Twenty-Fifth Embodiment

<Example of Configuration of Pixel>

Figure 63:
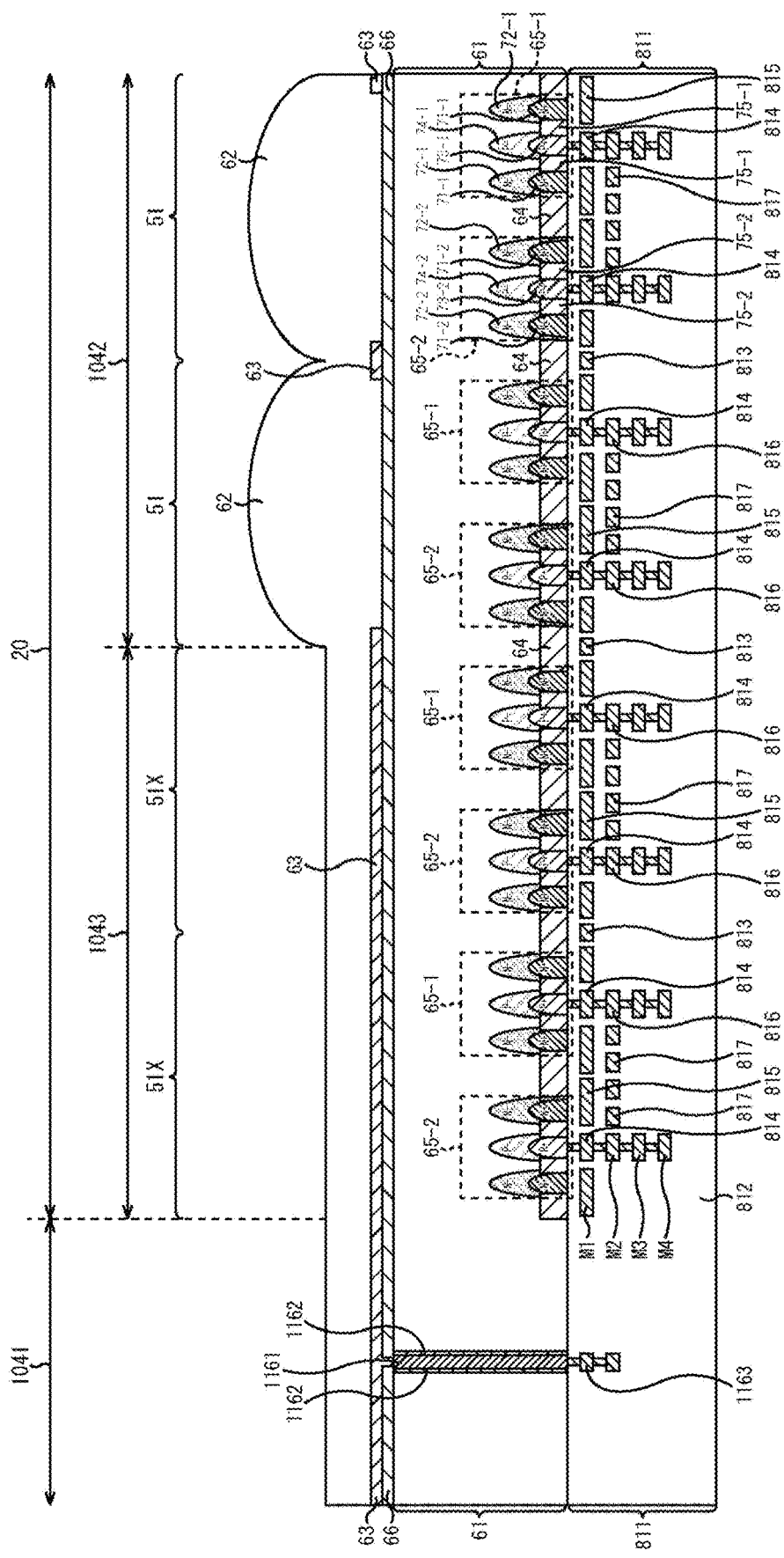
FIG. 63 is a sectional view of a plurality of pixels in a twenty-fifth embodiment.

FIG. 63 is a sectional view of a pixel according to the twenty-fifth embodiment.

FIG. 63 depicts a sectional view of a plurality of pixels taken along line B-B' of FIG. 11.

In FIG. 63, elements corresponding to those in the sectional views of a plurality of pixels of the twenty-second and twenty-third embodiments depicted in FIGS. 61 and 62 are denoted by like reference characters to those in FIGS. 61 and 62, and description of them is omitted suitably.

Comparing the configuration of the pixel 51 according to the twenty-fifth embodiment of FIG. 63 with the configuration of the pixel 51 according to the twenty-third embodiment depicted in FIG. 61, the pixel 51 according to the twenty-fifth embodiment is common in that a negative bias is applied to the fixed charge film 66 through the inter-pixel shading film 63 but is different in that the through-electrode 1101 and the insulating film 1102 are not formed at a boundary portion with a neighboring pixel 51.

In the twenty-fifth embodiment of FIG. 63, since the through-electrode 1101 is not formed in the pixel array section 20, a negative bias cannot be applied from the through-electrode 1101. Therefore, in the twenty-fifth embodiment, a negative bias is supplied from the voltage application wire 1163 formed in the peripheral circuit section 1041 on the outer side with respect to the pixel array section 20 to the inter-pixel shading film 63 through the through electrode 1161, and the negative bias is applied from the inter-pixel shading film 63 to the fixed charge film 66.

In particular, in the twenty-fifth embodiment, the voltage application wire 1163 is formed in the multilayer wiring layer 811 of the peripheral circuit section 1041 on the outer side with respect to the pixel array section 20, and a negative bias is supplied to the voltage application wire 1163. Further, in the peripheral circuit section 1041 of the substrate 61, the through electrode 1161 covered at an outer periphery thereof with the insulating film 1162 is formed, and the through electrode 1161 is connected to the inter-pixel shading film 63 on the light incident face of the substrate 61.

With such a pixel 51 according to the twenty-fifth embodiment as described above, a negative bias supplied from the voltage application wire 1163 of the multilayer wiring layer 811 is applied to the fixed charge film 66 through the through electrode 1161 and the inter-pixel shading film 63. Consequently, an electric field in a depthwise direction directed to the signal extraction portion 65 (tap) from the light incident face of the substrate 61 can be strengthened, and improvement of the quantum efficiency (QE) and high speed driving can be implemented. Further, the withstanding property for high speed driving is improved.

It is to be noted that, in the case where the fixed charge film 66 is not formed on the light incident face of the substrate 61 in the pixel 51, a configuration can be adopted that an insulating film included an oxide film or the like is formed on the light incident face of the substrate 61 and a negative bias is applied to the insulating film through the through-electrode 1101 and the inter-pixel shading film 63. The insulating film is not limited to a single layer film but may be a stacked film.

The twenty-second to twenty-fifth embodiments described above are configured such that a negative bias is applied from the through-electrode 1101 or 1161 to the fixed charge film 66 formed on the light incident face of the substrate 61 on the on-chip lens 62 side. Here, the negative vias is a voltage lower than a voltage (0 V) that is applied to the P+ semiconductor region 73 of the signal extraction portion 65 that is made an inactive tap. Consequently, an electric field in a depthwise direction directed to the signal extraction portion 65 (tap) from the light incident face of the substrate 61 can be strengthened, and improvement of the quantum efficiency (QE) and high speed driving can be implemented. Further, the withstanding property for high speed driving is improved. It is to be noted that the pixel 51 may be configured such that it includes both of the through electrode 1161 of the peripheral circuit section 1041 and the through-electrode 1101 at a pixel boundary portion and a negative bias is applied to the fixed charge film 66 using both of them.

<Example of Configuration of Distance Measuring Module>

Figure 64:
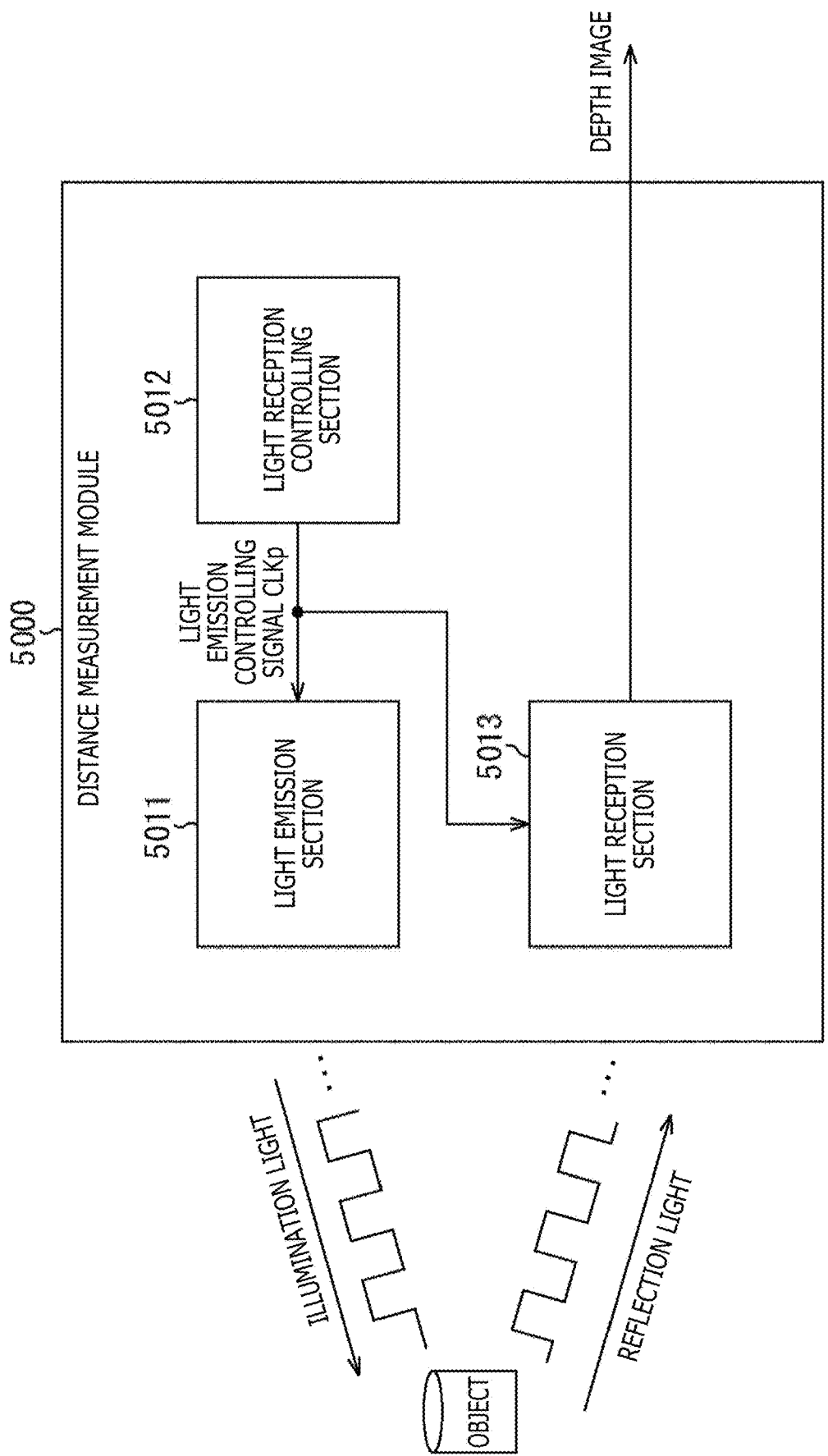
FIG. 64 is a block diagram depicting an example of a configuration of a distance measurement module.

FIG. 64 is a block diagram depicting an example of a configuration of a distance measurement module that outputs distance measurement information using the light reception device 1 of FIG. 1.

The distance measurement module 5000 includes a light emitting section 5011, a light emission controlling section 5012 and a light reception section 5013.

The light emitting section 5011 has a light source that emits light of a predetermined wavelength and emits and illuminates illumination light, whose brightness fluctuates periodically, upon an object. For example, the light emitting section 5011 has a light emitting diode that emits infrared light having a wavelength from 780 nm to 1000 nm and generates illumination light in synchronism with a light emission controlling signal CLKp of a rectangular wave supplied from the light emission controlling section 5012.

It is to be noted that the waveform of the light emission controlling signal CLKp is not limited to a rectangular wave if it is a synchronizing signal. For example, the light emission controlling signal CLKp may be a sine wave.

The light emission controlling section 5012 supplies the light emission controlling signal CLKp to the light emitting section 5011 and the light reception section 5013 to control the illumination timing of illumination light. The frequency of the light emission controlling signal CLKp is, for example, 20 megahertz (MHz). It is to be noted that the frequency of the light emission controlling signal CLKp is not limited to 20 megahertz (MHz) but may be 5 megahertz (MHz) or the like.

The light reception section 5013 receives reflection light reflected from an object, calculates distance information for each pixel in response to a result of the light reception, generates a depth image that represents a distance to the object with a gradation value for each pixel and outputs the depth image.

The light reception device 1 described hereinabove is used for the light reception section 5013, and the light reception device 1 as the light reception section 5013 calculates distance information for each pixel from a signal strength detected by the charge detection section (N+ semiconductor region 71) of each of the signal extraction portions 65-1 and 65-2 of each pixel 51 of the pixel array section 20, for example, on the basis of the light emission controlling signal CLKp.

In this manner, the light reception device 1 of FIG. 1 can be incorporated as the light reception section 5013 of the distance measurement module 5000 that determines and outputs distance information to an imaging target by an indirect ToF method. By adopting the light reception device 1 of any embodiment described above, in particular, a light reception device whose pixel sensitivity is improved by the configuration, as that of the rear face illumination type, as the light reception section 5013 of the distance measurement module 5000, a light measurement characteristic as the distance measurement module 5000 can be improved.

<Example of Application to Moving Body>

The technology according to the present disclosure (present technology) can be applied to various products. For example, the technology according to the present disclosure may be implemented as an apparatus that is incorporated in a moving body of any type such as an automobile, an electric car, a hybrid electric car, a motorcycle, a bicycle, a personal mobility, an airplane, a drone, a ship and a robot.

Figure 65:
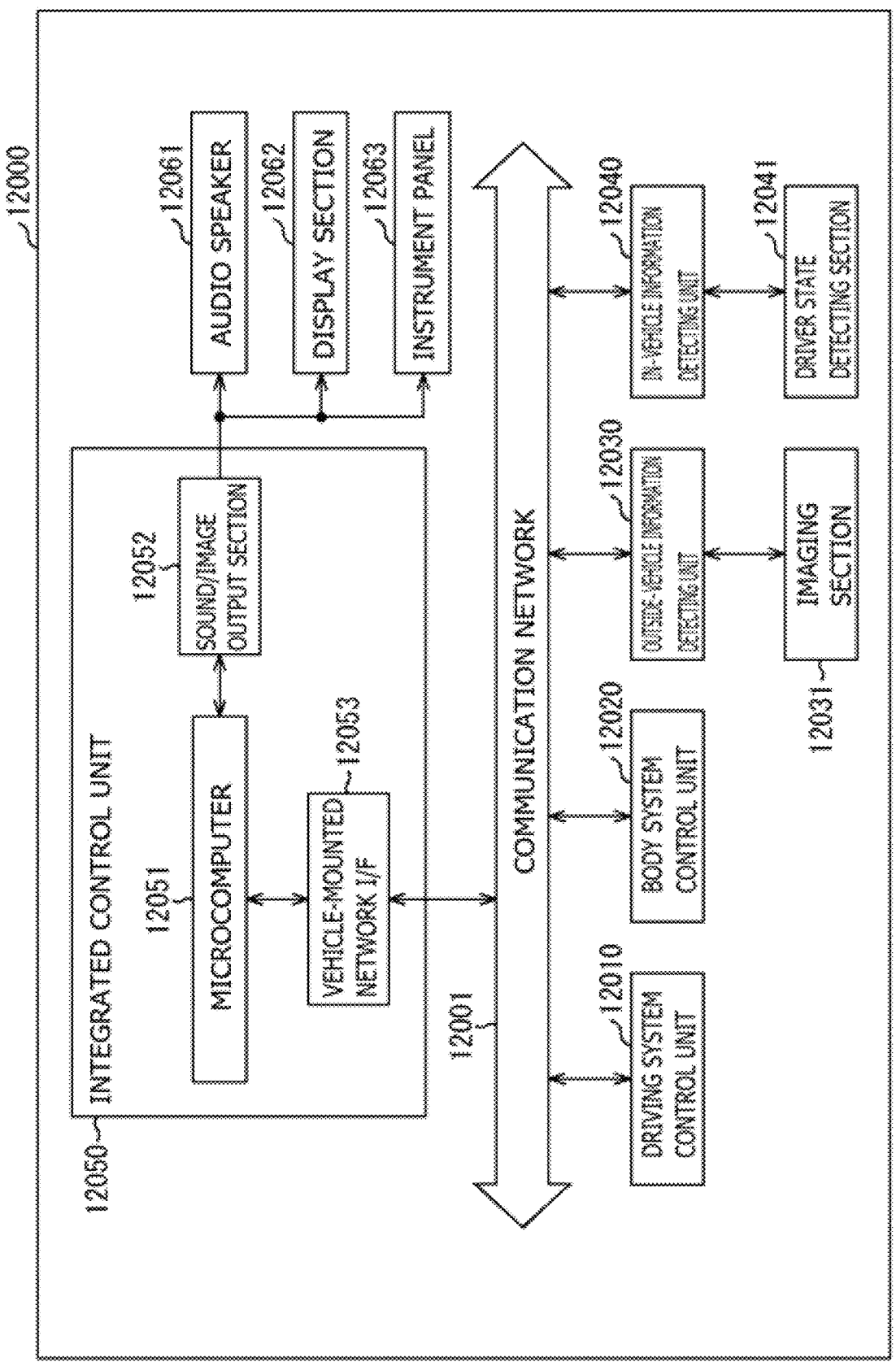
FIG. 65 is a block diagram depicting an example of schematic configuration of a vehicle control system.

FIG. 65 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG.

65, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 65, an audio speaker 12061, a display section 12062, and an instrument panel 12063 are illustrated as the output device. The display section 12062 may, for example, include at least one of an on-board display and a head-up display.

Figure 66:
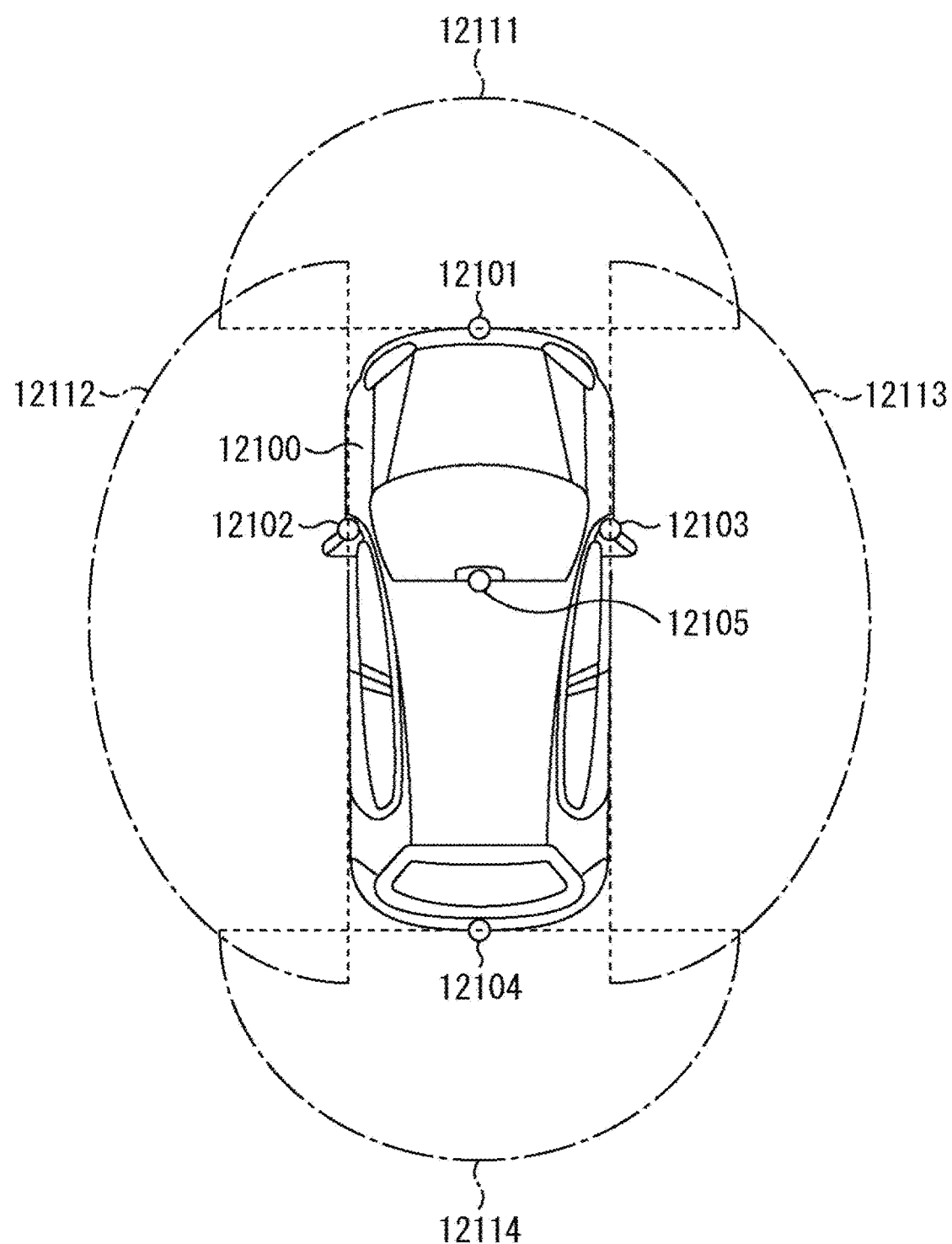
FIG. 66 is a diagram of assistance in explaining an example of installation positions of an outside-vehicle information detecting section and an imaging section.

FIG. 66 is a diagram depicting an example of the installation position of the imaging section 12031.

In FIG. 66, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 66 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of a vehicle controlling system to which the technology according to the present disclosure is applied has been described. The technology according to the present disclosure can be applied to the imaging section 12031 among the components described hereinabove. More specifically, such a characteristic as sensitivity can be improved, for example, by applying the light reception device 1 depicted in FIG. 1 to the imaging section 12031.

The embodiment of the present technology is not restricted to the embodiments described above but can be changed in various manners without departing from the scope of the present technology.

For example, it is naturally possible to suitably combine two or more ones of the embodiments described hereinabove. More specifically, it is possible to appropriately select, in response to which one of characteristics of a pixel such as the sensitivity is to be prioritized, the number or arrangement position of a signal extraction portion in the pixel, the shape of the signal extraction portion or whether or not a shared structure for the signal extraction portion is to be applied, presence or absence of an on-chip lens, presence or absence of an inter-pixel shading portion, presence or absence of a separation region, the thickness of the on-chip lens or a substrate, the type of the substrate or film design, presence or absence of a bias to the light incident face, presence or absence of a reflection member and so forth.

Furthermore, although the embodiments described hereinabove are directed to an example in which an electron is used as a signal carrier, alternatively a hole generated by photoelectric conversion may be used as a signal carrier. In such a case as just described, it is sufficient if the charge detection section for detecting a signal carrier is configured from a P+ semiconductor region and the voltage application section for generating an electric field in the substrate is configured from an N+ semiconductor such that a hole as a signal carrier is detected by the charge detection section provided in the signal extraction portion.

According to the present technology, by configuring a CAPD sensor as a light reception device of the back-illuminated type, the distance measurement characteristic can be improved.

Note that, although the embodiments described hereinabove are directed to a driving method that applies a voltage directly to the P+ semiconductor region 73 formed in the substrate 61 and moves charge generated by photoelectric conversion by an electric field generated by the voltage application, the present technology is not limited to this driving method but can be applied also to other driving methods. For example, a driving method may be applied which distributes charge, which is generated by photoelectric conversion by applying predetermined voltages to the gates of the first and second transfer transistors formed in the substrate 61 using the first and second transfer transistors and the first and second floating diffusion regions, such that the charge is accumulated into the first floating diffusion region through the first transfer transistor and into the second floating diffusion region through the second transfer transistor. In this case, the first and second transfer transistors formed in the substrate 61 function as the first and second voltage application sections to the gates of which predetermined voltages are applied, and the first and second floating diffusion regions formed in the substrate 61 function as the first and second charge detection sections for detecting charge generated by photoelectric conversion.

More specifically, in the driving system in which a voltage is applied directly to the P+ semiconductor region 73 formed in the substrate 61 such that charge generated by photoelectric conversion is moved by an electric field generated by the voltage application, the two P+ semiconductor regions 73 serving as the first and second voltage application portions are control nodes to which predetermined voltages are applied, and the two N+ semiconductor regions 71 serving as the first and second charge detection sections are detection nodes for detecting charge. In the driving method in which predetermined voltages are applied to the gates of the first and second transfer transistors formed in the substrate 61 and charge generated by photoelectric conversion is distributed to and accumulated into the first floating diffusion region and the second floating diffusion region, the gates of the first and second transfer transistors are control nodes to which predetermined voltages are applied, and the first and second floating diffusion regions formed in the substrate 61 are detection nodes for detecting charge.

Furthermore, the advantageous effects described in the present specification are exemplary to the last and are not restrictive, and some other advantageous effects may be available.

Note that the present technology can take also such configurations as described below.

(1)

A light reception device, including:

an on-chip lens;

a wiring layer; and a semiconductor layer arranged between the on-chip lens and the wiring layer, in which the semiconductor layer includes a first voltage application portion to which a first voltage is applied, a second voltage application portion to which a second voltage different from the first voltage is applied, a first charge detection portion arranged around the first voltage application portion, a second charge detection portion arranged around the second voltage application portion, and a through electrode extending through the semiconductor layer, and a third voltage is applied through the through electrode to a predetermined film formed on a face of the semiconductor layer on the on-chip lens side.

(2)

The light reception device according to (1) above, in which the wiring layer includes at least one layer that includes a reflection member, and the reflection member is provided so as to overlap with the first charge detection portion or the second charge detection portion as viewed in plan.

(3)

The light reception device according to (1) or (2) above, in which the wiring layer includes at least one layer that includes a shading member, and the shading member is provided so as to overlap with the first charge detection portion or the second charge detection portion as viewed in plan.

(4)

The light reception device according to any one of (1) to (3) above, in which the predetermined film is a fixed charge film.

(5)

The light reception device according to any one of (1) to (3) above, in which the predetermined film is an insulating film.

(6)

The light reception device according to any one of (1) to (5) above, in which the through electrode is an inter-pixel through electrode formed at a pixel boundary portion; and the light reception device is configured such that the third voltage is applied to the predetermined film using the inter-pixel through electrode.

(7)

The light reception device according to (6) above, further including:

a transparent conductive film provided on the upper side of the predetermined film and connected to the inter-pixel through electrode, in which the light reception device is configured such that the third voltage is applied to the predetermined film through the transparent conductive film.

(8)

The light reception device according to (6) above, further including:

an inter-pixel shading film provided on a face at a pixel boundary portion of the semiconductor layer on the on-chip lens side and connected to the inter-pixel through electrode, and the light reception device is configured such that the third voltage is applied to the predetermined film through the inter-pixel through film.

(9)

The light reception device according to any one of (1) to (8) above, in which the through electrode is formed at an outer peripheral portion on the outer side with respect to a pixel array section; and the light reception device is configured such that the third voltage is applied to the predetermined film from the through electrode at the outer peripheral portion.

(10)

The light reception device according to (9) above, further including:

a transparent conductive film provided on the upper side of the predetermined film, in which the transparent conductive film is connected to the through electrode at the outer peripheral portion, and the light reception device is configured such that the third voltage is applied to the predetermined film through the transparent conductive film.

(11)

The light reception device according to (9) above, further including:

an inter-pixel shading film provided on a face at a pixel boundary portion of the semiconductor layer on the on-chip lens side, in which the through electrode at the outer peripheral portion is connected to the inter-pixel shading film, and the light reception device is configured such that the third voltage is applied to the predetermined film through the inter-pixel shading film.

(12)

The light reception device according to any one of (1) to (11) above, in which, as the through electrode, an inter-pixel through electrode formed at a pixel boundary portion and an outer peripheral portion through electrode formed at an outer peripheral portion on the outer side with respect to the pixel array section, and the light reception device is configured such that the third voltage is applied to the predetermined film using both of the inter-pixel through electrode and the outer peripheral portion through electrode.

(13)

The light reception device according to any one of (1) to (12) above, in which the third voltage is a voltage lower than an application voltage to an inactive tap.

(14)

The light reception device according to any one of (1) to (13) above, in which the third voltage is a negative voltage.

(15)

The light reception device according to any one of (1) to (14) above, in which the through electrode includes polycrystalline silicon or a metal material.

(16)

The light reception device according to any one of (1) to (15) above, in which the first and second voltage application portions are configured from first and second P-type semiconductor regions formed in the semiconductor layer, respectively.

(17)

The light reception device according to any one of (1) to (15) above, in which the first and second voltage application portions are configured from first and second transfer transistors formed in the semiconductor layer, respectively.

(18)

A distance measurement module, including:

a light reception device including an on-chip lens;

a wiring layer; and a semiconductor layer arranged between the on-chip lens and the wiring layer, in which the semiconductor layer includes a first voltage application portion to which a first voltage is applied, a second voltage application portion to which a second voltage different from the first voltage is applied, a first charge detection portion arranged around the first voltage application portion, a second charge detection portion arranged around the second voltage application portion; and a through electrode extending through the semiconductor layer, and a third voltage is applied through the through electrode to a predetermined film formed on a face of the semiconductor layer on the on-chip lens side, a light source configured to illuminate illumination light whose brightness fluctuates periodically, and a light emission controlling section configured to control an illumination timing of the illumination light.

REFERENCE SIGNS LIST

1 Light reception device, 20 Pixel array section, 21 Tap driving section, 22 Vertical driving section, 29 Vertical signal line, 30 Voltage supply line, 51 Pixel, 51X Shaded pixel, 61 Substrate, 62 On-chip lens, 63 Inter-pixel shading film, 64 Oxide film, 65, 65-1, 65-2 Signal extraction portions, 66 Fixed charge film, 71-1, 71-2, 71 N+ semiconductor regions, 73-1, 73-2, 73 P+ semiconductor regions, 441-1, 441-2, 441 Separation regions, 471-1, 471-2, 471 Separation regions, 631 Reflection member, 721 Transfer transistor, 722 FD, 723 Reset transistor, 724 Amplification transistor, 725 Selection transistor, 727 Additional capacitor, 728 Switching transistor, 741 Voltage supply line, 811 Multilayer wiring layer, 812 Interlayer insulating film, 813 Power supply line, 814 Voltage application wire, 815 Reflection member, 816 Voltage application wire, 817 Control line, M1 to M5 metal layer, 1021 P well region, 1022 P-type semiconductor region, 1031 P well region, 1032, 1033 Oxide films, 1051 Effective pixel region, 1052 Ineffective pixel region, 1061 N-type diffusion layer, 1071 Pixel separation portion, 1101 Charge discharging region, 1102 OPB region, 1121 Aperture pixel region, 1122 Shaded pixel region, 1123 N-type region, 1131 N-type diffusion layer, 1201, 1121 Substrates, 1231 Pixel array region, 1232 Area controlling circuit, 1251 MIX joining portion, 1252 DET joining portion, 1253 Voltage supply line, 1261 Peripheral portion, 1311 Electrode portion, 1311A embedded portion, 1311B Protruding portion, 1312 N+ semiconductor region, 1313 Insulating film, 1314 Hole concentration enhancement layer, 1401, 1401A to 1401D Power supply lines, 1411, 1411A to 1411E VSS wires, 1421 gap, 1511 Vertical wire, 1512 Horizontal wire, 1513 Wire, 1521 First wiring layer, 1522 Second wiring layer, 1523 Third wiring layer, 1542, 1543 Peripheral portions, 1801, 1811 Phase difference shading films, 1821 On-chip lens, 1841 Polarizer filter, 1861 Color filter, 1871 IR cut filter, 1872 Color filter, 1881 Photodiode, 1882 Pixel separation portion, 5000 Distance measurement module, 5011 Light emission section, 5012 Light emission controlling section, 5013 Light reception section

What is claimed is:

1. A light reception device, comprising:

an on-chip lens;

a wiring layer; and a semiconductor layer arranged between the on-chip lens and the wiring layer, wherein the semiconductor layer includes:

a first voltage application portion to which a first voltage is applied, a second voltage application portion to which a second voltage different from the first voltage is applied, a first charge detection portion arranged around the first voltage application portion such that the first voltage application portion is sandwiched within the first charge detection portion, a second charge detection portion arranged around the second voltage application portion such that the second voltage application portion is sandwiched within the second charge detection portion, and a through electrode extending through the semiconductor layer, wherein a third voltage is applied through the through electrode to a predetermined film formed on a face of the semiconductor layer on the on-chip lens side.

2. The light reception device according to claim 1,
wherein the wiring layer includes at least one layer that includes a reflection member, and
wherein the reflection member is provided so as to overlap with the first charge detection portion or the second charge detection portion as viewed in a plan view.

3. The light reception device according to claim 1,
wherein the wiring layer includes at least one layer that includes a shading member, and
wherein the shading member is provided so as to overlap with the first charge detection portion or the second charge detection portion as viewed in a plan view.

4. The light reception device according to claim 1, wherein the predetermined film is a fixed charge film.

5. The light reception device according to claim 1, wherein the predetermined film is an insulating film.

6. The light reception device according to claim 1,
wherein the through electrode is an inter-pixel through electrode formed at a pixel boundary portion, and
wherein the light reception device is configured such that the third voltage is applied to the predetermined film using the inter-pixel through electrode.

7. The light reception device according to claim 6, further comprising:
a transparent conductive film provided on an upper side of the predetermined film and connected to the inter-pixel through electrode,
wherein the light reception device is configured such that the third voltage is applied to the predetermined film through the transparent conductive film.

8. The light reception device according to claim 6, further comprising:
an inter-pixel shading film provided on a face at a pixel boundary portion of the semiconductor layer on the on-chip lens side and connected to the inter-pixel through electrode, and
wherein the light reception device is configured such that the third voltage is applied to the predetermined film through the inter-pixel through film.

9. The light reception device according to claim 1,
wherein the through electrode is formed at an outer peripheral portion on the outer side with respect to a pixel array section, and
wherein the light reception device is configured such that the third voltage is applied to the predetermined film from the through electrode at the outer peripheral portion.

10. The light reception device according to claim 9, further comprising:
a transparent conductive film provided on the upper side of the predetermined film,
wherein the transparent conductive film is connected to the through electrode at the outer peripheral portion, and
wherein the light reception device is configured such that the third voltage is applied to the predetermined film through the transparent conductive film.

11. The light reception device according to claim 9, further comprising:
an inter-pixel shading film provided on a face at a pixel boundary portion of the semiconductor layer on the on-chip lens side,
wherein the through electrode at the outer peripheral portion is connected to the inter-pixel shading film, and
wherein the light reception device is configured such that the third voltage is applied to the predetermined film through the inter-pixel shading film.

12. The light reception device according to claim 1, comprising:
as the through electrode, an inter-pixel through electrode formed at a pixel boundary portion and an outer peripheral portion through electrode formed at an outer peripheral portion on the outer side with respect to the pixel array section,
wherein the light reception device is configured such that the third voltage is applied to the predetermined film using both of the inter-pixel through electrode and the outer peripheral portion through electrode.

13. The light reception device according to claim 1, wherein the third voltage is a voltage lower than an application voltage to an inactive tap.

14. The light reception device according to claim 1, wherein the third voltage is a negative voltage.

15. The light reception device according to claim 1, wherein the through electrode includes polysilicon or a metal material.

16. The light reception device according to claim 1, wherein the first and second voltage application portions are configured from first and second P-type semiconductor regions formed in the semiconductor layer, respectively.

17. The light reception device according to claim 1, wherein the first and second voltage application portions are configured from first and second transfer transistors formed in the semiconductor layer, respectively.

18. A distance measurement module, comprising:
a light reception device including:
an on-chip lens,
a wiring layer, and
a semiconductor layer arranged between the on-chip lens and the wiring layer,
wherein the semiconductor layer includes:
a first voltage application portion to which a first voltage is applied,
a second voltage application portion to which a second voltage different from the first voltage is applied,
a first charge detection portion arranged around the first voltage application portion such that the first voltage application portion is sandwiched within the first charge detection portion,
a second charge detection portion arranged around the second voltage application portion such that the second voltage application portion is sandwiched within the second charge detection portion, and
a through electrode extending through the semiconductor layer,
wherein a third voltage is applied through the through electrode to a predetermined film formed on a face of the semiconductor layer on the on-chip lens side,
a light source configured to illuminate illumination light whose brightness fluctuates periodically, and
a light emission controlling section configured to control an illumination timing of the illumination light.

19. The distance measurement module according to claim 18,
wherein the wiring layer includes at least one layer that includes a reflection member, and wherein the reflection member is provided so as to overlap with the first charge detection portion or the second charge detection portion as viewed in a plan view.

20. The distance measurement module according to claim 18,
wherein the wiring layer includes at least one layer that includes a shading member, and
wherein the shading member is provided so as to overlap with the first charge detection portion or the second charge detection portion as viewed in a plan view.

* * * * *